United States Patent
Jia et al.

(10) Patent No.: US 11,330,090 B2
(45) Date of Patent: May 10, 2022

(54) BRACKET, INPUT/OUTPUT ASSEMBLY AND TERMINAL

(71) Applicant: Guangdong Oppo Mobile Telecommunications Corp., Ltd., Guangdong (CN)

(72) Inventors: Yuhu Jia, Guangdong (CN); Bin Zhao, Guangdong (CN); Haiping Xu, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 345 days.

(21) Appl. No.: 16/493,286

(22) PCT Filed: Apr. 3, 2019

(86) PCT No.: PCT/CN2019/081325
§ 371 (c)(1),
(2) Date: Sep. 11, 2019

(87) PCT Pub. No.: WO2019/196726
PCT Pub. Date: Oct. 17, 2019

(65) Prior Publication Data
US 2021/0329108 A1    Oct. 21, 2021

(30) Foreign Application Priority Data

Apr. 10, 2018 (CN) .......................... 201810315979.X
Apr. 10, 2018 (CN) .......................... 201810316733.4
(Continued)

(51) Int. Cl.
*H04M 1/02* (2006.01)
*G06F 1/16* (2006.01)
*H05K 1/18* (2006.01)

(52) U.S. Cl.
CPC ........ *H04M 1/0264* (2013.01); *G06F 1/1626* (2013.01); *G06F 1/1658* (2013.01);
(Continued)

(58) Field of Classification Search
CPC .... G06F 1/1626; G06F 1/1658; G06F 1/1686; H04M 1/0264; H04M 1/0277; H05K 1/189; H05K 2201/10568
(Continued)

(56) References Cited

U.S. PATENT DOCUMENTS

2010/0328907 A1* 12/2010 Long ................... H04M 1/0264
361/752
2013/0033581 A1* 2/2013 Woo ....................... G06F 1/1626
348/47
(Continued)

FOREIGN PATENT DOCUMENTS

CN    102129152 A    7/2011
CN    102222338 A    10/2011
(Continued)

OTHER PUBLICATIONS

Extended European Search Report for European application No. 19773330.6 dated Feb. 26, 2020.
(Continued)

*Primary Examiner* — Tan H Trinh
(74) *Attorney, Agent, or Firm* — Young Basile Hanlon & MacFarlane, P.C.

(57) ABSTRACT

A terminal, an input/output assembly and a bracket are provided. The bracket includes a body. The body includes a first face and a second face facing away from each other. The second face is provided with a plurality of accommodating chambers. The first face is provided with a plurality of through holes corresponding to the plurality of accommodating chambers. The plurality of accommodating chambers
(Continued)

is configured to accommodate an input/output module fixedly mounted therein and to expose the input/output module from the second face. The plurality of through holes is configured to expose the input/output module from the first face.

17 Claims, 31 Drawing Sheets

(30) Foreign Application Priority Data

| Apr. 10, 2018 | (CN) | 201810317084.X |
|---|---|---|
| Apr. 10, 2018 | (CN) | 201810317232.8 |
| Apr. 10, 2018 | (CN) | 201810317244.0 |
| Apr. 10, 2018 | (CN) | 201820506786.8 |
| Apr. 10, 2018 | (CN) | 201820506787.2 |
| Apr. 10, 2018 | (CN) | 201820506788.7 |
| Apr. 10, 2018 | (CN) | 201820506901.1 |
| Apr. 10, 2018 | (CN) | 201820507037.7 |
| Apr. 10, 2018 | (CN) | 201820507039.6 |

(52) U.S. Cl.
CPC ........ *G06F 1/1686* (2013.01); *H04M 1/0277* (2013.01); *H05K 1/189* (2013.01); *H05K 2201/10568* (2013.01)

(58) Field of Classification Search
USPC .......................... 455/575.1; 361/752; 348/47
See application file for complete search history.

(56) References Cited

U.S. PATENT DOCUMENTS

| 2016/0234356 A1* | 8/2016 | Thomas | H04B 1/3838 |
|---|---|---|---|
| 2017/0085764 A1 | 3/2017 | Kim et al. | |
| 2017/0364172 A1* | 12/2017 | Kim | G06F 1/16 |
| 2018/0249059 A1* | 8/2018 | Jeong | H04N 5/2352 |

FOREIGN PATENT DOCUMENTS

| CN | 105229697 A | 1/2016 |
|---|---|---|
| CN | 106506734 A | 3/2017 |
| CN | 206332721 U | 7/2017 |
| CN | 107105573 A | 8/2017 |
| CN | 107343122 A | 11/2017 |
| CN | 206669265 U | 11/2017 |
| CN | 206674128 U | 11/2017 |
| CN | 107451542 A | 12/2017 |
| CN | 107483692 A | 12/2017 |
| CN | 206698329 U | 12/2017 |
| CN | 108390969 A | 8/2018 |
| CN | 108390970 A | 8/2018 |
| CN | 108390971 A | 8/2018 |
| CN | 108401045 A | 8/2018 |
| CN | 108616619 A | 10/2018 |
| CN | 208386604 U | 1/2019 |
| CN | 208386605 U | 1/2019 |
| CN | 208386606 U | 1/2019 |
| CN | 208386607 U | 1/2019 |
| CN | 208386608 U | 1/2019 |
| CN | 208386609 U | 1/2019 |
| KR | 20160105227 A | 9/2016 |
| KR | 20170096866 A | 8/2017 |

OTHER PUBLICATIONS

OA dated Apr. 28, 2019 for CN application 201810315979.X with English translation.
OA dated May 20, 2019 for CN application 201810317084.X with English translation.
OA dated Apr. 23, 2019 for CN application 201810317232.8 with English translation.
OA dated Apr. 22, 2019 for CN application 201810316733.4 with English translation.
ISR for PCT application PCT/CN2019/081325 with English translation.
OA dated Jul. 17, 2019 for CN application 201810315979.X with English translation.
Indian Examination Report for IN Application 201917041110 dated Oct. 22, 2021. (6 pages).

* cited by examiner

BRACKET, INPUT/OUTPUT ASSEMBLY AND TERMINAL

CROSS-REFERENCE TO RELATED APPLICATION(S)

This application is a 371 application of International Patent Application No. PCT/CN2019/081325, filed on Apr. 3, 2019, which claims priority to Chinese Patent Applications No. 201810317084.X, 201820506787.2, 201810316733.4, 201820507039.6, 201810317232.8, 201820506901.1, 201810317244.0, 201820507037.7, 201820506788.7, 201820506786.8 and 201810315979.X, all filed on Apr. 10, 2018, the entire disclosures of all of which are incorporated herein by reference in their entireties.

TECHNICAL FIELD

The present disclosure relates to a field of consumption electronic technique, and more particularly, to a bracket, an input/output assembly and a terminal.

BACKGROUND

A mobile phone may be provided with a plurality of functional modules, which usually need to cooperate with one another to operate normally. However, when the mobile phone is hit in use, relative positions of the plurality of functional modules may be changed easily, and thus the plurality of functional modules fail to operate cooperatively.

SUMMARY

Embodiments of the present disclosure provide a bracket, an input/output assembly and a terminal.

The bracket according to embodiments of the present disclosure includes a body. The body includes a first face and a second face facing away from each other. The second face is provided with a plurality of accommodating chambers and the first face is provided with a plurality of through holes corresponding to the plurality of accommodating chambers. The plurality of accommodating chambers is configured to accommodate an input/output module and expose the input/output module from the second face. The plurality of through holes is configured to expose the input/output module from the first face.

The input/output assembly according to embodiments of the present disclosure includes an input/output module and a bracket. The bracket includes a first face and a second face facing away from the first face. The first face is provided with a plurality of through holes. The second face is provided with a plurality of accommodating chambers corresponding to the plurality of through holes. The input/output module is mounted in the plurality of accommodating chambers, exposed from the second face through the plurality of accommodating chambers, and further exposed from the first face through the plurality of through holes.

The terminal according to embodiments of the present disclosure includes a housing, a mainboard and an input/output assembly. The mainboard is fixed in the housing and has a mounting opening. The input/output assembly is mounted in the mounting opening. The input/output assembly includes an input/output module electrically connected to the mainboard, and a bracket extending through the mounting opening. The bracket includes a first face and a second face facing away from the first face. The input/output module is fixedly mounted in the accommodating chamber. The accommodating chamber is configured to expose the input/output module from the second face, and the plurality of through holes is configured to expose the input/output module from the first face.

Additional aspects and advantages of embodiments of the present disclosure will be given in the following description, some of which will become apparent from the following description or be learned from practices of the embodiments of the present disclosure.

BRIEF DESCRIPTION OF DRAWINGS

The above and/or additional aspects and advantages of the present disclosure will become apparent and easy to understand from descriptions of the embodiments with reference to the drawings.

DETAILED DESCRIPTION

Figure 1:
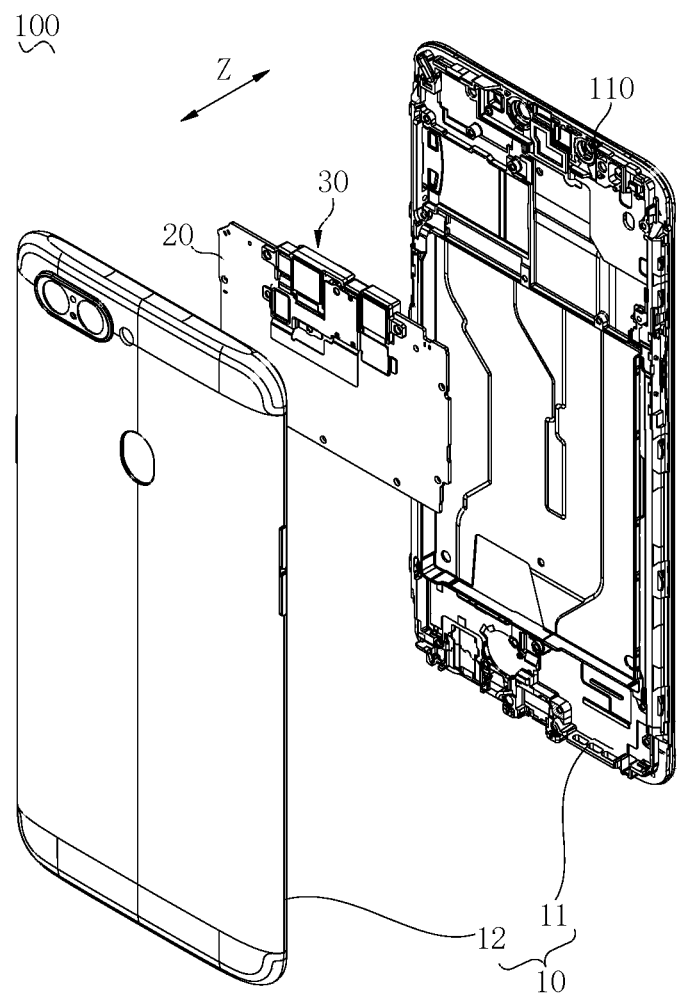
FIG. 1 is an exploded perspective view of a terminal according to some embodiments of the present disclosure.

Embodiments of the present disclosure will be further described with reference to the drawings. The same or similar elements and the elements having the same or similar functions are denoted by like reference numerals throughout the descriptions.

In addition, embodiments described herein with reference to the drawings are explanatory, serve to explain the present disclosure, and are not construed to limit embodiments of the present disclosure.

In the descriptions of the present disclosure, unless specified or limited otherwise, the first feature "on" or "under" the second feature may be that the first and second features are in direct contact, or that the first and second features are in indirect contact through an intermediate medium. Moreover, the first feature "up", "above" and "on" the second feature may be that the first feature is directly above or obliquely above the second feature, or merely be that the first feature has a level higher than the second feature. The first feature "down", "below" and "under" the second feature may be that the first feature is directly below or obliquely below the second feature, or merely be that the first feature has a level less than the second feature.

Embodiments of the present disclosure provide a bracket, an input/output assembly and a terminal.

The bracket according embodiments of the present disclosure includes a body, and the body includes a first face and a second face facing away from each other. The second face is provided with a plurality of accommodating chambers, the first face is provided with a plurality of through holes corresponding to the plurality of accommodating chambers, the plurality of accommodating chambers is configured to accommodate an input/output module and expose the input/output module from the second face, and the plurality of through holes is configured to expose the input/output module from the first face.

In some embodiments, the bracket is integrally formed, and the input/output module at least includes an imaging module.

In some embodiments, the bracket is integrally formed, the input/output module at least includes an imaging module, the body includes a side wall, the side wall connects the first face to the second face, the bracket further includes a fixing protrusion extending outwards from the side wall, and the fixing protrusion is configured to fix the bracket.

In some embodiments, the imaging module includes a visible-light imaging module and/or an infrared imaging module.

In some embodiments, the input/output module further includes a laser projection module and/or a receiver.

In some embodiments, an opening size of the through hole is smaller than that of the corresponding accommodating chamber to provide a position limiting ring, and the accommodating chamber is defined by the position limiting ring and an inner wall extending around the position limiting ring.

In some embodiments, the first face is provided with a bracket positioning hole, and the bracket positioning hole is configured to restrict a mounting position of the bracket.

In some embodiments, the plurality of accommodating chambers includes a first chamber, a second chamber, a third chamber and a fourth chamber, the body includes a side wall, the side wall connects the first face to the second face, the side wall includes a top side wall and a bottom side wall facing away from each other, the first chamber, the second chamber, the third chamber and the fourth chamber are arranged in sequence, centers of the first chamber, the second chamber and the fourth chamber are arranged on a same straight line, and a center of the third chamber is arranged between the straight line and the bottom side wall.

In some embodiments, the bracket further includes a bracket positioning column protruding from the first face, a position of the bracket positioning column corresponds to that of the third chamber, and the bracket positioning column is arranged between the straight line and the top side wall.

In some embodiments, the bracket further includes a bracket positioning block protruding from the second face, and a position of the bracket positioning block corresponds to that of the third chamber.

In some embodiments, the bracket is integrally formed, and an inner wall of at least one of the plurality of accommodating chambers is provided with internal threads.

In some embodiments, the input/output module includes a visible-light imaging module and/or an infrared imaging module.

In some embodiments, the input/output module further includes a laser projection module and/or a receiver.

In some embodiments, an opening size of the through hole is smaller than that of the corresponding accommodating chamber to provide a position limiting ring, and the accommodating chamber is defined by the position limiting ring and an inner wall extending around the position limiting ring.

In some embodiments, the body includes a side wall, the side wall connects the first face to the second face, the bracket further includes a fixing protrusion extending outwards from the side wall, and the fixing protrusion is configured to fix the bracket.

In some embodiments, the plurality of accommodating chambers includes a first chamber, a second chamber, a third chamber and a fourth chamber, the body includes a side wall, the side wall connects the first face to the second face, the side wall includes a top side wall and a bottom side wall facing away from each other, the first chamber, the second chamber, the third chamber and the fourth chamber are arranged in sequence, centers of the first chamber, the second chamber and the fourth chamber are arranged on a same straight line, and a center of the third chamber is arranged between the straight line and the bottom side wall.

In some embodiments, the bracket further includes a bracket positioning block protruding from the second face, and a position of the bracket positioning block corresponds to that of the third chamber.

In some embodiments, the input/output module includes an infrared imaging module, a visible-light imaging module, a laser projection module and a receiver, the plurality of accommodating chambers includes a first chamber, a second chamber and a third chamber arranged in sequence, the first chamber is configured for an arrangement of the infrared imaging module, the second chamber is configured for an arrangement of the visible-light imaging module, the third chamber is configured for an arrangement of the laser projection module, the accommodating chamber further includes a fourth chamber, and the fourth chamber is configured for an arrangement of the receiver.

In some embodiments, the fourth chamber is arranged between the first chamber and the second chamber; or the fourth chamber is arranged between the second chamber and the third chamber.

In some embodiments, the through hole includes a first through hole, a second through hole, a third through hole and a fourth through hole, the first through hole is communicated with the first chamber, the second through hole is communicated with the second chamber, the third through hole is communicated with the third chamber, and the fourth through hole is communicated with the fourth chamber.

In some embodiments, centers of the first through hole, the second through hole and the third through hole are arranged on a same straight line.

In some embodiments, the body includes a side wall, the side wall connects the first face to the second face, the side wall includes a top side wall and a bottom side wall facing away from each other, and the fourth through hole is arranged between the straight line and the bottom side wall.

In some embodiments, the body includes a side wall, the side wall connects the first face to the second face, the side wall includes a top side wall and a bottom side wall facing away from each other, the top side wall has a notch, the first face has a recess, and the recess is communicated with the notch.

In some embodiments, a position of the recess corresponds to that of the fourth chamber.

In some embodiments, the bracket further includes a bracket positioning column protruding from a bottom of the recess.

In some embodiments, the bracket is integrally formed, the input/output module includes a laser projection module, a receiver and an infrared imaging module, the plurality of accommodating chambers includes a first chamber, a second chamber and a third chamber arranged in sequence, the first chamber is configured for an arrangement of the infrared imaging module, the second chamber is configured for an arrangement of the receiver, and the third chamber is configured for an arrangement of the laser projection module.

In some embodiments, the through hole includes a first through hole, a second through hole and a third through hole, the first through hole is communicated with the first chamber, the second through hole is communicated with the second chamber and corresponds to a sound outlet of the receiver, and the third through hole is communicated with the third chamber.

In some embodiments, the input/output module further includes a visible-light imaging module, and the accommodating chamber further includes a fourth chamber, the fourth chamber is configured to accommodate the visible-light imaging module. The first chamber, the second chamber, the third chamber and the fourth chamber are arranged in sequence. Or the fourth chamber, the first chamber, the second chamber and the third chamber are arranged in sequence.

In some embodiments, the second chamber is spaced apart from the first chamber; or the second chamber is communicated with the first chamber.

In some embodiments, the through hole further includes a fourth through hole, and the fourth through hole corresponds to the fourth chamber.

In some embodiments, centers of the first through hole, the third through hole and the fourth through hole are arranged on a same straight line.

In some embodiments, the body includes a side wall, the side wall connects the first face to the second face, the side wall includes a top side wall and a bottom side wall facing away from each other, centers of the first through hole, the third through hole and the fourth through hole are arranged on a same straight line, and the second through hole is arranged between the straight line and the bottom side wall.

In some embodiments, the body includes a side wall, the side wall connects the first face to the second face, the side wall includes a top side wall and a bottom side wall facing away from each other, the top side wall has a notch, the first face has a recess, and the recess is communicated with the notch.

In some embodiments, the bracket further includes a bracket positioning column protruding from a bottom of the recess.

In some embodiments, the bracket is integrally formed, the input/output module includes a laser projection module, a visible-light imaging module and an infrared imaging module, the plurality of accommodating chambers includes a first chamber, a second chamber and a third chamber arranged in sequence, the first chamber is configured for an arrangement of the infrared imaging module, the second chamber is configured for an arrangement of the visible-light imaging module, and the third chamber is configured for an arrangement of the laser projection module.

In some embodiments, the through hole includes a first through hole, a second through hole and a third through hole, and the first through hole, the second through hole and the third through hole are communicated with the first chamber, the second chamber and the third chamber, respectively.

In some embodiments, centers of the first through hole, the second through hole and the third through hole are arranged on a same straight line.

In some embodiments, the second face is provided with a first spacing chamber, and the first spacing chamber spaces the first chamber apart from the second chamber.

In some embodiments, the second face is provided with a second spacing chamber, and the second spacing chamber spaces the second chamber apart from the third chamber.

In some embodiments, the bracket is provided with a first positioning groove in a side wall surrounding the first through hole, and the first positioning groove is configured to restrict a mounting position of the infrared imaging module.

In some embodiments, the bracket is provided with a second positioning groove in a side wall surrounding the second through hole, and the second positioning groove is configured to restrict a mounting position of the visible-light imaging module.

In some embodiments, the body includes a side wall, the side wall connects the first face to the second face and includes a top side wall and a bottom side wall facing away from each other, and the top side wall has a notch in a position corresponding to the third chamber.

In some embodiments, the first face is provided with a bracket positioning hole, and the bracket positioning hole is configured to restrict a mounting position of the bracket.

The input/output assembly according to embodiments of the present disclosure includes an input/output module, and a bracket according to some above embodiments of the present disclosure. The input/output module is mounted in the accommodating chamber of the bracket.

In some embodiments, the input/output module includes a receiver, the input/output assembly further includes a flexible circuit board mounted to the bracket, the receiver includes an elastic connection piece protruding along a direction from the first face to the second face, and the elastic connection piece abuts against the flexible circuit board to electrically connect the receiver to the flexible circuit board.

In some embodiments, the flexible circuit board includes a first segment pressed to the first face and a second segment pressed to the second face, the elastic connection piece abuts against the second segment, the input/output assembly further includes an infrared fill light, a proximity sensor and a light sensor, and the infrared fill light, the proximity sensor and the light sensor are connected to the first segment.

In some embodiments, the flexible circuit board is provided with a flexible-board positioning hole, and the flexible-board positioning hole is configured to restrict a mounting position of the flexible circuit board to the bracket.

The input/output assembly according to embodiments of the present disclosure includes a bracket according to some above embodiments of the present disclosure, and a plurality of input/output modules corresponding to the accommodating chambers. An outer wall of at least one of the plurality of input/output modules is provided with external threads, and the external threads are engaged with the internal threads to mount the input/output module in a corresponding accommodating chamber.

The terminal according to embodiments of the present disclosure includes a housing, and an input/output assembly according to some above embodiments of the present disclosure. The input/output assembly is mounted in the housing.

In some embodiments, the terminal further includes a mainboard fixed in the housing, the input/output module is electrically connected to the mainboard, the mainboard has a mounting opening, and the bracket extends through the mounting opening.

In some embodiments, the housing includes a front housing and a rear housing, and the front housing and the rear housing abut against the first face and the second face, respectively, so as to clamp the bracket.

The input/output assembly according to embodiments of the present disclosure includes an input/output module, and bracket according to some above embodiments of the present disclosure. The input/output module includes an infrared imaging module, a visible-light imaging module, a laser projector and a receiver. The infrared imaging module is mounted in the first chamber, the visible-light imaging module is mounted in the second chamber, the laser projection module is mounted in the third chamber, and the receiver is mounted in the fourth chamber.

In some embodiments, the input/output assembly further includes a flexible circuit board mounted to the bracket, the receiver includes an elastic connection piece protruding along a direction from the first face to the second face, and the elastic connection piece abuts against the flexible circuit board to electrically connect the receiver to the flexible circuit board.

In some embodiments, the flexible circuit board includes a first segment pressed to the first face and a second segment pressed to the second face, the elastic connection piece abuts against the second segment, the input/output assembly further includes an infrared fill light, a proximity sensor and a light sensor, and the infrared fill light, the proximity sensor and the light sensor are connected to the first segment.

In some embodiments, the flexible circuit board is provided with a flexible-board positioning hole, and the flexible-board positioning hole is configured to restrict a mounting position of the flexible circuit board to the bracket.

The terminal according to embodiments of the present disclosure includes a housing, and an input/output assembly according to some above embodiments of the present disclosure. The input/output assembly is mounted in the housing.

In some embodiments, the terminal further includes a mainboard fixed in the housing, the input/output module is electrically connected to the mainboard, the mainboard has a mounting opening, and the bracket extends through the mounting opening and is fixedly connected to the mainboard.

In some embodiments, the housing includes a front housing and a rear housing, and the front housing abuts against the first face and the rear housing abuts against the second face to clamp the bracket.

In some embodiments, the terminal further includes a cover plate. The cover plate and the input/output module are arranged on two sides facing away from each other of the front housing, respectively, the front housing is provided with a first via hole, a second via hole, a third via hole and a fourth via hole, the first via hole corresponds to the infrared imaging module, the second via hole corresponds to the visible-light imaging module, the third via hole corresponds to the laser projection module, the fourth via hole corresponds to the receiver, the cover plate is provided with an infrared transmission ink at positions corresponding to the first via hole and the third via hole, respectively, and the cover plate is provided with a sound output hole corresponding to the fourth via hole.

The input/output assembly according to embodiments of the present disclosure includes an input/output module, and a bracket according to some above embodiments of the present disclosure. The input/output module includes a laser projection module, a receiver and an infrared imaging module. The infrared imaging module is mounted in the first chamber, the receiver is mounted in the second chamber, and the laser projection module is mounted in the third chamber.

In some embodiments, the input/output assembly further includes a flexible circuit board mounted to the bracket. The receiver includes an elastic connection piece protruding along a direction from the first face to the second face, and the elastic connection piece abuts against the flexible circuit board to electrically connect the receiver to the flexible circuit board.

In some embodiments, the flexible circuit board includes a first segment pressed to the first face and a second segment pressed to the second face, the elastic connection piece abuts against the second segment, the input/output assembly further includes an infrared fill light, a proximity sensor and a light sensor, and the infrared fill light, the proximity sensor and the light sensor are connected to the first segment.

In some embodiments, the flexible circuit board is provided with a flexible-board positioning hole, and the flexible-board positioning hole is configured to restrict a mounting position of the flexible circuit board to the bracket.

The terminal according to embodiments of the present disclosure includes a housing, and an input/output assembly according to some above embodiments of the present disclosure. The input/output assembly is mounted in the housing.

In some embodiments, the terminal further includes a mainboard fixed in the housing. The input/output module is electrically connected to the mainboard, the mainboard has a mounting opening, and the bracket extends through the mounting opening and is fixedly connected to the mainboard.

In some embodiments, the housing includes a front housing and a rear housing, and the front housing and the rear housing abut against the first face and the second face, respectively, so as to clamp the bracket.

In some embodiments, the terminal further includes a cover plate. The cover plate and the input/output module are arranged on two sides facing away from each other of the front housing, respectively, the front housing is provided with a first via hole, a second via hole and a third via hole, the first via hole corresponds to the infrared imaging module, the second via hole corresponds to the receiver, the third via hole corresponds to the laser projection module, the cover plate is provided with an infrared transmission ink at positions corresponding to the first via hole and the third via hole, respectively, and the cover plate is provided with a sound output hole corresponding to the second via hole.

The input/output assembly according to embodiments of the present disclosure includes an input/output module, and a bracket according to some above embodiments of the present disclosure. The input/output module includes a laser projection module, a visible-light imaging module and an infrared imaging module. The infrared imaging module is mounted in the first chamber, the visible-light imaging module is mounted in the second chamber, and the laser projection module is mounted in the third chamber.

The terminal according to embodiments of the present disclosure includes a housing, and an input/output assembly. The input/output assembly is mounted in the housing. The terminal further includes a mainboard fixed in the housing. The input/output module is electrically connected to the mainboard, the mainboard has a mounting opening, and the bracket extends through the mounting opening and is fixedly connected to the mainboard.

In some embodiments, the housing includes a front housing and a rear housing, and the front housing and the rear housing abut against the first face and the second face, respectively, so as to clamp the bracket.

In some embodiments, the input/output assembly further includes a receiver, an infrared fill light, a proximity sensor and a light sensor, the terminal further includes a flexible circuit board mounted to the housing, and the receiver, the infrared fill light, the proximity sensor and the light sensor are mounted to the flexible circuit board.

In some embodiments, the flexible circuit board includes a first segment, a second segment and a connecting segment, the connecting segment connects the first segment to the second segment, the first segment is arranged parallel to the second segment, the infrared fill light, the proximity sensor and the light sensor are connected to the first segment, and the receiver is connected to the second segment.

In some embodiments, the receiver, the infrared fill light, the proximity sensor and the light sensor are arranged on a side of the first chamber facing away from the second chamber; or the receiver, the infrared fill light, the proximity sensor and the light sensor are arranged on a side of the third chamber facing away from the second chamber.

In some embodiments, the terminal further includes a cover plate. The cover plate and the input/output module are arranged on two sides facing away from each other of the front housing, respectively, the front housing is provided with a first via hole, a second via hole and a third via hole, the first via hole corresponds to the infrared imaging module, the second via hole corresponds to the visible-light imaging module, the third via hole corresponds to the laser projection module, and the cover plate is provided with an infrared transmission ink at positions corresponding to the first via hole and the third via hole, respectively.

The input/output assembly according to embodiments of the present disclosure includes a bracket according to some above embodiments of the present disclosure, an input/output module, and a flexible circuit board. The input/output module is mounted in the accommodating chamber and exposed from the through hole. The flexible circuit board is mounted to the bracket, the flexible circuit board includes a first segment and a second segment, the first segment is joined to the first face and electrically connected to the input/output module, the second segment includes a joining part and a connecting part connected to the joining part, the joining part is joined to the second face, and the connecting part is spaced apart from the second face and configured to be electrically connected to an external device.

In some embodiments, the accommodating chamber includes a fourth chamber, the input/output module includes a receiver, the receiver is accommodated in the fourth chamber, the receiver includes an elastic connection piece protruding along a direction from the second face to the first face, and the elastic connection piece abuts against the first segment to electrically connect the receiver to the flexible circuit board.

In some embodiments, the through hole includes a sound output through hole, the sound output through hole is communicated with the fourth chamber, the sound output through hole corresponds to the sound outlet of the receiver, and the joining part has a sound outgoing hole corresponding to the sound output through hole.

In some embodiments, the plurality of accommodating chambers further includes a first chamber, a second chamber and a third chamber, the input/output module further includes an infrared imaging module, a visible-light imaging module and a laser projection module, the infrared imaging module is accommodated in the first chamber, the visible-light imaging module is accommodated in the second chamber, and the laser projection module is accommodated in the third chamber.

In some embodiments, the plurality of through holes further includes a first through hole, a second through hole and a third through hole, the first through hole is communicated with the first chamber, the second through hole is communicated with the second chamber, and the third through hole is communicated with the third chamber.

In some embodiments, centers of the first through hole, the second through hole and the third through hole are arranged on a same straight line.

In some embodiments, the body includes a side wall, the side wall connects the first face to the second face, the side wall includes a top side wall and a bottom side wall facing away from each other, and the fourth chamber is arranged between the straight line and the bottom side wall.

In some embodiments, the input/output assembly further includes an infrared fill light, a proximity sensor and a light sensor, and the infrared fill light, the proximity sensor and the light sensor are connected to the second segment.

In some embodiments, the bracket has a bracket positioning column protruding from the first face and/or the second face, the flexible circuit board is provided with a flexible-board positioning hole, and the bracket positioning column extends into the flexible-board positioning hole.

In some embodiments, the body includes a side wall, the side wall connects the first face to the second face, the bracket further includes a fixing protrusion protruding outwards from the side wall, and the fixing protrusion is configured to fix the bracket.

The terminal according to embodiments of the present disclosure includes a mainboard provided with a mounting opening; and an input/output assembly according to some above embodiments of the present disclosure. The bracket is mounted in the mounting opening, and the connecting part is electrically connected to the mainboard.

In some embodiments, the terminal further includes a housing, the housing includes a front housing and a rear housing, and the front housing and the rear housing abut against the second face and the first face, respectively, so as to clamp the bracket.

Figure 2:
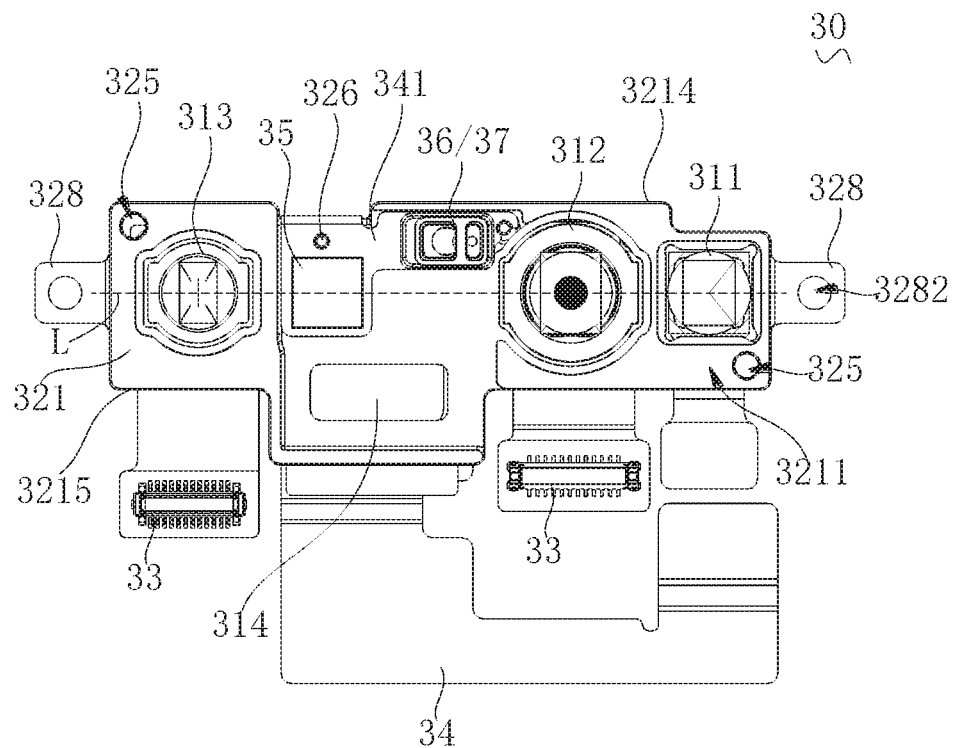
FIG. 2 and FIG. 3 are plan assembling views of an input/output assembly according to some embodiments of the present disclosure.
Figure 4:
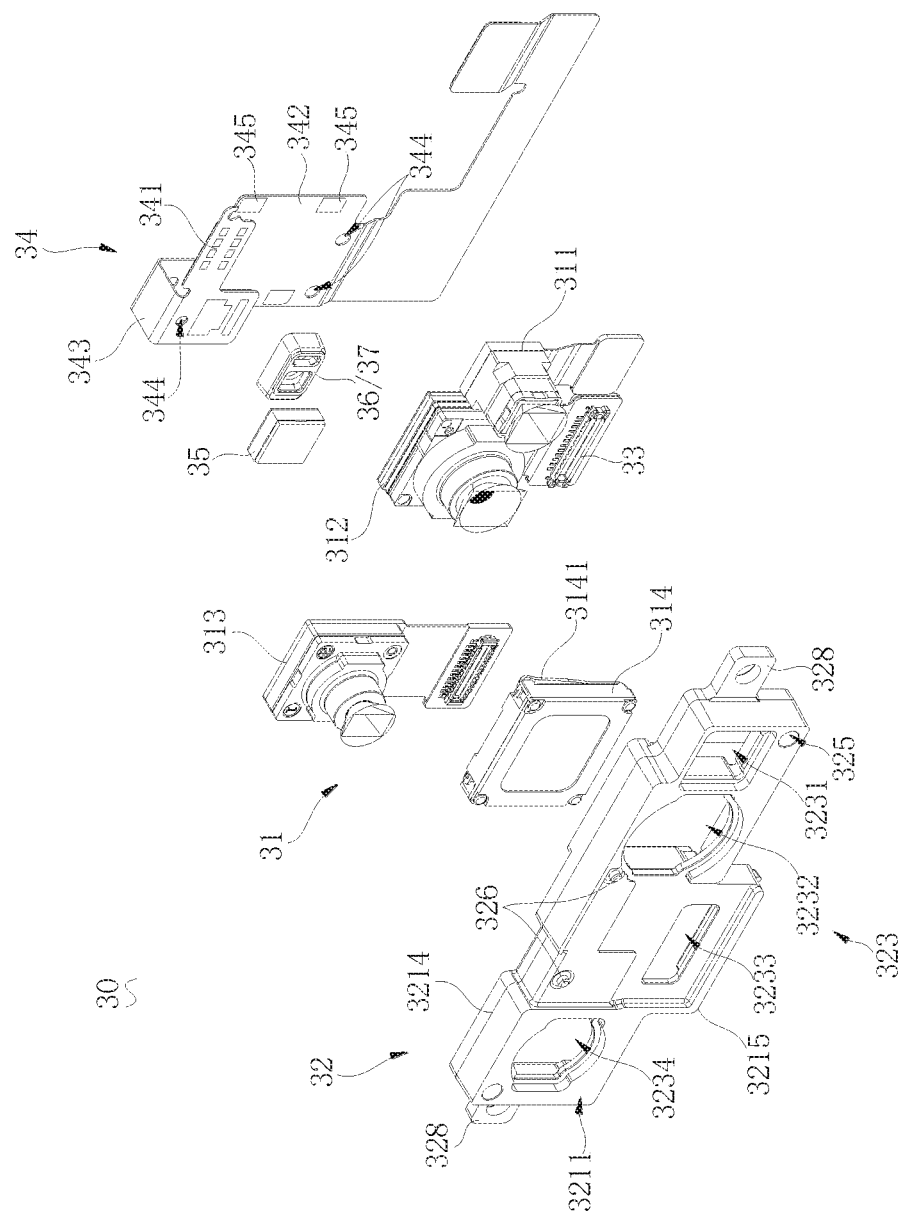
FIG. 4 and FIG. 5 are exploded perspective views of an input/output assembly according to some embodiments of the present disclosure.
Figure 5:
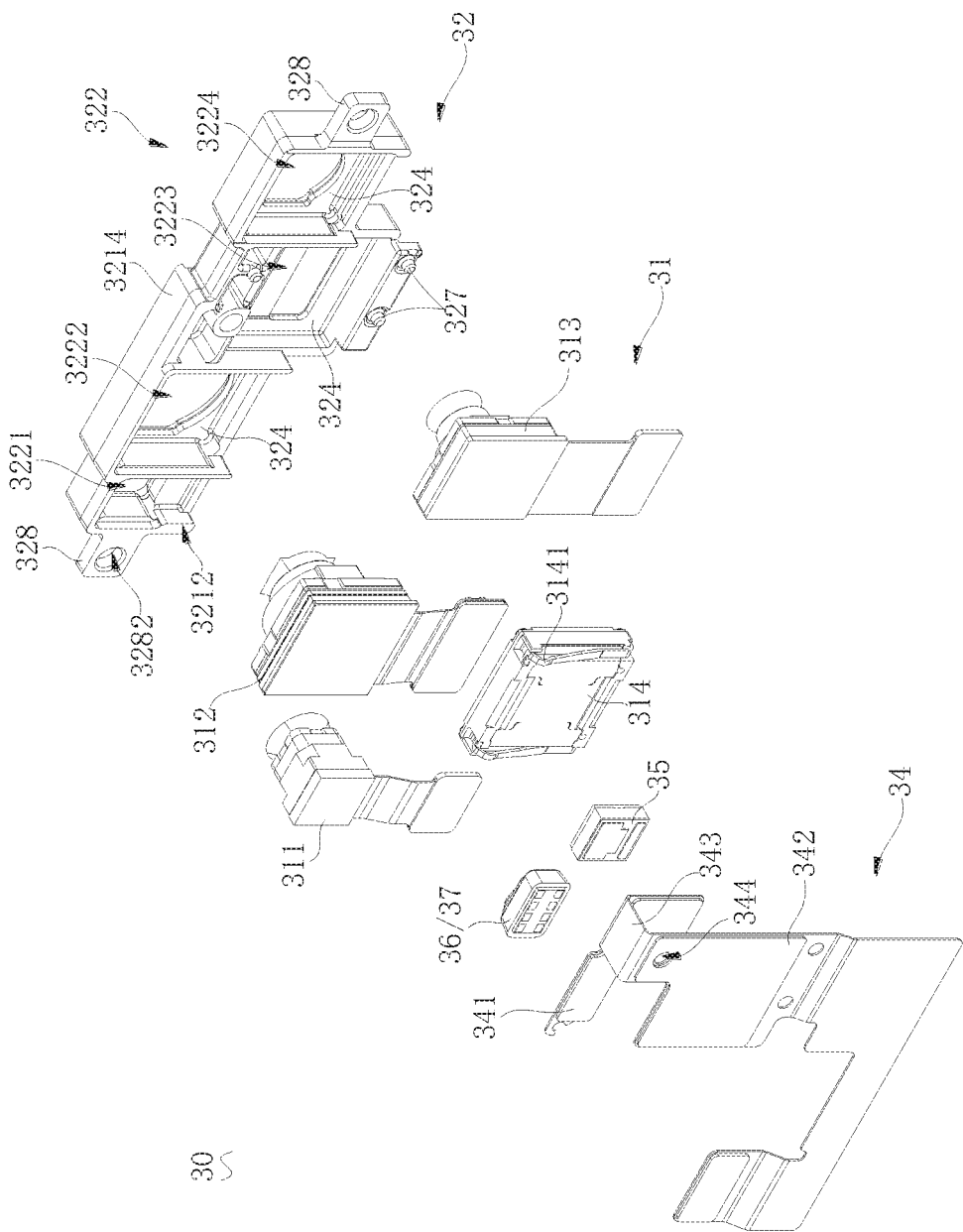

As illustrated in FIG. 2, FIG. 4 and FIG. 5, a bracket 32 in the present disclosure includes a body 321. The body 321 includes a first face 3211 and a second face 3212 facing away from each other. The second face 3212 is provided with a plurality of accommodating chambers 322 and the first face 3211 is provided with a plurality of through holes 323 corresponding to the plurality of accommodating chambers 322. An input/output module 31 is fixedly mounted in the plurality of accommodating chambers 322 and exposed from the second face 3212. The plurality of through holes 323 is configured to expose the input/output module 31 from the first face 3211.

As illustrated in FIG. 1, a terminal 100 in embodiments of the present disclosure includes a housing 10, a mainboard 20 and an input/output assembly 30. The terminal 100 may be a mobile phone, a tablet computer, a laptop, a game console, a head mounted display, an entrance system, an automatic teller machine and so on. In embodiments of the present disclosure, a mobile phone is taken as an example to illustrate the terminal 100. It may be understood that the terminal 100 may have other specific forms and is not limited herein.

As illustrated in FIG. 1, the housing 10 may serve as a carrier to which the mainboard 20 and the input/output assembly 30 are mounted. The housing 10 may provide protections against dust, water and drops for the mainboard 20 and the input/output assembly 30. Components like a display screen and a battery may also be mounted to the housing 10. The housing 10 includes a front housing 11 and a rear housing 12. The front housing 11 and the rear housing 12 are joined together, and the mainboard 20 and the input/output assembly 30 are accommodated between the front housing 11 and the rear housing 12. The front housing 11 and the rear housing 12 may be made of stainless steel, aluminum alloy and plastics.

Figure 3:
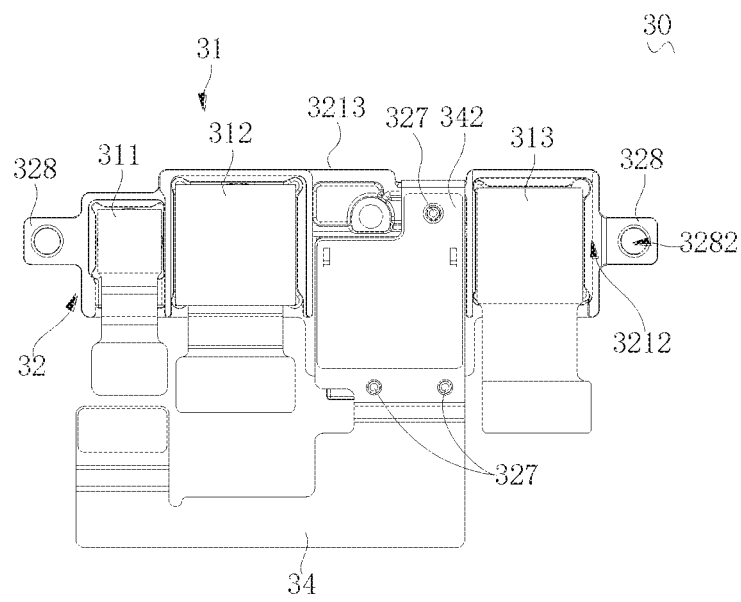

As illustrated in FIG. 1, the mainboard 20 is fixed in the housing 10. Specifically, the mainboard 20 may be fixed to the front housing 11 or the rear housing 12 through screwing or engagement. The mainboard 20 may be coupled to each input/output module 31 of the input/output assembly 30 (as illustrated in FIG. 3). The mainboard 20 may further be coupled to a processing chip, a control chip or the like of the terminal 100. A circuit arranged on the mainboard 20 may be used for transmitting electrical signals. The mainboard 20 has a mounting opening for the input/output assembly 30 to pass through, so that space occupied by the mainboard 20 and the input/output assembly 30 when mounted in the housing 10 is reduced.

As illustrated in FIG. 1 to FIG. 10, in the first embodiment of the present disclosure, the input/output assembly 30 is mounted in the housing 10. The input/output assembly 30 includes the input/output module 31 and the bracket 32. The input/output module 31 is mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

As illustrated in FIG. 4 and FIG. 5, in this embodiment of the present disclosure, the input/output module 31 includes a laser projection module 311, an infrared imaging module 313, a visible-light imaging module 312 and a receiver 314. The laser projection module 311 may project a laser pattern to a target object outside the terminal 100. The laser may be infrared light.

The infrared imaging module 313 may be used to receive an infrared light signal outside to produce an infrared image. In some embodiments, the infrared imaging module 313 may receive the laser pattern reflected by the target object, and both the laser projection module 311 and the infrared imaging module 313 are used to obtain depth information of the target object. The visible-light imaging module 312 may receive a visible light signal outside to produce a color image. The visible-light imaging module 312, the infrared imaging module 313 and the laser projection module 311 may be used to obtain a depth image of a target user. The receiver 314 emits a sound wave to the outside under the action of a driving signal to realize functions such as making a call. The input/output module 31 may be provided with a connector 33. The connector 33 may be inserted into a specific connector receptacle of the mainboard 20 so as to couple the input/output module 31 to the mainboard 20. The input/output module 31 may be separated from the mainboard 20 by pulling the connector 33 out of the connector receptacle.

As illustrated in FIG. 1 to FIG. 3, the bracket 32 is integrally formed. The bracket 32 includes a body 321. The bracket 32 is fixed in the housing 10 and configured for an arrangement of the input/output module 31. The body 321 includes a first face 3211, a second face 3212 and a side wall 3213. The first face 3211 faces away from the second face 3212. The side wall 3213 is connected to the first face 3211 and the second face 3212. The side wall 3213 includes a top side wall 3214 and a bottom side wall 3215 facing away from each other. When the input/output assembly 30 is mounted in the housing 10, the front housing 11 may abut against the first face 3211 and the rear housing 12 may abut against the second face 3212 to clamp the bracket 32, such that the bracket 32 and the input/output module 31 can be prevented from moving in a thickness direction of the terminal 100 (direction Z as illustrated in FIG. 1). Furthermore, the bracket 32 is mounted in a position corresponding to the mounting opening of the mainboard 20. The side wall 3213 of the bracket 32 may abut against an inner wall surrounding the mounting opening, so that the bracket 32 is caught in the mounting opening. In this case, simply securing the position of the mainboard 20 may prevent the bracket 32 and the input/output module 31 from moving in a width direction (in a direction perpendicular to direction Z as illustrated in FIG. 1) of the terminal 100.

As illustrated in FIG. 4 and FIG. 5, the second face 3212 is provided with a plurality of accommodating chambers 322, the first face 3211 is provided with a plurality of through holes 323 corresponding to the plurality of accommodating chambers 322, and the accommodating chamber 322 is arranged between the top side wall 3214 and the bottom side wall 3215. The input/output module 31 is fixedly mounted in the plurality of accommodating chambers 322. When the input/output module 31 is mounted to the bracket 32, it is exposed from the second face 3212, and it is also exposed from the first face 3211 via the through hole 323. In this embodiment of the present disclosure, "be exposed from" indicates that the input/output module 31 can be observed from the first face 3211 or the second face 3212. For example, the input/output module 31 may pass through the through hole 323 of the first face 3211 and thus be exposed out of the first face 3211. Or, the input/output module 31 may not pass through the through hole 323, but it is visible from the through hole 323.

The bracket 32 includes a position limiting ring 324. Specifically, an opening size of the through hole 323 is smaller than that of the corresponding accommodating chamber 322 to provide the position limiting ring 324, and the accommodating chamber 322 is defined by the position limiting ring 324 and an inner wall extending around the position limiting ring 324. During the installation of the input/output module 31, the input/output module 31 may be mounted into the accommodating chamber 322 along a direction from the second face 3212 to the first face 3211 until the input/output module 31 abuts against the position limiting ring 324, which indicates that the input/output module 31 is mounted in place, and thus a glue may be dispensed into the accommodating chamber 322. Specifically, the glue may be dispensed into a gap between the input/output module 31 and an inner wall of the accommodating chamber 322. When the glue is cured, the input/output module 31 is fixedly mounted in the accommodating chamber 322.

It may be understood that a specific shape of the accommodating chamber 322 corresponds to that of the corresponding input/output module 31. The volume of the accommodating chamber 322 may be slightly larger than the input/output module 31, which facilitates dispensing the glue into the accommodating chamber 322. Or, the volume of the accommodating chamber 322 may be slightly smaller than that of the input/output module 31, so that the input/output module 31 may be mounted in the accommodating chamber 322 through an interference fit. The specific number of the accommodating chamber 322 may be equal to that of the input/output module 31.

Further, as illustrated in FIG. 4 and FIG. 5, according to this embodiment of the present disclosure, the accommodating chamber 322 includes a first chamber 3221, a second chamber 3222, a third chamber 3223 and a fourth chamber 3224. The first chamber 3221, the second chamber 3222, the third chamber 3223 and the fourth chamber 3224 are arranged in sequence. The through hole 323 includes a first hole 3231, a second hole 3232, a third hole 3233 and a fourth hole 3234. The first hole 3231 corresponds to the first chamber 3221, the second hole 3232 corresponds to the second chamber 3222, the third hole 3233 corresponds to the third chamber 3223, and the fourth hole 3234 corresponds to the fourth chamber 3224. The plurality of accommodating chambers 322 may be spaced apart from each other. Or, any two, three or four accommodating chambers 322 may be communicated with each other. The laser projection module 311 may be mounted in the first chamber 3221, the visible-light imaging module 312 may be mounted in the second chamber 3222, the receiver 314 may be mounted in the third chamber 3223, and the infrared imaging module 313 may be mounted in the fourth chamber 3224. Centers of the first chamber 3221, the second chamber 3222 and the fourth chamber 3224 are arranged on the same straight line L (as illustrated in FIG. 2). When the laser projection module 311, the visible-light imaging module 312 and the infrared imaging module 313 are mounted in place, optical axes of the laser projection module 311, the visible-light imaging module 312 and the infrared imaging module 313 are arranged on the same plane, which facilitates cooperative operations among the laser projection module 311, the visible-light imaging module 312 and the infrared imaging module 313. Specifically, the laser projection module 311 extends through the first hole 3231, the visible-light imaging module 312 extends through the second hole 3232, and the infrared imaging module 313 extends through the fourth hole 3234. More specifically, a light emitting surface of the laser projection module 311, a light incident surface of the visible-light imaging module 312 and a light incident surface of the infrared imaging module 313 may be arranged on the same plane. A center of the third chamber 3223 is arranged between the straight line L and the bottom side wall 3215. The receiver 314 is mounted in the fourth chamber 3224 and may not pass through the fourth hole 3234. The sound wave emitted by the receiver 314 may pass through the fourth hole 3234 and enter the outside.

To sum up, in the terminal 100 according to this embodiment of the present disclosure, as the bracket 32 is integrally formed, when a plurality of input/output modules 31 are mounted in the accommodating chambers 322, relative positions of the input/output modules 31 will not be changed easily, and thus the plurality of input/output modules 31 will cooperatively operate better. Specifically, since the positions of the plurality of accommodating chambers 322 will not be changed, as long as the input/output modules 31 are fixed in the accommodating chambers 322, the relative positions among the input/output modules 31 will not be changed. Moreover, as the plurality of input/output modules 31 may be mounted to one bracket 32 simultaneously, it is unnecessary to provide a plurality of brackets for the plurality of input/output modules 31, thereby simplifying the structure of the terminal 100 and saving mounting space in the terminal 100.

As illustrated in FIG. 2, FIG. 4, FIG. 12 and FIG. 14, in some embodiments, the first face 3211 is provided with a bracket positioning hole 325, and the bracket positioning hole 325 is configured to restrict the mounting position of the bracket 32. Specifically, one or more bracket positioning holes 325 may be provided. In the embodiment of the present disclosure, two bracket positioning holes 325 are provided, and the two bracket positioning holes 325 are provided in diagonal portions of the body 321. Correspondingly, as illustrated in FIG. 1, a front-housing positioning column 110 may protrude from the front housing 11. When the first face 3211 abuts against the front housing 11, the front-housing positioning column 110 extends into and is fitted with the bracket positioning holes 325. Therefore, the mounting position of the bracket 32 may be restricted quickly through the fit between the front-housing positioning column 110 and the bracket positioning hole 325, and the bracket 32 may be further prevented from shaking in the housing 10.

As illustrated in FIG. 4, FIG. 5, FIG. 14 and FIG. 15, in some embodiments, the input/output assembly 30 further includes a flexible circuit board 34. The receiver 314 includes an elastic connection piece 3141. The elastic connection piece 3141 protrudes along a direction from the first face 3211 to the second face 3212. The elastic connection piece 3141 abuts against the flexible circuit board 34 to electrically connect the receiver 314 to the flexible circuit board 34. Specifically, an end of the flexible circuit board 34 may be connected to the mainboard 20. The flexible circuit board 34 may has a contact 345. The elastic connection piece 3141 abuts against the contact 345 to electrically connect the receiver 314 to the flexible circuit board 34. In an example, a plurality of sets of contacts 345 are provided to the flexible circuit board 34. The elastic connection piece 3141 may electrically connect the receiver 314 to the mainboard 20 when it abuts against any set of contacts 345. In this case, as long as a sound outlet of the receiver 314 corresponds to the third hole 3233, the receiver 314 can be mounted in the third chamber 3223 at a plurality of angles, and the elastic connection piece 3141 can abut against the contacts 345.

As illustrated in FIG. 2 to FIG. 4 and FIG. 12 to FIG. 14, in some embodiments, the flexible circuit board 34 includes a first segment 341 and a second segment 342. The first segment 341 is pressed to the first face 3211 and the second segment 342 is pressed to the second face 3212. The elastic connection piece 3141 abuts against the second segment 342. The input/output assembly 30 further includes an infrared fill light 35, a proximity sensor 36 and a light sensor 37. The infrared fill light 35, the proximity sensor 36 and the light sensor 37 are coupled to the first segment 341.

In the embodiment of the present disclosure, the flexible circuit board 34 further includes a connecting segment 343 connecting the first segment 341 to the second segment 342. The connecting segment 343 may be pressed to the top side wall 3214. The infrared fill light 35 is used to emit an infrared light to the outside, the proximity sensor 36 is used to detect a distance between the target object and the terminal 100, and the light sensor 37 is used to detect the intensity of ambient light. The proximity sensor 36 and the light sensor 37 may be integrated into one module. In this case, the infrared fill light 35, the proximity sensor 36, the light sensor 37 and the receiver 314 may be coupled via one flexible circuit board 34, and thus the overall structure of the input/output assembly 30 is relatively simple and compact.

As illustrated in FIG. 2, FIG. 4, FIG. 12 and FIG. 14, in some embodiments, the bracket 32 further includes a bracket positioning column 326 protruding from the first face 3211, and the position of the bracket positioning column 326 corresponds to that of the third chamber 3223. The bracket positioning column 326 is arranged between the straight line L and the top side wall 3214. The bracket positioning column 326 may be used to position components, for example, the flexible circuit board 34, the infrared fill light 35, the proximity sensor 36, or the light sensor 37, mounted to the bracket 32, so as to prevent the components from shaking. More specifically, the bracket positioning column 326 passes through and fixes the first segment 341 of the flexible circuit board 34. Therefore, the infrared fill light 35, the proximity sensor 36 and the light sensor 37 disposed to the first segment 341 are also fixed. The center of the third chamber 3223 and the bracket positioning column 326 may be arranged on both sides of the straight line L, respectively.

As illustrated in FIG. 3, FIG. 5, FIG. 13, FIG. 15 and FIG. 16, in some embodiments, the bracket 32 further includes a bracket positioning block 327. The bracket positioning block 327 protrudes from the second face 3212, and the position of the bracket positioning block 327 corresponds to that of the third chamber 3223. The bracket positioning block 327 may be used to position the flexible circuit board 34 mounted to the bracket 32 to prevent the flexible circuit board 34 from shaking. Specifically, the bracket positioning block 327 passes through and fixes the second section 342 of the flexible circuit board 34.

As illustrated in FIG. 4, FIG. 5, FIG. 14 and FIG. 15, in some embodiments, the flexible circuit board 34 is provided with a flexible-board positioning hole 344, and the flexible-board positioning hole 344 is configured to restrict the mounting position of the flexible circuit board 34 to the bracket 32. Specifically, the flexible-board positioning hole 344 may be provided to any one or more of the first segment 341, the second segment 342 or the connecting segment 343. In the embodiments illustrated in FIGS. 4 and 5, the flexible-board positioning hole 344 is provided to both the first segment 341 and the second segment 342. The positions of the flexible-board positioning holes 344 may correspond to that of the bracket positioning column 326 and that of the bracket positioning block 327, respectively. During the installation of the flexible circuit board 34, the first segment 341 is pressed to the first face 3211 and the bracket positioning column 326 is fitted in the flexible-board positioning hole 344, and the second segment 342 is pressed to the second face 3212 and the bracket positioning block 327 is fitted in the flexible-board positioning hole 344, so that the flexible circuit board 34 is less likely to shake.

As illustrated in FIG. 2 to FIG. 5 and FIG. 18, in some embodiments, the bracket 32 further includes a fixing protrusion 328 protruding outwards from the side wall 3213. The fixing protrusion 328 is configured to fix the bracket 32. One or more fixing protrusions 328 may be provided. When a plurality of fixing protrusions 328 are provided, the plurality of fixing protrusions 328 may protrude from two facing away from each other of the side walls 3213. The fixing protrusion 328 is configured to fix the bracket 32. Specifically, the fixing protrusion 328 may be directly fixed to the housing 10 by a fastener, or the bracket 32 and the mainboard 20 may be fixed to the housing 10 together by the fastener. In the embodiments illustrated in FIG. 1 and FIG. 2, the fixing protrusion 328 is provided with a fixing hole 3282, and the mainboard 20 and the front housing 11 each are provided with a mounting hole at a position corresponding to the fixing hole 3282, so that the bracket 32 and the mainboard 20 may be fixed to the front housing 11 by the fastener (for example, a screw) passing through the fixing hole 3282 and the mounting hole. Fixing the bracket 32 through the fixing protrusion 328 may further improve the stability of the bracket 32 mounted in the housing 10.

Figure 6:
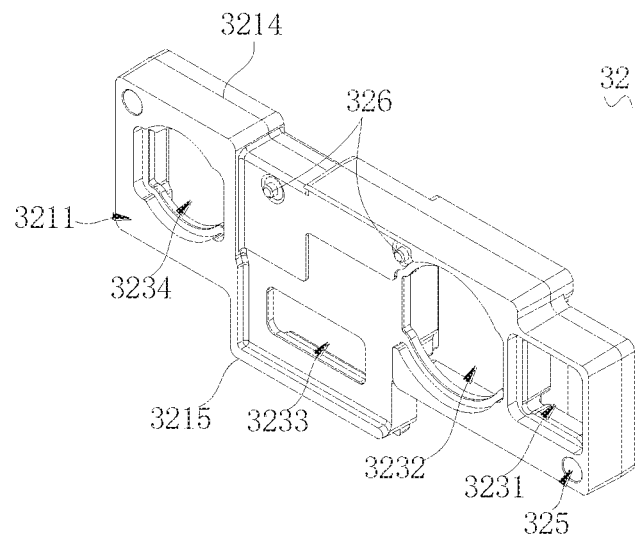
FIG. 6 is a schematic view of a bracket of an input/output assembly according to some embodiments of the present disclosure.

As illustrated in FIG. 6, certainly, it can be understood that the fixing protrusion 328 is not necessary. The position of the bracket 32 may still have satisfying stability under the clamping action of the front housing 11 and the rear housing 12 exerted on the bracket 32.

Figure 7:
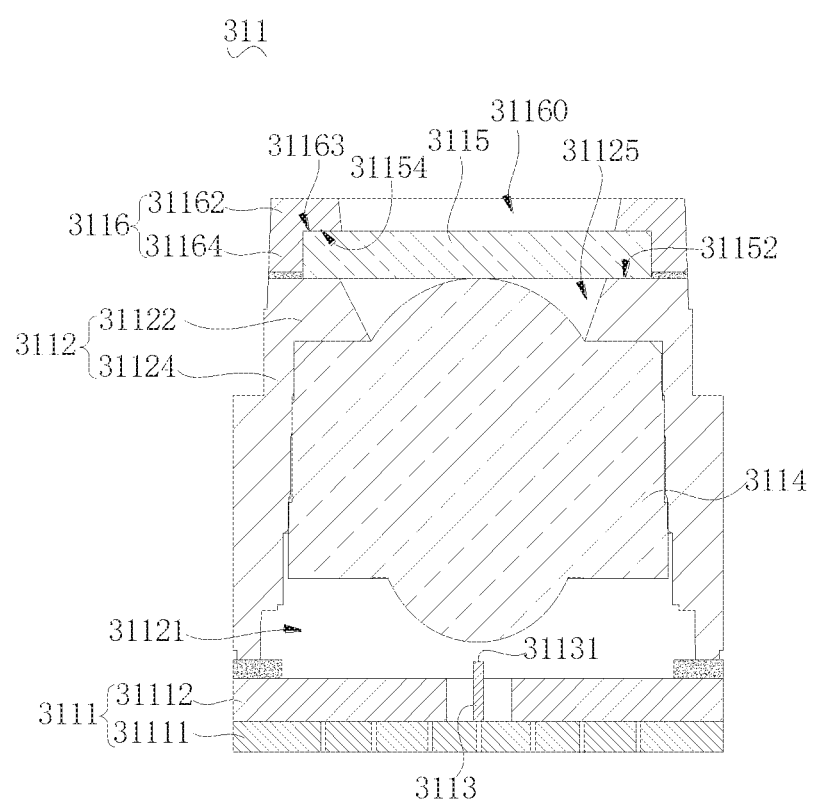
FIG. 7 to FIG. 10 are partial schematic views of a laser projection module of an input/output assembly according to some embodiments of the present disclosure.

As illustrated in FIG. 7, in some embodiments, the laser projection module 311 includes a substrate assembly 3111, a lens barrel 3112, a light source 3113, a collimation element 3114, a diffractive optical element (DOE) 3115 and a protection cover 3116.

The substrate assembly 3111 includes a substrate 31111 and a circuit board 31112. The circuit board 31112 is arranged on the substrate 31111 and configured to connect the light source 3113 to the mainboard 20 of the terminal 100. The circuit board 31112 may be a rigid board, a flexible board or a rigid-flex board.

The lens barrel 3112 is fixedly connected to the substrate assembly 3111 and is provided with a receiving chamber 31121. The lens barrel 3112 includes a top wall 31122 and an annular circumferential wall 31124 extending from the top wall 31122. The circumferential wall 31124 is arranged on the substrate assembly 3111. The top wall 31122 is provided with a light transmission hole 31125 communicated with the receiving chamber 31121. The circumferential wall 31124 may be connected to the circuit board 31112 through an adhesive.

The protection cover 3116 is arranged on the top wall 31122. The protection cover 3116 includes a baffle 31162 provided with a light emission through hole 31160 and an annular side wall 31164 extending from the baffle 31162.

The light source 3113 and the collimation element 3114 are arranged in the receiving chamber 31121. The diffractive optical element 3115 is mounted to the lens barrel 3112. The collimation element 3114 and the diffractive optical element 3115 are arranged in a light emitting path of the light source 3113 in sequence. The collimation element 3114 collimates a laser emitted by the light source 3113. The laser passes through the collimation element 3114 and the diffractive optical element 3115 in sequence to form a laser pattern.

Figure 8:
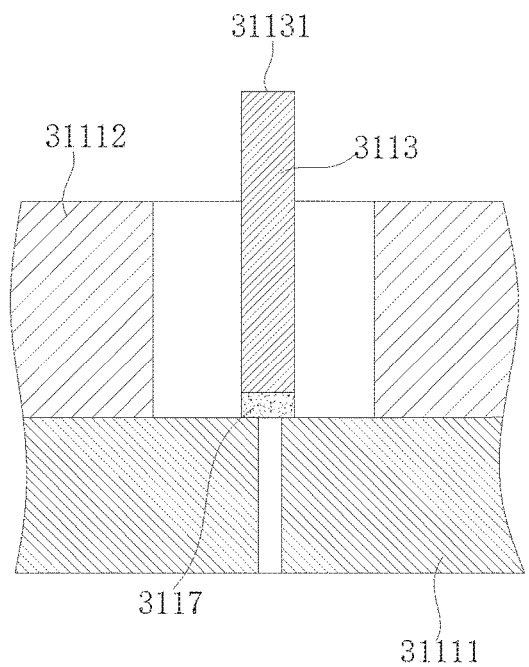
Figure 9:
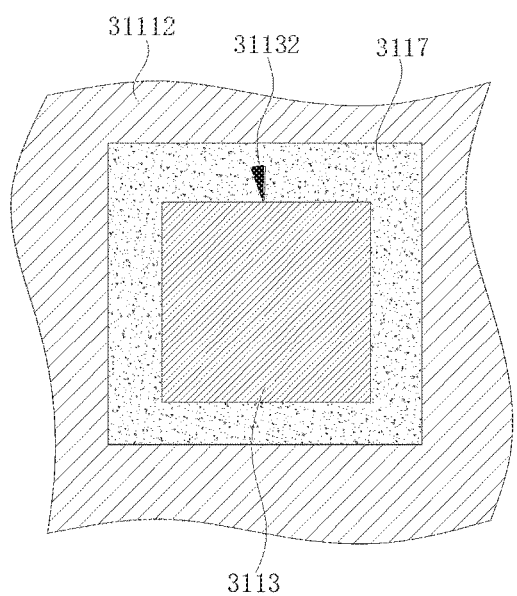

The light source 3113 may be a vertical cavity surface emitting laser (VCSEL) or an edge-emitting laser (EEL). In embodiments illustrated in FIG. 7, the light source 3113 is an edge-emitting laser, and specifically, the light source 3113 may be a distributed feedback laser (DFB). The light source 3113 is configured to emit laser into the receiving chamber 31121. As illustrated in FIG. 8, the light source 3113 has a columnar shape as a whole, and an end face of the light source 3113 away from the substrate assembly 3111 is configured as a light emitting surface 31131. The laser is emitted from the light emitting surface 31131 and the light emitting surface 31131 faces the collimation element 3114. The light source 3113 is fixed to the substrate assembly 3111. Specifically, the light source 3113 may be adhered to the substrate assembly 3111 by a sealant 3117. For instance, a surface of the light source 3113 facing away from the light emitting surface 31131 is adhered to the substrate assembly 3111. As illustrated in FIG. 7 and FIG. 9, a side surface 31132 of the light source 3113 may also be adhered to the substrate assembly 3111. The sealant 3117 wraps around the surrounding side surfaces 42. It is also conceivable that only one surface of the side surfaces 31132 is adhered to the substrate assembly 3111 or several surfaces of the side surfaces 31132 are adhered to the substrate assembly 3111. In this case, the sealant 3117 may be a thermal conductive adhesive, which conducts heat generated by the operation of the light source 3113 to the substrate assembly 3111.

As illustrated in FIG. 7, the diffractive optical element 3115 is supported on the top wall 31122 and accommodated in the protection cover 3116. Two sides facing away from each other of the diffractive optical element 3115 abut against the protection cover 3116 and the top wall 31122, respectively. The baffle 31162 includes an abutting surface 31163 adjacent to the light transmission hole 31125. The diffractive optical element 3115 abuts against the abutting surface 31163.

Specifically, the diffractive optical element 3115 includes a diffractive incident surface 31152 and a diffractive emergent surface 31154 facing away from each other. The diffractive optical element 3115 is supported on the top wall 31122. The diffractive emergent surface 31154 abuts against a surface (the abutting surface 31163) of the baffle 31162 adjacent to the light transmission hole 31125. The diffractive incident surface 31152 abuts against the top wall 31122. The light transmission hole 31125 is aligned with the receiving chamber 31121 and the light emission through hole 31160 is aligned with the light transmission hole 31125. The top wall 31122, the annular side wall 31164 and the baffle 31162 abut against the diffractive optical element 3115, thereby preventing the diffractive optical element 3115 from falling off from the protection cover 3116 along a light emitting direction. In some embodiments, the protection cover 3116 is adhered to the top wall 31122 through glue.

The edge-emitting laser is adopted as the light source 3113 of the laser projection module 311. On one hand, the edge-emitting laser has a lower temperature drift than the VCSEL array. On the other hand, since the edge-emitting laser has a single-point light-emitting structure, no array structure needs to be provided and the manufacturing is easy, such that the cost of the light source of the laser projection module 311 is low.

When the laser of the distributed feedback laser propagates, the power gain is obtained through feedbacks of a grating structure. In order to enhance the power of the distributed feedback laser, the injected current and/or the length of the distributed feedback laser need to be increased. Since increasing the injected current will increase the power consumption of the distributed feedback laser and cause a severe heat emission, in order to ensure that the distributed feedback laser can operate normally, it is required to increase the length of the distributed feedback laser, such that the distributed feedback laser generally has a slender structure. When the light-emitting surface 31131 of the edge-emitting laser faces the collimation element 3114, the edge-emitting laser is arranged vertically. Since the edge-emitting laser has the slender structure, the edge-emitting laser tends to encounter accidents such as dropping, shifting or shaking. As such, the sealant 3117 is provided to fix the edge-emitting laser so as to prevent the edge-emitting laser from encountering accidents such as dropping, shifting or shaking.

Figure 10:
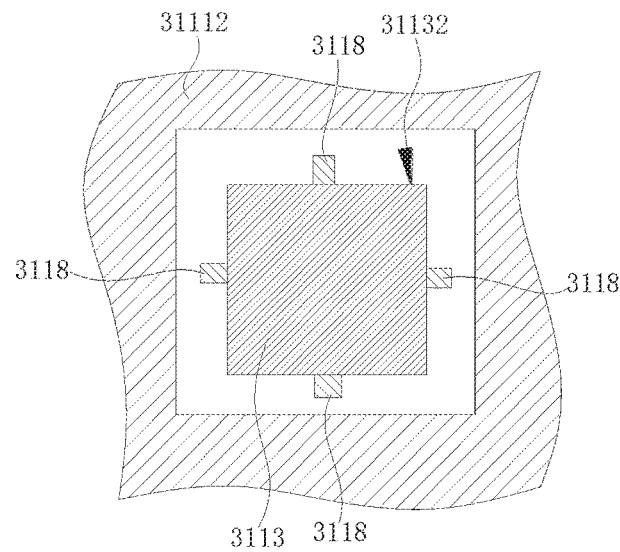

As illustrated in FIG. 7 and FIG. 10, in some embodiments, the light source 3113 may also be fixed to the substrate assembly 3111 in a fixing manner as illustrated in FIG. 10. Specifically, the laser projection module 311 includes a plurality of support blocks 3118. The support blocks 3118 may be fixed to the substrate assembly 3111. The plurality of support blocks 3118 surround the light source 3113 together and the light source 3113 may be directly mounted among the plurality of support blocks 3118 upon installation. In some embodiments, the plurality of support blocks 3118 clamp the light source 3113 together to further prevent the light source 3113 from shaking.

In some embodiments, the protection cover 3116 may be omitted. In this case, the diffractive optical element 3115 may be arranged in the receiving chamber 31121, the diffractive emergent surface 31154 of the diffractive optical element 3115 may abut against the top wall 31122, and the laser passes through the diffractive optical element 3115 and then through the light transmission hole 31125. In this way, it is less likely for the diffractive optical element 3115 to fall off.

In some embodiments, the substrate 31111 may be omitted. The light source 3113 may be directly fixed to the circuit board 31112 to reduce an overall thickness of the laser projection module 311.

In the second embodiment of the present disclosure, as illustrated in FIG. 11 to FIG. 18, the input/output assembly 30 is mounted in the housing 10. The input/output assembly 30 includes an input/output module 31 and a bracket 32. The input/output module 31 is mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

Figure 14:
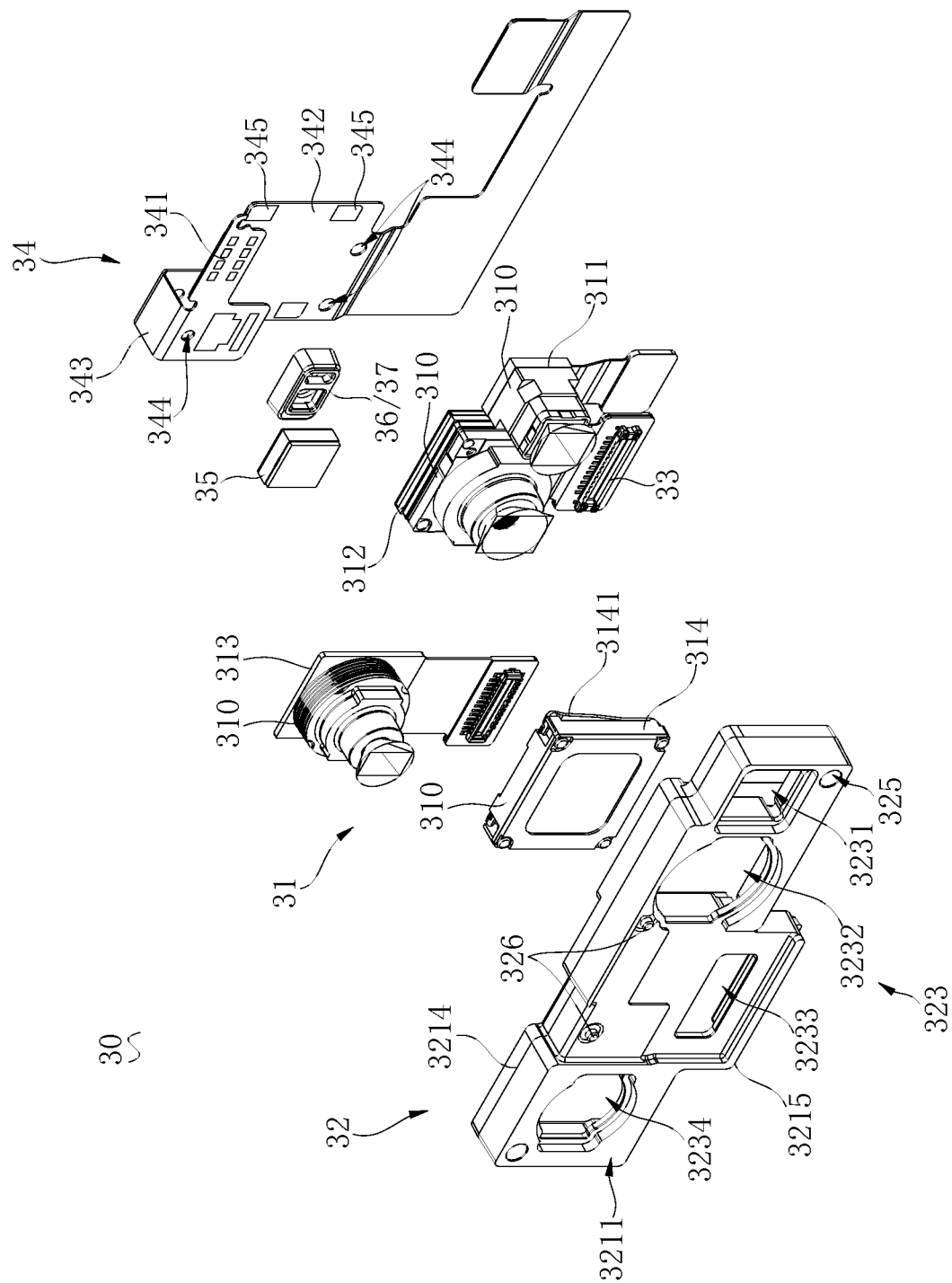
FIG. 14 and FIG. 15 are exploded perspective views of an input/output assembly according to some embodiments of the present disclosure.
Figure 15:
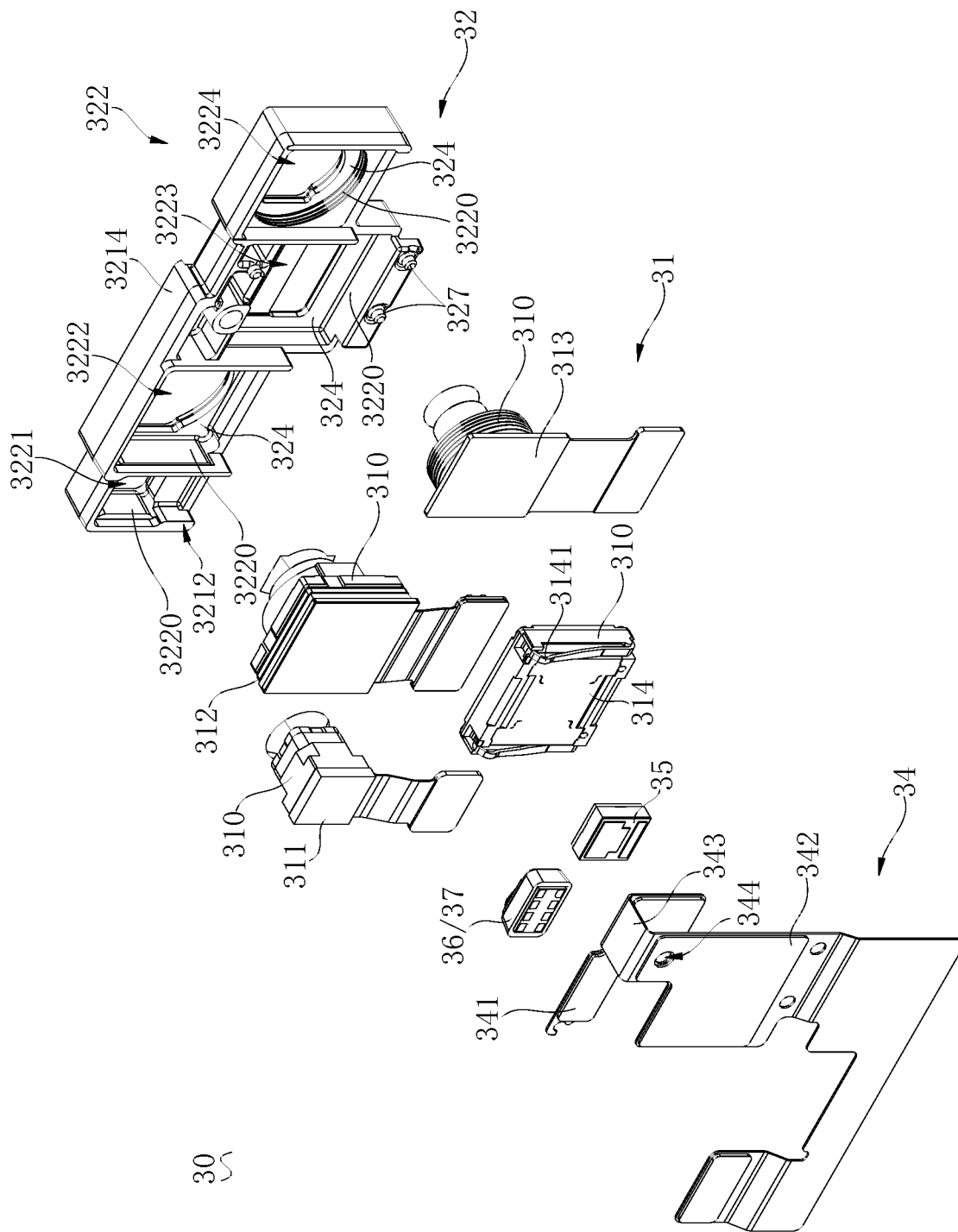

As illustrated in FIG. 14 and FIG. 15, in the embodiment of the present disclosure, the input/output module 31 includes a laser projection module 311, an infrared imaging module 313, a visible-light imaging module 312 and a receiver 314. The laser projection module 311 may project a laser pattern to a target object outside the terminal 100. The laser may be infrared light. The infrared imaging module 313 may be used to receive an infrared light signal outside to produce an infrared image. In some embodiments, the infrared imaging module 313 may receive the laser pattern reflected by the target object, and both the laser projection module 311 and the infrared imaging module 313 are used to obtain depth information of the target object. The visible-light imaging module 312 may receive a visible light signal outside to produce a color image. The visible-light imaging module 312, the infrared imaging module 313 and the laser projection module 311 may be used to obtain a depth image of a target user. The receiver 314 emits a sound wave to the outside under the action of a driving signal to realize functions such as making a call. The input/output module 31 may be provided with a connector 33. The connector 33 may be inserted into a specific connector receptacle of the mainboard 20 to couple the input/output module 31 to the mainboard 20. The input/output module 31 may be separated from the mainboard 20 by pulling the connector 33 out of the connector receptacle. An outer wall 310 of at least one of the input/output modules 31 is provided with external threads. An outer wall 310 of the infrared imaging module 313 in the present embodiment is provided with external threads. In other embodiments, an outer wall 310 of any one, two, three or four of the laser projection module 311, the visible-light imaging module 312, the infrared imaging module 313 and the receiver 314 may be provided with external threads. In other embodiments, there may be one, two, three, four or any larger number of input/output modules 31 in the input/output assembly 30.

Figure 11:
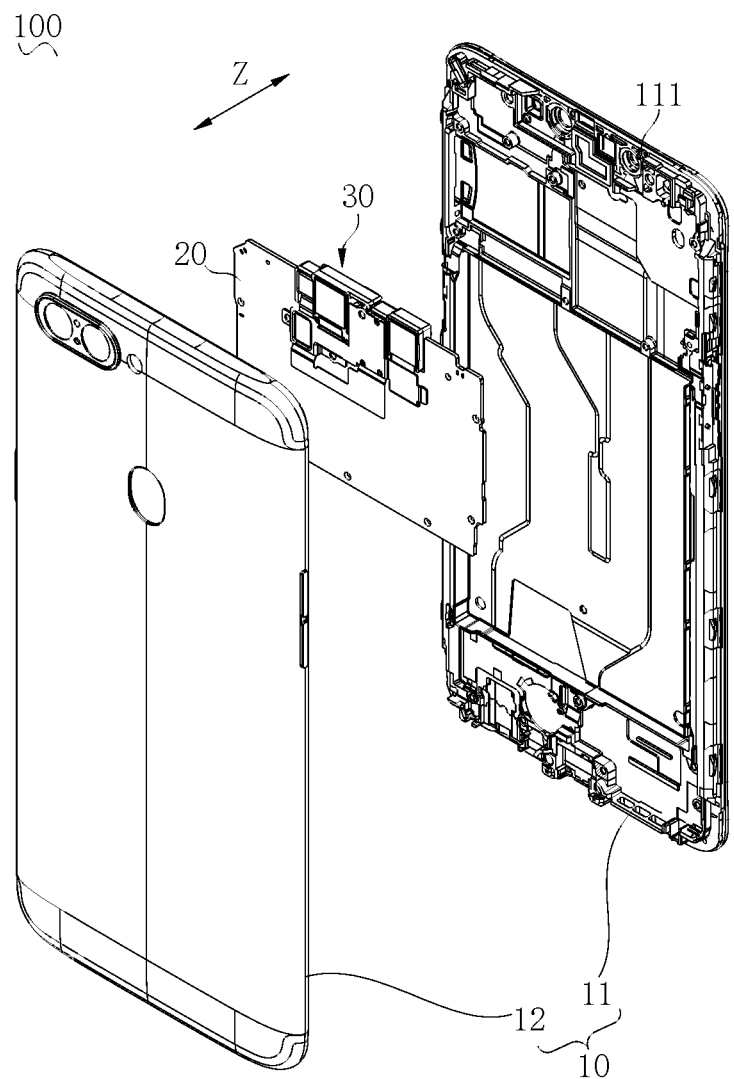
FIG. 11 is an exploded perspective view of a terminal according to some embodiments of the present disclosure.
Figure 12:
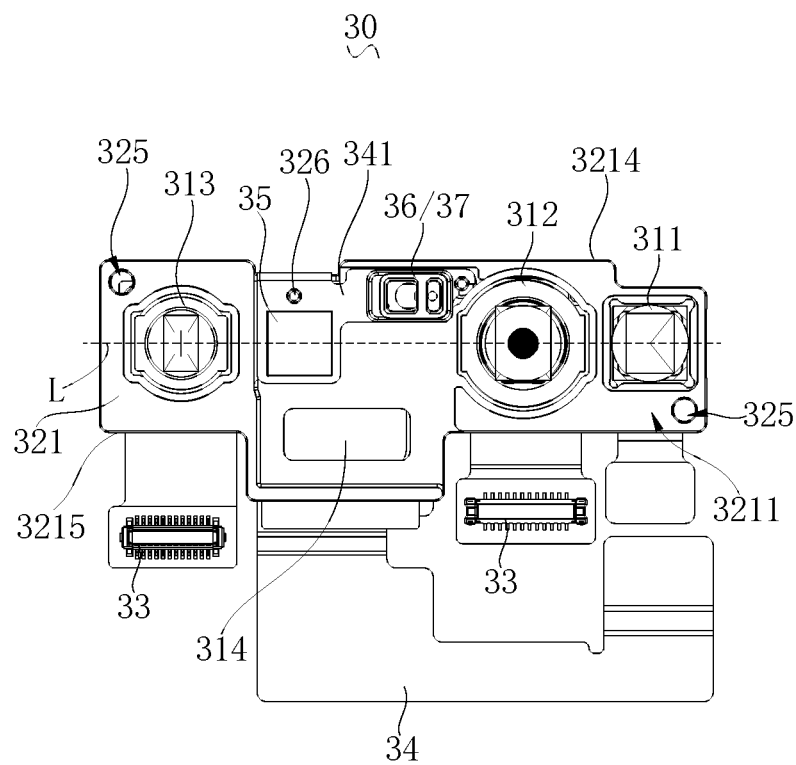
FIG. 12 and FIG. 13 are plan assembling views of an input/output assembly according to some embodiments of the present disclosure.
Figure 13:
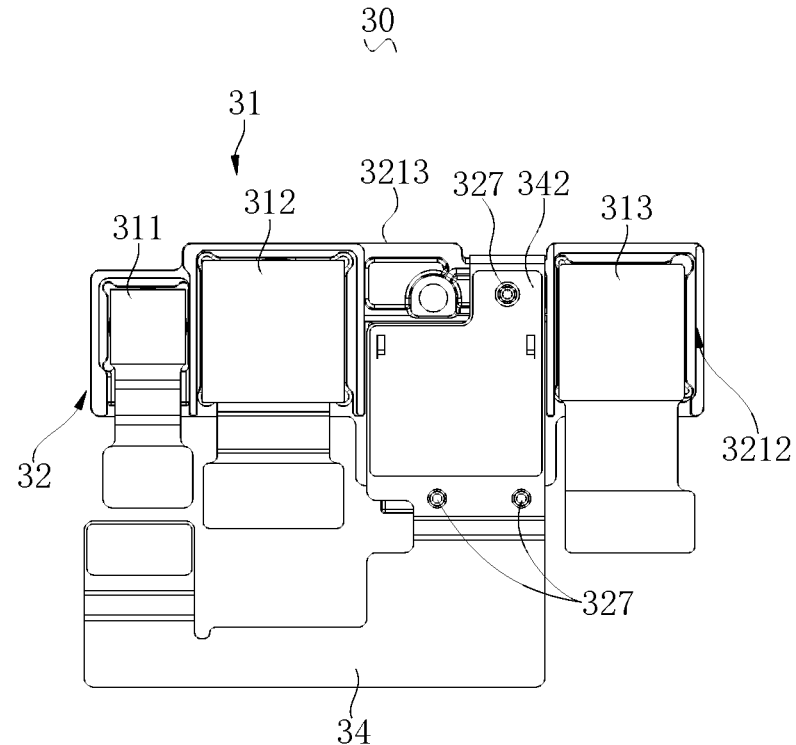

As illustrated in FIG. 11 to FIG. 13, the bracket 32 is integrally formed. The bracket 32 includes a body 321. The bracket 32 is fixed in the housing 10 and configured for an arrangement of the input/output module 31. The body 321 includes a first face 3211, a second face 3212 and a side wall 3213. The first face 3211 faces away from the second face 3212. The side wall 3213 connects the first face 3211 to the second face 3212. The side wall 3213 includes a top side wall 3214 and a bottom side wall 3215 facing away from each other. When the input/output assembly 30 is mounted in the housing 10, the front housing 11 may abut against the first face 3211 and the rear housing 12 may abut against the second face 3212 to clamp the bracket 32, such that the bracket 32 and the input/output module 31 may be prevented from moving in a thickness direction of the terminal 100 (direction Z as illustrated in FIG. 11). Furthermore, the bracket 32 is mounted in a position corresponding to a mounting opening of the mainboard 20. The side wall 3213 of the bracket 32 may abut against an inner wall surrounding the mounting opening, so that the bracket 32 is caught in the mounting opening. In this case, simply securing the position of the mainboard 20 may prevent the bracket 32 and the input/output module 31 from moving in a width direction (in a direction perpendicular to direction Z as illustrated in FIG. 11) of the terminal 100.

Figure 16:
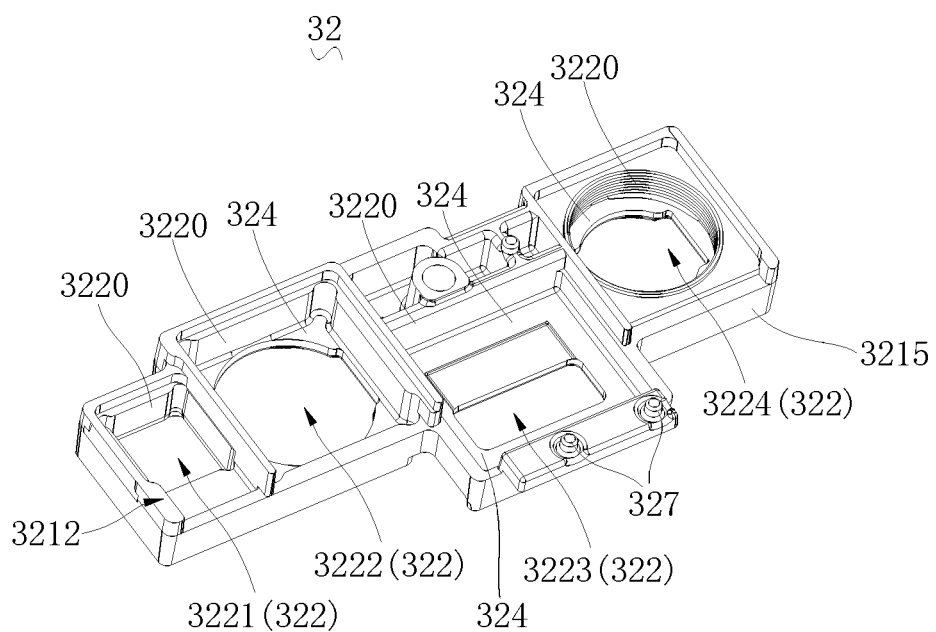
FIG. 16 is a schematic view of a bracket of an input/output assembly according to some embodiments of the present disclosure.

As illustrated in FIG. 14 to FIG. 16, the second face 3212 is provided with a plurality of accommodating chambers 322, the first face 3211 is provided with a plurality of through holes 323 corresponding to the plurality of accommodating chambers 322, and the accommodating chamber 322 is arranged between the top side wall 3214 and the bottom side wall 3215. An inner wall 3220 of at least one of the plurality of accommodating chambers 322 is provided with internal threads. The inner walls 3220 of some other accommodating chambers 322 may not be provided with internal threads. The input/output module 31 is fixedly mounted in the plurality of accommodating chambers 322. When the input/output module 31 is mounted to the bracket 32, the input/output module 31 is exposed from the second face 3212, and the input/output module 31 is also exposed from the first face 3211 via the through hole 323. In the embodiment of the present disclosure, "be exposed from" indicates that the input/output module 31 can be observed from the first face 3211 or the second face 3212. For example, the input/output module 31 may pass through the through hole 323 of the first face 3211 and thus be exposed out of the first face 3211. Or, the input/output module 31 may not pass through the through hole 323, but is visible from the through hole 323.

Figure 17:
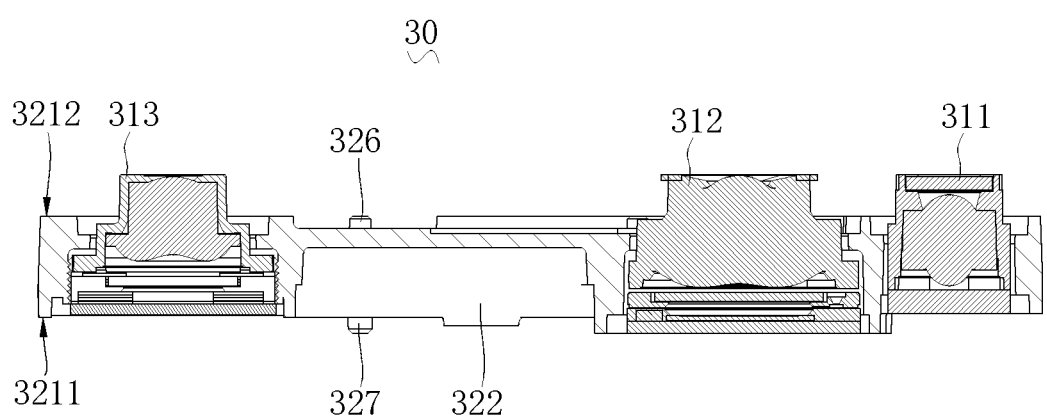
FIG. 17 is a sectional view of an input/output assembly according to some embodiments of the present disclosure.
Figure 18:
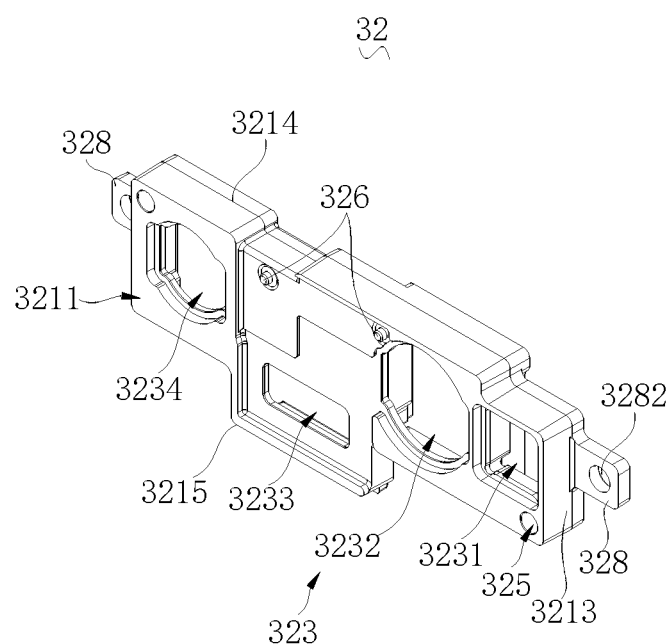
FIG. 18 is a schematic view of a bracket of an input/output assembly according to some embodiments of the present disclosure.

The bracket 32 includes a position limiting ring 324. Specifically, an opening size of the through hole 323 is smaller than that of the corresponding accommodating chamber 322 to provide the position limiting ring 324, and the accommodating chamber 322 is defined by the position limiting ring 324 and an inner wall extending around the position limiting ring 324. When the input/output module 31 whose outer wall 310 is provided with external threads is mounted into the accommodating chamber 322 whose inner wall 3220 is provided with internal threads, the internal threads and the external threads are screwed (engaged) to mount the input/output module 31 in the accommodating chamber 322 (as illustrated in FIG. 17). When the input/output module 31 is mounted into the accommodating chamber 322 whose inner wall 3220 is not provided with internal threads, the input/output module 31 may be mounted into the accommodating chamber 322 along a direction from the second face 3212 to the first face 3211 until the input/output module 31 abuts against the position limiting ring 324, which indicates that the input/output module 31 is mounted in place, and thus a glue may be dispensed into the accommodating chamber 322. Specifically, the glue may be dispensed into a gap between the input/output module 31 and the inner wall of the accommodating chamber 322. When the glue is cured, the input/output module 31 is fixedly mounted in the accommodating chamber 322.

It may be understood that a specific shape of the accommodating chamber 322 corresponds to that of the corresponding input/output module 31. The volume of the accommodating chamber 322 may be slightly larger than that of the input/output module 31, which facilitates dispensing the glue into the accommodating chamber 322. Or, the volume of the accommodating chamber 322 may be slightly smaller than that of the input/output module 31, so that the input/output module 31 may be mounted in the accommodating chamber 322 through an interference fit. The specific number of the accommodating chamber 322 may be equal to that of the input/output module 31. The number of the accommodating chamber 322 whose inner wall 3220 is provided with internal threads is equal to that of the input/output module 31 whose outer wall 310 is provided with external threads.

Further, as illustrated in FIG. 14 and FIG. 16, in the embodiment of the present disclosure, the accommodating chamber 322 includes a first chamber 3221, a second chamber 3222, a third chamber 3223 and a fourth chamber 3224. The first chamber 3221, the second chamber 3222, the third chamber 3223 and the fourth chamber 3224 are arranged in sequence. The through hole 323 includes a first hole 3231, a second hole 3232, a third hole 3233 and a fourth hole 3234. The first hole 3231 corresponds to the first chamber 3221, the second hole 3232 corresponds to the second chamber 3222, the third hole 3233 corresponds to the third chamber 3223, and the fourth hole 3234 corresponds to the fourth chamber 3224. The plurality of accommodating chambers 322 may be spaced apart from each other. Or, any two, three or four accommodating chambers 322 may be communicated with each other. The first chamber 3221 may be configured for an arrangement of the laser projection module 311, the second chamber 3222 may be configured for an arrangement of the visible-light imaging module 312, the third chamber 3223 may be configured for an arrangement of the receiver 314, and the fourth chamber 3224 may be configured for an arrangement of the infrared imaging module 313. Specifically, the inner walls 3220 of the first chamber 3221, the second chamber 3222 and the third chamber 3223 are not provided with internal threads. The laser projection module 311 is adhered in the first chamber 3221 through glue, the visible-light imaging module 312 is adhered in the second chamber 3222 through glue, and the receiver 314 is adhered in the third chamber 3223 through glue. The inner wall 3220 of the fourth chamber 3224 is provided with internal threads. External threads on the outer wall 310 of the infrared imaging module 313 are screwed (engaged) with the internal threads on the inner wall 3220 of the fourth chamber 3224 so as to mount the infrared imaging module 313 into the fourth chamber 3224 (as illustrated in FIG. 17). Centers of the first chamber 3221, the second chamber 3222 and the fourth chamber 3224 are arranged on a same straight line L (as illustrated in FIG. 12). When the laser projection module 311, the visible-light imaging module 312 and the infrared imaging module 313 are mounted in place, optical axes of the laser projection module 311, the visible-light imaging module 312 and the infrared imaging module 313 are arranged on the same plane, which facilitates cooperative operations among the laser projection module 311, the visible-light imaging module 312 and the infrared imaging module 313. Specifically, the laser projection module 311 extends through the first hole 3231, the visible-light imaging module 312 extends through the second hole 3232, and the infrared imaging module 313 extends through the fourth hole 3234. More specifically, a light emitting surface of the laser projection module 311, a light incident surface of the visible-light imaging module 312 and a light incident surface of the infrared imaging module 313 may be arranged on the same plane. A center of the third chamber 3223 is arranged between the straight line L and the bottom side wall 3215. The receiver 314 is mounted in the fourth chamber 3224 and may not pass through the fourth hole 3234. The sound wave emitted by the receiver 314 may pass through the fourth hole 3234 and enter the outside.

To sum up, in the terminal 100 according to the embodiment of the present disclosure, as the bracket 32 is integrally formed, when a plurality of input/output modules 31 are mounted in the accommodating chambers 322, relative positions of the input/output modules 31 will not be changed easily, and thus the plurality of input/output modules 31 will cooperatively operate better. Specifically, since the positions of the plurality of accommodating chambers 322 will not be changed, as long as the input/output modules 31 are fixed in the accommodating chambers 322, the relative positions among the input/output modules 31 will not be changed. Moreover, as the plurality of input/output modules 31 may be mounted to one bracket 32 simultaneously, it is unnecessary to provide a plurality of brackets for the plurality of input/output modules 31, thereby simplifying the structure of the terminal 100 and saving mounting space in the terminal 100. In addition, the inner wall 3220 of the at least one of the plurality of accommodating chambers 322 is provided with internal threads, which facilitates the input/output module 31 whose outer wall 310 is provided with external threads to be mounted in the accommodating chamber 322 whose inner wall 3220 is provided with internal threads.

In the third embodiment of the present disclosure, as illustrated in FIG. 19 to FIG. 24, the input/output assembly 30 is mounted in the housing 10. The input/output assembly 30 includes an input/output module 31 and a bracket 32. The input/output module 31 is mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

Figure 22:
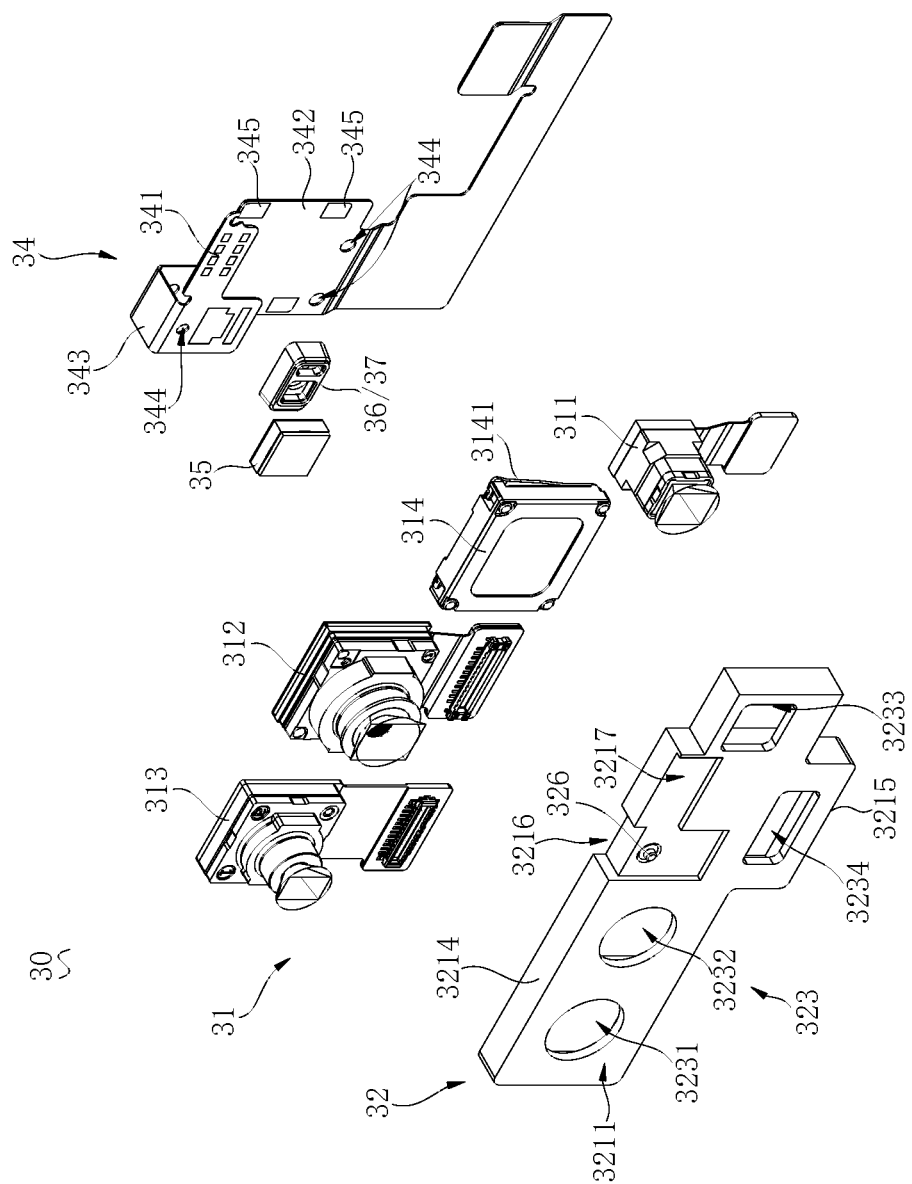
FIG. 22 and FIG. 23 are exploded perspective views of an input/output assembly according to some embodiments of the present disclosure.
Figure 23:
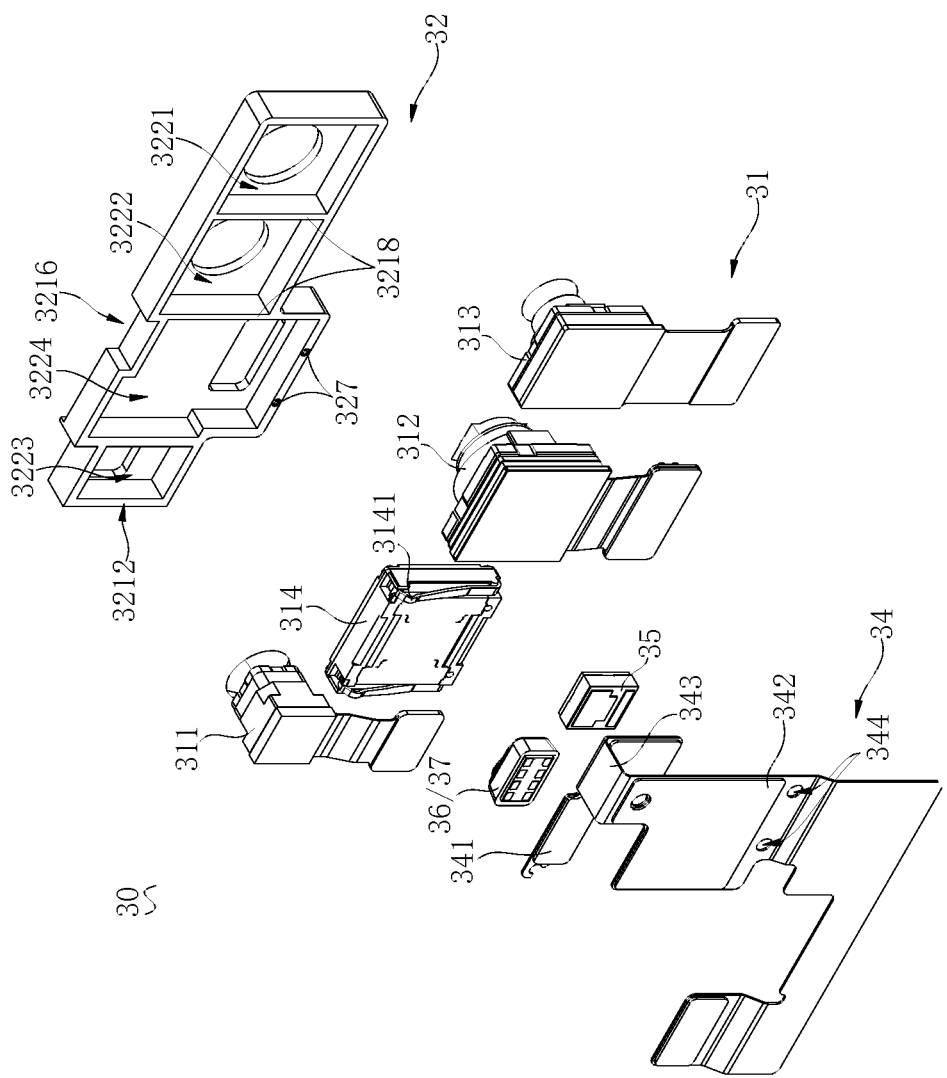

As illustrated in FIG. 22 and FIG. 23, in the embodiment of the present disclosure, the input/output module 31 includes an infrared imaging module 313, a visible-light imaging module 312, a laser projection module 311 and a receiver 314. The infrared imaging module 313 may be used to receive an infrared light signal outside to produce an infrared image. The visible-light imaging module 312 may receive a visible light signal outside to produce a color image. The laser projection module 311 may be used to project a laser patter to a target object outside the terminal 100. The laser may be infrared laser. The receiver 314 emits a sound wave to the outside under the action of a driving signal to realize functions such as making a call. In some embodiments, the infrared imaging module 313 may receive the laser pattern emitted by the laser projection module 311 and reflected by the target object. The laser projection module 311 and the infrared imaging module 313 are used to obtain depth information of the target object together. The infrared imaging module 313, the visible-light imaging module 312 and the laser projection module 311 may be used to obtain a depth image of a target user together. A connector 33 may be provided to the input/output module 31 and inserted into a specific connector receptacle of the mainboard 20 to electrically and mechanically couple the input/output module 31 to the mainboard 20. Pulling the connector 33 out of the connector receptacle may separate the input/output module 31 from the mainboard 20 and break the electrical connection therebetween.

Figure 19:
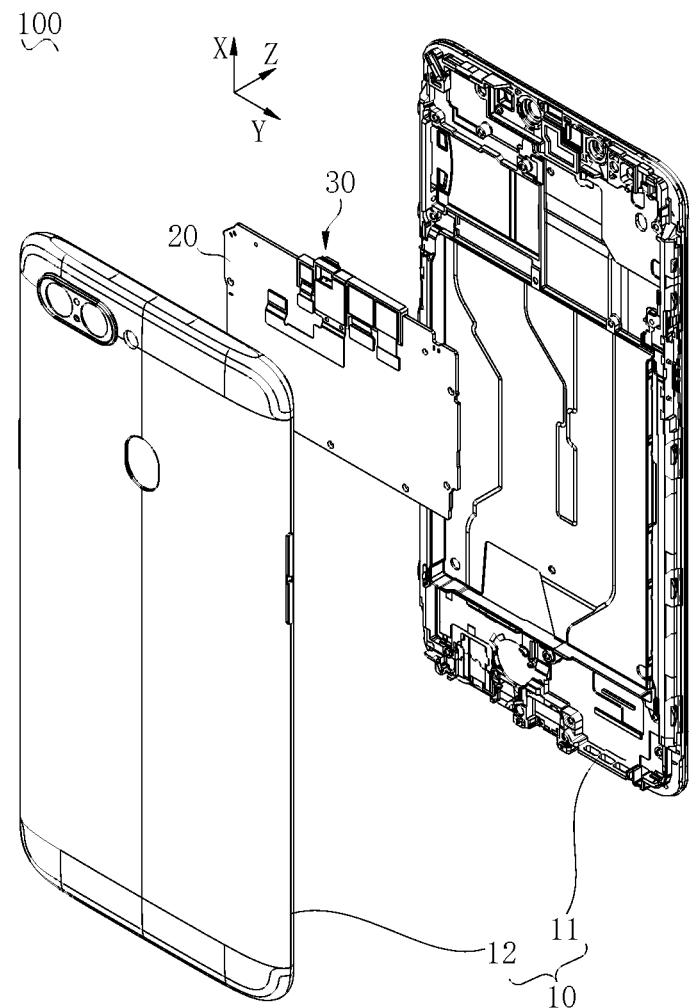
FIG. 19 is an exploded perspective view of a terminal according to some embodiments of the present disclosure.
Figure 20:
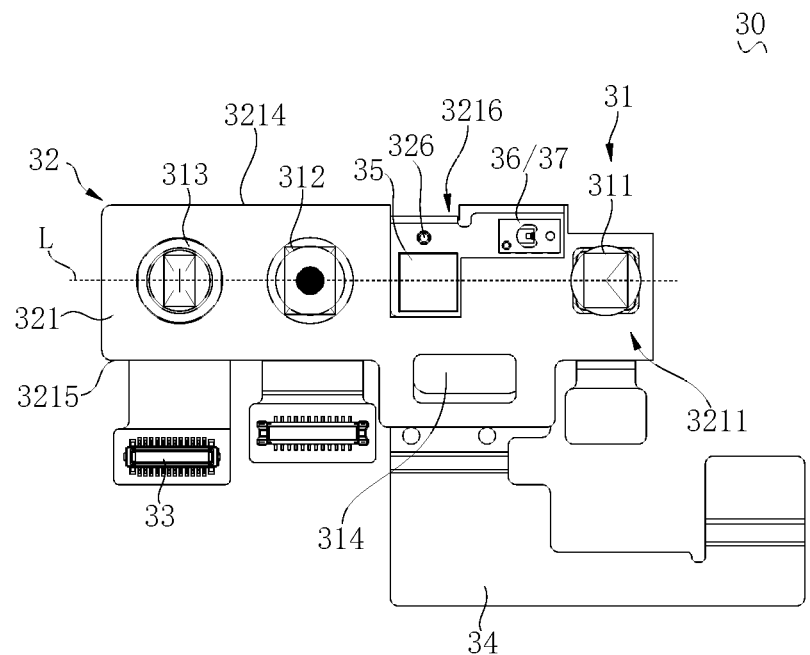
FIG. 20 and FIG. 21 are plan assembling views of an input/output assembly according to some embodiments of the present disclosure.
Figure 21:
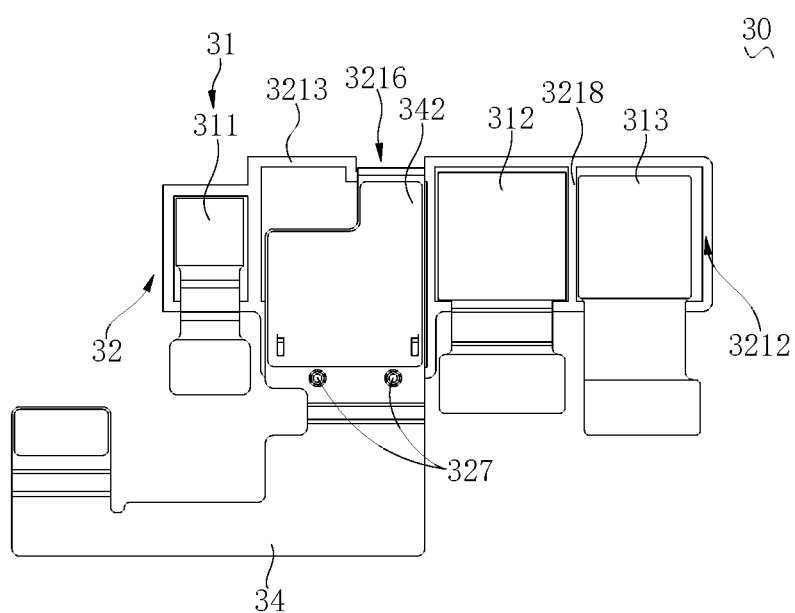

As illustrated in FIG. 19 to FIG. 21, the bracket 32 is integrally formed and configured for an arrangement of the input/output module 31. The bracket 32 includes a body 321.

The body 321 includes a first face 3211, a second face 3212 and a side wall 3213. The first face 3211 faces away from the second face 3212. The side wall 3213 connects the first face 3211 to the second face 3212. The side wall 3213 includes a top side wall 3214 and a bottom side wall 3215 facing away from each other. When the input/output assembly 30 is mounted in the housing 10, the front housing 11 may abut against the first face 3211 and the rear housing 12 may abut against the second face 3212 to clamp the bracket 32, such that the bracket 32 and the input/output module 31 may be prevented from moving in a thickness direction of the terminal 100 (direction Z as illustrated in FIG. 19). Furthermore, the bracket 32 is mounted to a position corresponding to a mounting opening of the mainboard 20. The side wall 3213 of the bracket 32 may abut against an inner wall surrounding the mounting opening, so that the bracket 32 is caught in the mounting opening. In this way, simply securing the position of the mainboard 20 may prevent the bracket 32 and the input/output module 31 from moving in a width direction (direction Y as illustrated in FIG. 19) of the terminal 100.

As illustrated in FIG. 22 and FIG. 23, the second face 3212 is provided with an accommodating chamber 322. The first face 3211 is provided with a through hole 323 corresponding to the accommodating chamber 322. The accommodating chamber 322 is arranged between the top side wall 3214 and the bottom side wall 3215. The accommodating chamber 322 is configured to accommodate the input/output module 31 therein. A specific shape of the accommodating chamber 322 corresponds to that of the corresponding input/output module 31. The volume of the accommodating chamber 322 may be slightly larger than that of the input/output module 31, which facilitates dispensing glue into the accommodating chamber 322. Or, the volume of the accommodating chamber 322 may be slightly smaller than that of the input/output module 31, so that the input/output module 31 may be mounted in the accommodating chamber 322 through an interference fit. The number of the accommodating chamber 322 may be equal to that of the input/output module 31. When the input/output module 31 is mounted to the bracket 32, the input/output module 31 is exposed from the through hole 323. In the embodiment of the present disclosure, "be exposed from" indicates that the input/output module 31 can be observed from the first face 3211 or the second face 3212. For example, the input/output module 31 may pass through the through hole 323 of the first face 3211 and thus be exposed out of the first face 3211. Or, the input/output module 31 may not pass through the through hole 323, but is visible from the through hole 323.

Specifically, the accommodating chamber 322 includes a first chamber 3221, a second chamber 3222, a third chamber 3223 and a fourth chamber 3224. The first chamber 3221, the second chamber 3222 and the third chamber 3223 are arranged in sequence. The phrase "arranged in sequence" may refer to a sequential arrangement along a length direction of the bracket 32, and specifically, it may refer to a sequential arrangement from left to right or from right to left. In the embodiment as illustrated in FIG. 23, the fourth chamber 3224 is arranged between the second chamber 3222 and the third chamber 3223. In other embodiments, the fourth chamber 3224 may also be arranged between the first chamber 3221 and the second chamber 3222; or, the fourth chamber 3224 is arranged on a side of the first chamber 3221 facing away from the second chamber 3222; or, the fourth chamber 3224 is arranged on a side of the third chamber 3223 facing away from the second chamber 3222.

The first chamber 3221 is configured for an arrangement of the infrared imaging module 313, the second chamber 3222 is configured for an arrangement of the visible-light imaging module 312, the third chamber 3223 is configured for an arrangement of the laser projection module 311, and the fourth chamber 3224 is configured for an arrangement of the receiver 314. In other words, the infrared imaging module 313, the visible-light imaging module 312, the laser projection module 311 and the receiver 314 may be mounted in the first chamber 3221, the second chamber 3222, the third chamber 3223 and the fourth chamber 3224 in sequence. The side wall 3213 includes a plurality of spacing walls 3218. The plurality of accommodating chambers 322 may be spaced apart from each other. For example, the first chamber 3221, the second chamber 3222, the third chamber 3223 and the fourth chamber 3224 are spaced apart from one another in sequence by the spacing walls 3218 (as illustrated in FIG. 23). Or, any two, three or more accommodating chambers 322 are communicated with each other. For example, the first chamber 3221 is communicated with the second chamber 3222, and the second chamber 3222 is spaced apart from the fourth chamber 3224.

The through hole 323 includes a first through hole 3231, a second through hole 3232, a third through hole 3233 and a fourth through hole 3234. The first through hole 3231, the second through hole 3232, the third through hole 3233 and the fourth through hole 3234 are communicated with the first chamber 3221, the second chamber 3222, the third chamber 3223 and the fourth chamber 3224, respectively. In other words, the first through hole 3231 is communicated with the first chamber 3221, the second through hole 3232 is communicated with the second chamber 3222, the third through hole 3233 is communicated with the third chamber 3223, and the fourth through hole 3234 is communicated with the fourth chamber 3224. In addition, the fourth through hole 3234 further corresponds to a sound outlet of the receiver 314. An aperture of the fourth through hole 3234 may be smaller than that of the sound outlet of the receiver 314. In this way, the receiver 314 may not pass through the fourth through hole 3234, and the sound wave emitted by the receiver 314 may pass through the fourth through hole 3234 and enter the outside. Centers of the first through hole 3231, the second through hole 3232 and the third through hole 3233 are arranged on a same straight line L. The fourth through hole 3234 is arranged between the straight line L and the bottom side wall 3215 (as illustrated in FIG. 20). After the infrared imaging module 313, the visible-light imaging module 312 and the laser projection module 311 are mounted in place, the infrared imaging module 313 extends through the first through hole 3231, the visible-light imaging module 312 extends through the second through hole 3232, and the laser projection module 311 extends through the third through hole 3233. Optical axes of the infrared imaging module 313, the visible-light imaging module 312 and the laser projection module 311 are arranged on the same plane, which facilitates cooperative operations of the infrared imaging module 313, the visible-light imaging module 312 and the laser projection module 311. Top surfaces of the infrared imaging module 313, the visible-light imaging module 312 and the laser projection module 311 extending out of the through holes 323 are also flush with each other. Specifically, a light incident surface of the infrared imaging module 313, a light incident surface of the visible-light imaging module 312 and a light emitting surface of the laser projection module 311 may be arranged on the same plane.

In the related art, a mobile phone is provided with a plurality of functional modules, and thus a plurality of brackets are needed to fix the plurality of functional modules to the mobile phone, respectively. Consequently, the plurality of brackets occupy a relatively large space in the mobile phone, which is not conducive to reducing the weight and thickness of the mobile phone.

To sum up, in the terminal 100 according to the embodiment of the present disclosure, as the bracket 32 is integrally formed, the plurality of input/output modules 31 may be mounted to the same bracket 32 and accommodated in the accommodating chambers 322. In this way, the mounting space in the terminal 100 is saved, which is conducive to reducing the weight and thickness of the terminal 100. In addition, relative positions of the plurality of input/output modules 31 mounted to the same bracket 32 will not be changed due to the movement of the bracket 32, and thus the plurality of input/output modules 31 may cooperatively operate better.

As illustrated in FIG. 20 and FIG. 22, in some embodiments, the top side wall 3214 has a notch 3216, the first face 3211 has a recess 3217, and the recess 3217 is communicated with the notch 3216. The input/output assembly 30 further includes an infrared fill light 35, a proximity sensor 36 and a light sensor 37. The infrared fill light 35 is used to emit an infrared light to the outside, the proximity sensor 36 is used to detect a distance from a target object to the terminal 100, and the light sensor 37 is used to detect the intensity of ambient light. The proximity sensor 36 and the light sensor 37 may be integrated into one module. The infrared fill light 35, the proximity sensor 36 and the light sensor 37 are mounted in the recess 3217. In the embodiment of the present disclosure, the position of the recess 3217 corresponds to that of the fourth chamber 3224.

As illustrated in FIG. 22 and FIG. 23, in some embodiments, the input/output assembly 30 further includes a flexible circuit board 34. The receiver 314 includes an elastic connection piece 3141. The elastic connection piece 3141 protrudes along a direction from the first face 3211 to the second face 3212. The elastic connection piece 3141 abuts against the flexible circuit board 34 to electrically connect the receiver 314 to the flexible circuit board 34. Specifically, an end of the flexible circuit board 34 may be connected to the mainboard 20. The flexible circuit board 34 may have a contact 345. The elastic connection piece 3141 abuts against the contact 345 to electrically connect the receiver 314 to the flexible circuit board 34. In some embodiments, a plurality of sets of contacts 345 are provided to the flexible circuit board 34. The elastic connection piece 3141 may electrically connect the receiver 314 to the mainboard 20 when it abuts against any set of contacts 345. In this way, as long as the sound outlet of the receiver 314 faces the second through hole 3232, the receiver 314 can be mounted in the second chamber 3222 at a plurality of angles, and the elastic connection piece 3141 can abut against the contacts 345.

As illustrated in FIG. 20 to FIG. 22, in some embodiments, the flexible circuit board 34 includes a first segment 341 and a second segment 342. The first segment 341 is pressed to the first face 3211 (when the first face 3211 is provided with the recess 3217, the first segment 341 is pressed to a bottom of the recess 3217) and the second segment 342 is pressed to the second face 3212. The elastic connection piece 3141 abuts against the second segment 342. The infrared fill light 35, the proximity sensor 36 and the light sensor 37 are mounted to the first segment 341.

In the embodiment of the present disclosure, the flexible circuit board 34 further includes a connecting segment 343 connecting the first segment 341 to the second segment 342. The connecting segment 343 passes through the notch 3216. Specifically, the first segment 341 is accommodated in the recess 3217, and the second segment 342 extends from the connecting segment 343 along a direction from the top side wall 3142 to the bottom side wall 3145. In this way, the infrared fill light 35, the proximity sensor 36, the light sensor 37 and the receiver 314 can be connected via the flexible circuit board 34, and thus the overall structure of the input/output assembly 30 is relatively simple and compact.

As illustrated in FIG. 20 and FIG. 22, in some embodiments, the bracket 32 further includes a bracket positioning column 326 protruding from the bottom of the recess 3217, and the bracket positioning column 326 is arranged between the straight line L and the top side wall 3214. The bracket positioning column 326 may be used to position components, for example, the flexible circuit board 34, the infrared fill light 35, the proximity sensor 36, or the light sensor 37, mounted to the bracket 32, so as to prevent the components from shaking. Specifically, the bracket positioning column 326 passes through and fixes the first segment 341 of the flexible circuit board 34. Therefore, the infrared fill light 35, the proximity sensor 36 and the light sensor 37 disposed to the first segment 341 are also fixed. The center of the fourth chamber 3224 and the bracket positioning column 326 may be arranged on both sides of the straight line L, respectively. A plurality of bracket positioning columns 326 may be provided, and the plurality of bracket positioning columns 326 may be arranged at peripheries of the infrared fill light 35, the proximity sensor 36 and the light sensor 37, respectively, thereby further securing the components.

As illustrated in FIG. 21 and FIG. 23, in some embodiments, the bracket 32 further includes a bracket positioning block 327. The position of the bracket positioning block 327 corresponds to that of the fourth chamber 3224. Specifically, the bracket positioning block 327 protrudes from the second face 3212. The bracket positioning block 327 may be used to position the flexible circuit board 34 mounted to the bracket 32 so as to prevent the flexible circuit board 34 from shaking. Specifically, the bracket positioning block 327 passes through and fixes the second section 342 of the flexible circuit board 34.

As illustrated in FIG. 22 and FIG. 23, in some embodiments, the flexible circuit board 34 is provided with a flexible-board positioning hole 344, and the flexible-board positioning hole 344 is configured to restrict a mounting position of the flexible circuit board 34 to the bracket 32. Specifically, the flexible-board positioning hole 344 may be provided to any one or more of the first segment 341, the second segment 342 or the connecting segment 343. In embodiments illustrated in FIGS. 22 and 23, the flexible-board positioning hole 344 is provided to both the first segment 341 and the second segment 342. The positions of the flexible-board positioning holes 344 may correspond to that of the bracket positioning column 326 and that of the bracket positioning block 327, respectively. During the installation of the flexible circuit board 34, the first segment 341 is pressed to the first face 3211 (when the first face 3211 is provided with the recess 3217, the first segment 341 is pressed to the bottom of the recess 3217) and the bracket positioning column 326 is fitted in the flexible-board positioning hole 344, and the second segment 342 is pressed to the second face 3212 and the bracket positioning block 327 is fitted in the flexible-board positioning hole 344, so that the flexible circuit board 34 is less likely to shake.

Figure 24:
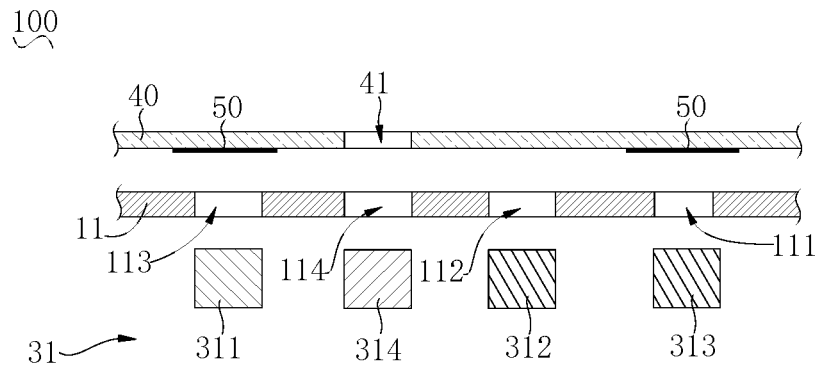
FIG. 24 is a partial schematic view of a terminal according to an embodiment of the present disclosure.

As illustrated in FIG. 19 and FIG. 24, in some embodiments, the terminal 100 further includes a cover plate 40.

The cover plate 40 and the input/output module 31 are arranged on two sides facing away from each other of the front housing 11, respectively. The front housing 11 is provided with a first via hole 111, a second via hole 112, a third via hole 113 and a fourth via hole 114. The first via hole 111 corresponds to the infrared imaging module 313, the second via hole 112 corresponds to the visible-light imaging module 312, the third via hole 113 corresponds to the laser projection module 311, and the fourth via hole 114 corresponds to the receiver 314. The cover plate 40 is provided with an infrared transmission ink 50 at positions corresponding to the first via hole 111 and the third via hole 113, respectively. The cover plate 40 is provided with a sound output hole 41 corresponding to the fourth via hole 114.

Specifically, the cover plate 40 may be light transparent. The material of the cover plate 40 may be light-transparent glass, resin, plastic or the like. The cover plate 40 covers the first via hole 111, the second via hole 112, the third via hole 113 and the fourth via hole 114. The light outside passes through the cover plate 40 and then enters the infrared imaging module 313 through the first via hole 111. The sound wave emitted by the receiver 314 passes through the fourth via hole 114 and then through the sound output hole 41. The laser emitted by the laser projection module 311 passes through the cover plate 40 after passing through the third via hole 113. The light outside passes through the cover plate 40 and then enters the visible-light imaging module 312 through the second via hole 112. In the embodiment, the cover plate 40 is provided with the infrared transmission ink 50 at positions corresponding to the first via hole 111 and the third via hole 113, respectively. The infrared transmission ink 50 has a high transmissivity for infrared light, for example, a transmissivity of 85% or more, and a high attenuation ratio for visible light, for example, an attenuation ratio of 70% or more, so that it is difficult for the user in normal use to observe an area of the terminal 100 covered by the infrared transmission ink 50 via eyes. Therefore, the user cannot see an internal structure of the terminal 100 through the first via hole 111 and the third via hole 113 (i.e., it is difficult to see the infrared imaging module 313 and the laser projection module 311), thereby providing an aesthetic appearance to the terminal 100.

In the fourth embodiment of the present disclosure, as illustrated in FIG. 25 to FIG. 31, the input/output assembly 30 is mounted in the housing 10. The input/output assembly 30 includes an input/output module 31 and a bracket 32. The input/output module 31 is mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

Figure 28:
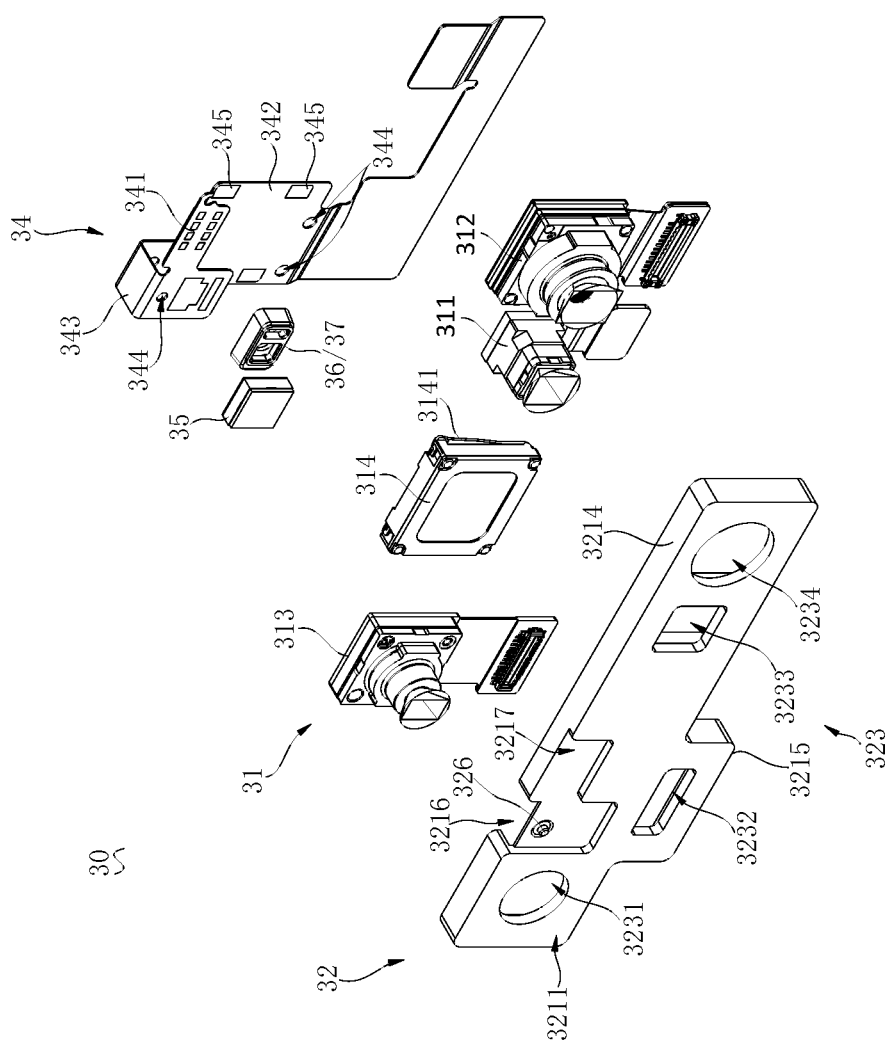
FIG. 28 and FIG. 29 are exploded perspective views of an input/output assembly according to some embodiments of the present disclosure.
Figure 29:
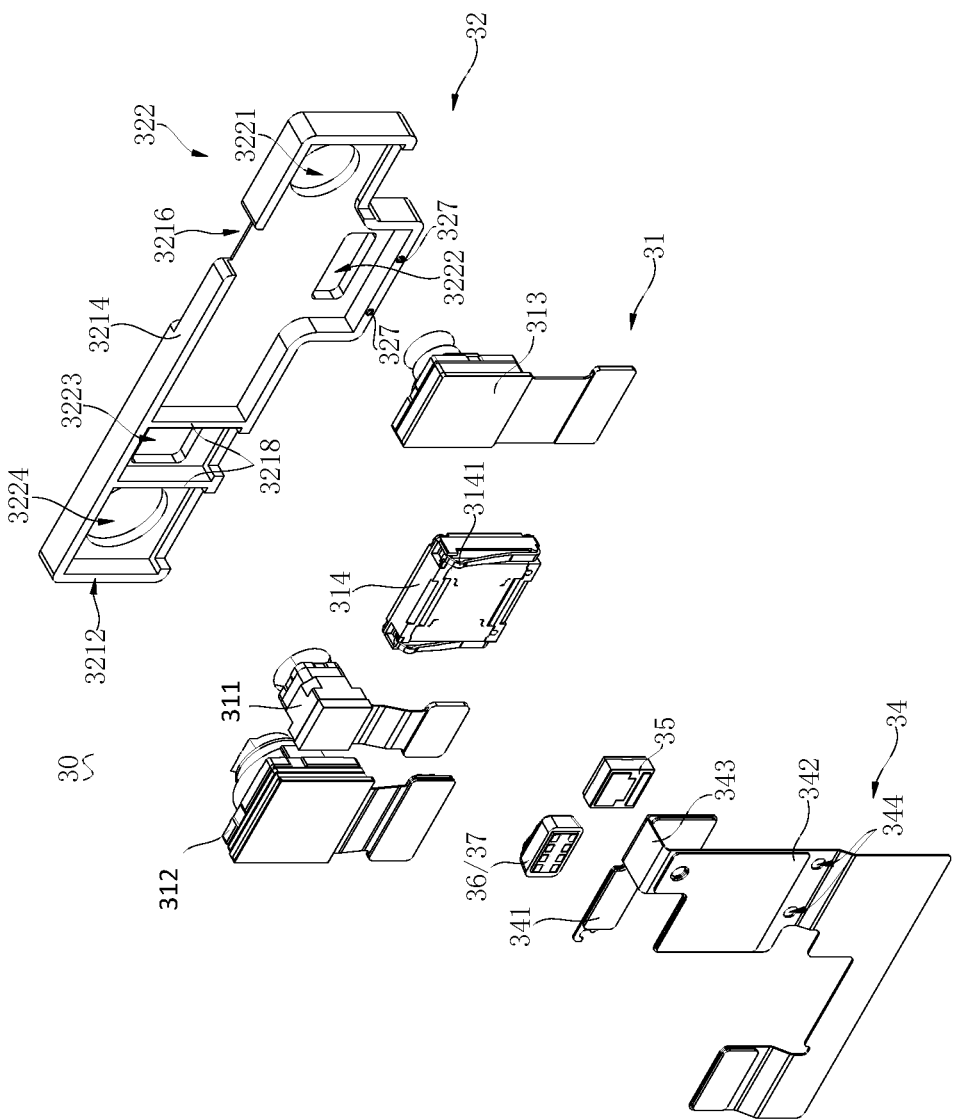

As illustrated in FIG. 28 and FIG. 29, in the embodiment of the present disclosure, the input/output module 31 includes an infrared imaging module 313, a laser projection module 311, a visible-light imaging module 312 and a receiver 314. The laser projection module 311 may be used to project a laser patter to a target object outside the terminal 100. The laser may be infrared laser. The infrared imaging module 313 may be used to receive an infrared light signal outside to produce an infrared image. In some embodiments, the infrared imaging module 313 may receive the laser pattern emitted by the laser projection module 311 and reflected by the target object. The laser projection module 311 and the infrared imaging module 313 are used to obtain depth information of the target object together. The visible-light imaging module 312 may receive a visible light signal outside to produce a color image. The infrared imaging module 313, the laser projection module 311 and the visible-light imaging module 312 may be used to obtain a depth image of a target user together. A connector 33 may be provided to the input/output module 31 and inserted into a specific connector receptacle of the mainboard 20, so as to electrically and mechanically connect the input/output module 31 to the mainboard 20. Pulling the connector 33 out of the connector receptacle may separate the input/output module 31 from the mainboard 20 and break the electrical connection therebetween. The receiver 314 emits a sound wave to the outside under the action of a driving signal so as to realize functions such as making a call.

Figure 25:
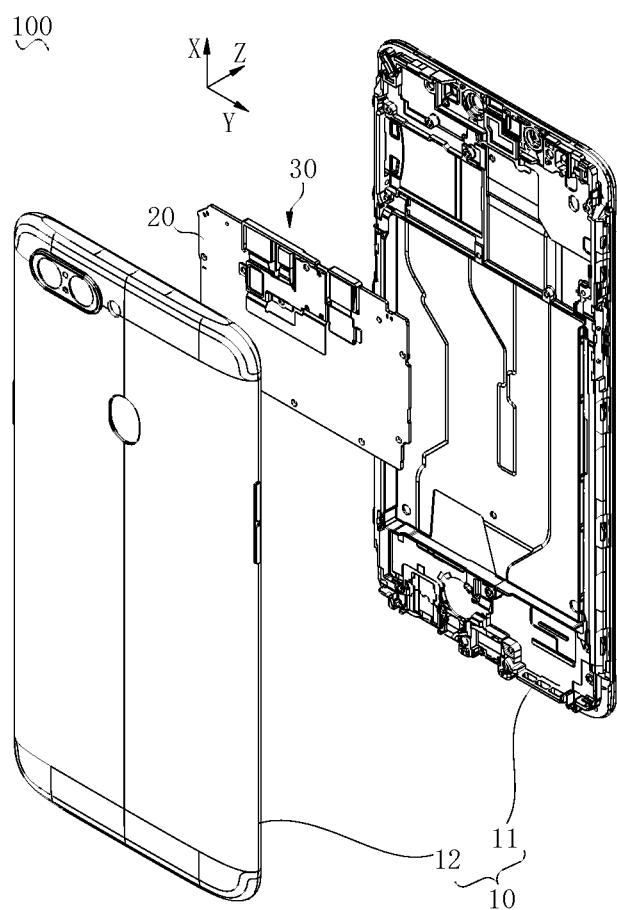
FIG. 25 is an exploded perspective view of a terminal according to some embodiments of the present disclosure.
Figure 26:
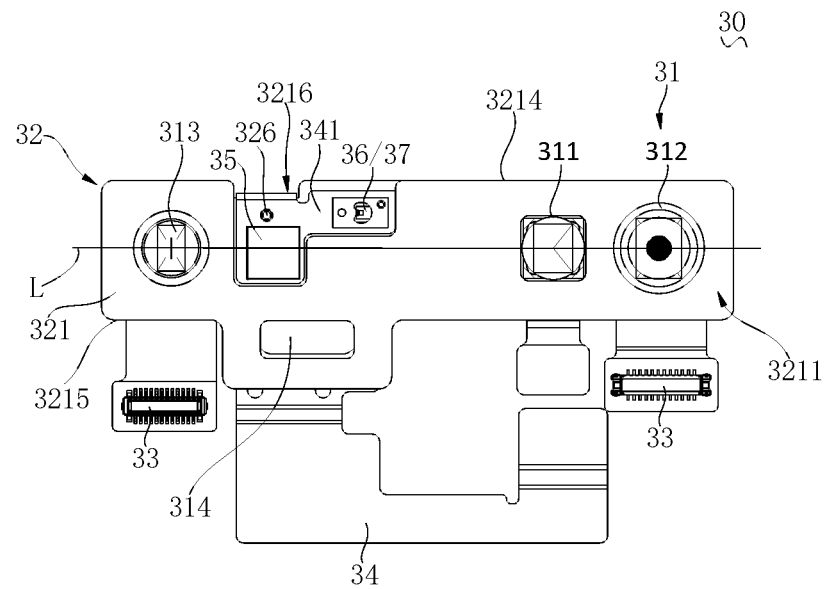
FIG. 26 and FIG. 27 are plan assembling views of an input/output assembly according to some embodiments of the present disclosure.
Figure 27:
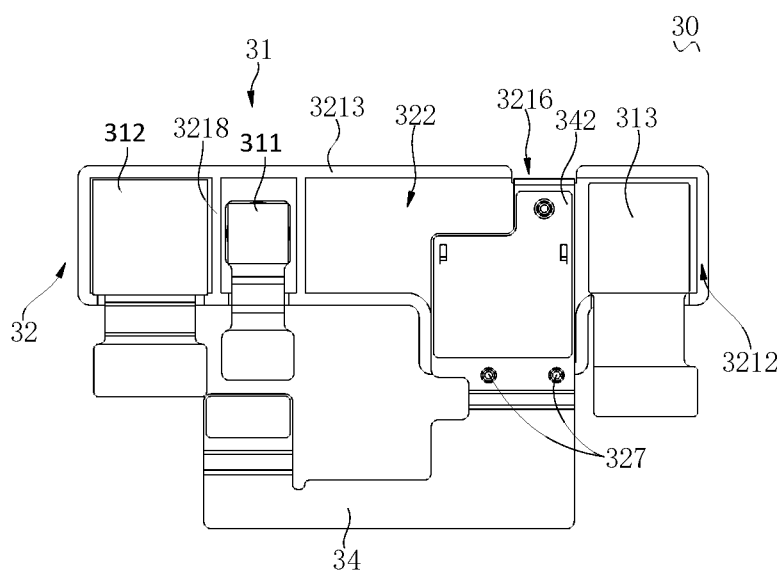

As illustrated in FIG. 25 to FIG. 27, the bracket 32 is integrally formed and configured for an arrangement of the input/output module 31. The bracket 32 includes a body 321.

The body 321 includes a first face 3211, a second face 3212 and a side wall 3213. The first face 3211 faces away from the second face 3212. The side wall 3213 connects the first face 3211 to the second face 3212. The side wall 3213 includes a top side wall 3214 and a bottom side wall 3215 facing away from each other. When the input/output assembly 30 is mounted in the housing 10, the front housing 11 may abut against the first face 3211 and the rear housing 12 may abut against the second face 3212 to clamp the bracket 32, such that the bracket 32 and the input/output module 31 can be prevented from moving in a thickness direction of the terminal 100 (direction Z as illustrated in FIG. 25). Furthermore, the bracket 32 is mounted in a position corresponding to a mounting opening of the mainboard 20. The side wall 3213 of the bracket 32 may abut against an inner wall surrounding the mounting opening, so that the bracket 32 is caught in the mounting opening. In this way, simply securing the position of the mainboard 20 may prevent the bracket 32 and the input/output module 31 from moving in a width direction (direction Y as illustrated in FIG. 25) of the terminal 100.

As illustrated in FIG. 28 and FIG. 29, the second face 3212 is provided with an accommodating chamber 322. The first face 3211 is provided with a through hole 323 corresponding to the accommodating chamber 322. The accommodating chamber 322 is arranged between the top side wall 3214 and the bottom side wall 3215. The accommodating chamber 322 is configured to accommodate the input/output module 31 therein. A specific shape of the accommodating chamber 322 corresponds to that of the corresponding input/output module 31. The volume of the accommodating chamber 322 may be slightly larger than that of the input/output module 31, which facilitates dispensing glue into the accommodating chamber 322. Or, the volume of the accommodating chamber 322 may be slightly smaller than that of the input/output module 31, so that the input/output module 31 can be mounted in the accommodating chamber 322 through an interference fit. The specific number of the accommodating chamber 322 may be equal to that of the input/output module 31. When the input/output module 31 is mounted to the bracket 32, the input/output module 31 is exposed from the through hole 323. In the embodiment of the present disclosure, "be exposed from" indicates that the input/output module 31 can be observed from the first face 3211 or the second face 3212. For example, the input/output module 31 may pass through the through hole 323 of the first face 3211 and thus be exposed out of the first face 3211. Or, the input/output module 31 may not pass through the through hole 323, but is visible from the through hole 323.

Figure 30:
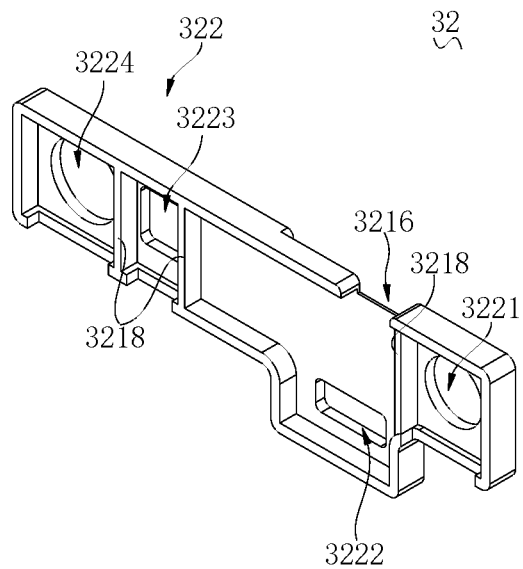
FIG. 30 is a schematic view of a bracket of an input/output assembly according to some embodiments of the present disclosure.

Specifically, the accommodating chamber 322 includes a first chamber 3221, a second chamber 3222, a third chamber 3223 and a fourth chamber 3224 arranged in sequence. The first chamber 3221 is configured for an arrangement of the infrared imaging module 313, the second chamber 3222 is configured for an arrangement of the receiver 314, the third chamber 3223 is configured for an arrangement of the laser projection module 311, and the fourth chamber 3224 is configured for an arrangement of the visible-light imaging module 312. In other words, the infrared imaging module 313, the receiver 314, the laser projection module 311 and the visible-light imaging module 312 may be arranged in the first chamber 3221, the second chamber 3222, the third chamber 3223 and the fourth chamber 3224 in sequence, respectively. In some embodiments, the first chamber 3221, the second chamber 3222, the third chamber 3223 and the fourth chamber 3224 are arranged in sequence. In a length direction of the bracket 32, it may be understood that the first chamber 3221, the second chamber 3222, the third chamber 3223 and the fourth chamber 3224 are arranged in sequence from left to right, or it may be understood that the first chamber 3221, the second chamber 3222, the third chamber 3223 and the fourth chamber 3224 are arranged in sequence from right to left. In another example, the fourth chamber 3224, the first chamber 3221, the second chamber 3222 and the third chamber 3223 are arranged in sequence. The side wall 3213 includes a plurality of spacing walls 3218. The plurality of accommodating chambers 322 may be spaced apart from each other. For example, the first chamber 3221, the second chamber 3222, the third chamber 3223 and the fourth chamber 3224 are spaced apart from each other in sequence by the spacing walls 3218 (as illustrated in FIG. 30). Or, any two, three or more accommodating chambers 322 are communicated with each other. For example, the first chamber 3221 is communicated with the second chamber 3222, and the second chamber 3222 is spaced apart from the third chamber 3223.

The through hole 323 includes a first through hole 3231, a second through hole 3232, a third through hole 3233 and a fourth through hole 3234. The first through hole 3231, the second through hole 3232, the third through hole 3233 and the fourth through hole 3234 are communicated with the first chamber 3221, the second chamber 3222, the third chamber 3223 and the fourth chamber 3224, respectively. In other words, the first through hole 3231 is communicated with the first chamber 3221, the second through hole 3232 is communicated with the second chamber 3222, the third through hole 3233 is communicated with the third chamber 3223, and the fourth through hole 3234 is communicated with the fourth chamber 3224. In addition, the second through hole 3232 further corresponds to a sound outlet of the receiver 314. An aperture of the second through hole 3232 may be smaller than that of the sound outlet of the receiver 314. In this way, the receiver 314 may not pass through the second through hole 3232, and the sound wave emitted by the receiver 314 may pass through the second through hole 3232 and enter the outside. Centers of the first through hole 3231, the third through hole 3233 and the fourth through hole 3234 are arranged on a same straight line L. The second through hole 3232 is arranged between the straight line L and the bottom side wall 3215 (as illustrated in FIG. 26 and FIG. 28). After the infrared imaging module 313, the laser projection module 311 and the visible-light imaging module 312 are mounted in place, the infrared imaging module 313 extends through the first through hole 3231, the laser projection module 311 extends through the third through hole 3233, and the visible-light imaging module 312 extends through the fourth through hole 3234. Optical axes of the infrared imaging module 313, the laser projection module 311 and the visible-light imaging module 312 are arranged on the same plane, which facilitates cooperative operations of the infrared imaging module 313, the laser projection module 311 and the visible-light imaging module 312. Top surfaces of the infrared imaging module 313, the laser projection module 311 and the visible-light imaging module 312 extending out of the through hole 323 are also flush with each other. Specifically, a light incident surface of the infrared imaging module 313, a light emitting surface of the laser projection module 311 and a light incident surface of the visible-light imaging module 312 may be arranged on the same plane.

In the related art, a mobile phone is provided with a plurality of functional modules, and thus a plurality of brackets are needed to fix the plurality of functional modules to the mobile phone, respectively. Consequently, the plurality of brackets occupy a relatively large space in the mobile phone, which is not conducive to reducing the weight and thickness of the mobile phone.

To sum up, in the terminal 100 according to the embodiment of the present disclosure, as the bracket 32 is integrally formed, the plurality of input/output modules 31 may be mounted to the same bracket 32 and accommodated in the accommodating chamber 322. In this way, the mounting space in the terminal 100 is saved, which is conducive to reducing the weight and thickness of the terminal 100. In addition, relative positions of the plurality of input/output modules 31 mounted to the same bracket 32 will not be changed due to the movement of the bracket 32, and thus the plurality of input/output modules 31 can cooperatively operate better.

As illustrated in FIG. 26 and FIG. 28, in some embodiments, the top side wall 3214 has a notch 3216, the first face 3211 has a recess 3217, and the recess 3217 is communicated with the notch 3216. The input/output assembly 30 further includes an infrared fill light 35, a proximity sensor 36 and a light sensor 37. The infrared fill light 35 is used to emit infrared light to the outside, the proximity sensor 36 is used to detect a distance from the target object to the terminal 100, and the light sensor 37 is used to detect the intensity of ambient light. The proximity sensor 36 and the light sensor 37 may be integrated into one module. The infrared fill light 35, the proximity sensor 36 and the light sensor 37 are mounted in the recess 3217.

As illustrated in FIG. 28 and FIG. 29, in some embodiments, the input/output assembly 30 further includes a flexible circuit board 34. The receiver 314 includes an elastic connection piece 3141. The elastic connection piece 3141 protrudes along a direction from the first face 3211 to the second face 3212. The elastic connection piece 3141 abuts against the flexible circuit board 34 to electrically connect the receiver 314 to the flexible circuit board 34. Specifically, an end of the flexible circuit board 34 may be connected to the mainboard 20. The flexible circuit board 34 may has a contact 345. The elastic connection piece 3141 abuts against the contact 345 to electrically connect the receiver 314 to the flexible circuit board 34. In some embodiments, a plurality of sets of contacts 345 may be provided to the flexible circuit board 34. The elastic connection piece 3141 can electrically connect the receiver 314 to the mainboard 20 when it abuts against any set of contacts 345. In this way, as long as the sound outlet of the receiver 314 faces the second through hole 3232, the receiver 314 can be mounted in the second chamber 3222 at a plurality of angles, and the elastic connection piece 3141 can abut against the contacts 345.

As illustrated in FIG. 26 to FIG. 28, in some embodiments, the flexible circuit board 34 includes a first segment 341 and a second segment 342. The first segment 341 is pressed to the first face 3211 (when the first face 3211 is provided with the recess 3217, the first segment 341 is pressed to a bottom of the recess 3217) and the second segment 342 is pressed to the second face 3212. The elastic connection piece 3141 abuts against the second segment 342. The infrared fill light 35, the proximity sensor 36 and the light sensor 37 are mounted to the first segment 341.

In embodiments of the present disclosure, the flexible circuit board 34 further includes a connecting segment 343 connecting the first segment 341 to the second segment 342. The connecting segment 343 passes through the notch 3216. Specifically, the first segment 341 is accommodated in the recess 3217, and the second segment 342 extends from the connecting segment 343 along a direction from the top side wall 3142 to the bottom side wall 3145. In this way, the infrared fill light 35, the proximity sensor 36, the light sensor 37 and the receiver 314 may be connected via the flexible circuit board 34, and the overall structure of the input/output assembly 30 is relatively simple and compact.

As illustrated in FIG. 26 and FIG. 28, in some embodiments, the bracket 32 further includes a bracket positioning column 326 protruding from the bottom of the recess 3217, and the bracket positioning column 326 is arranged between the straight line L and the top side wall 3214. The bracket positioning column 326 may be used to position components, for example, the flexible circuit board 34, the infrared fill light 35, the proximity sensor 36, or the light sensor 37, mounted to the bracket 32, so as to prevent the components from shaking. More specifically, the bracket positioning column 326 passes through and fixes the first segment 341 of the flexible circuit board 34. Therefore, the infrared fill light 35, the proximity sensor 36 and the light sensor 37 disposed to the first segment 341 are also fixed. The center of the second chamber 3222 and the bracket positioning column 326 may be arranged on both sides of the straight line L, respectively. A plurality of bracket positioning columns 326 may be provided, and the plurality of bracket positioning columns 326 may be arranged at peripheries of the infrared fill light 35, the proximity sensor 36 and the light sensor 37, respectively, thereby further securing the components.

As illustrated in FIG. 27 and FIG. 29, in some embodiments, the bracket 32 further includes a bracket positioning block 327. The position of the bracket positioning block 327 corresponds to that of the second face 3212. Specifically, the bracket positioning block 327 protrudes from the second face 3212. The bracket positioning block 327 may be used to position the flexible circuit board 34 mounted to the bracket 32 so as to prevent the flexible circuit board 34 from shaking. Specifically, the bracket positioning block 327 passes through and fixes the second section 342 of the flexible circuit board 34.

As illustrated in FIG. 28 and FIG. 29, in some embodiments, the flexible circuit board 34 is provided with a flexible-board positioning hole 344, and the flexible-board positioning hole 344 is configured to restrict a mounting position of the flexible circuit board 34 to the bracket 32. Specifically, the flexible-board positioning hole 344 may be provided to any one or more of the first segment 341, the second segment 342 or the connecting segment 343. In embodiments illustrated in FIGS. 28 and 29, the flexible-board positioning hole 344 is provided to both the first segment 341 and the second segment 342. The positions of the flexible-board positioning holes 344 may correspond to that of the bracket positioning column 326 and that of the bracket positioning block 327, respectively. During the installation of the flexible circuit board 34, the first segment 341 is pressed to the first face 3211 (when the first face 3211 is provided with the recess 3217, the first segment 341 is pressed to the bottom of the recess 3217) and the bracket positioning column 326 is fitted in the flexible-board positioning hole 344, and the second segment 342 is pressed to the second face 3212 and the bracket positioning block 327 is fitted in the flexible-board positioning hole 344, so that the flexible circuit board 34 is less likely to shake.

Figure 31:
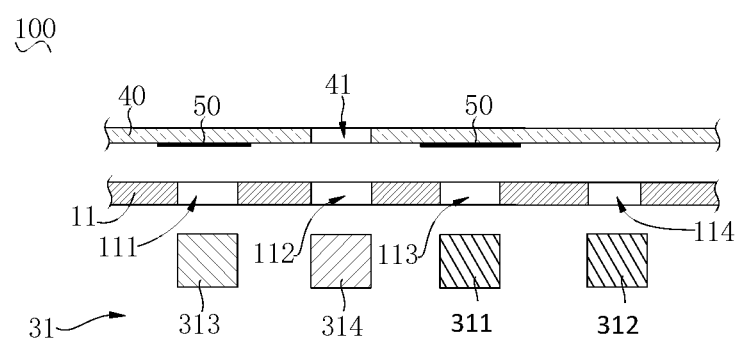
FIG. 31 is a partial schematic view of a terminal according to an embodiment of the present disclosure.

As illustrated in FIG. 25 and FIG. 31, in some embodiments, the terminal 100 further includes a cover plate 40. The cover plate 40 and the input/output module 31 are arranged to two sides facing away from each other of the front housing 11, respectively. The front housing 11 is provided with a first via hole 111, a second via hole 112, a third via hole 113 and a fourth via hole 114. The first via hole 111 corresponds to the infrared imaging module 313, the second via hole 112 corresponds to the receiver 314, the third via hole 113 corresponds to the laser projection module 311, and the fourth via hole 114 corresponds to the visible-light imaging module 312. The cover plate 40 is provided with an infrared transmission ink 50 at positions corresponding to the first via hole 111 and the third via hole 113, respectively. The cover plate 40 is provided with a sound output hole 41 corresponding to the second via hole 112.

Specifically, the cover plate 40 may be light transparent. The material of the cover plate 40 may be light-transparent glass, resin, plastic or the like. The cover plate 40 covers the first via hole 111, the second via hole 112, the third via hole 113 and the fourth via hole 114. The light outside passes through the cover plate 40 and then enters the infrared imaging module 313 through the first via hole 111. The sound wave emitted by the receiver 314 passes through the second via hole 112 and then through the sound output hole 41. The laser emitted by the laser projection module 311 passes through the cover plate 40 after passing through the third via hole 113. The light outside passes through the cover plate 40 and then enters the visible-light imaging module 312 through the fourth via hole 114. In the embodiment, the cover plate 40 is provided with the infrared transmission ink 50 at positions corresponding to the first via hole 111 and the third via hole 113, respectively. The infrared transmission ink 50 has a high transmissivity for infrared light, for example, a transmissivity of 85% or more, and a high attenuation ratio for visible light, for example, an attenuation ratio of 70% or more, so that it is difficult for the user in normal use to observe the area of the terminal 100 covered by the infrared transmission ink 50 in eyes. Therefore, the user cannot see an internal structure of the terminal 100 through the first via hole 111 and the third via hole 113 (i.e., it is difficult to see the infrared imaging module 313 and the laser projection module 311), thereby providing an aesthetic appearance to the terminal 100.

In the fifth embodiment of the present disclosure, as illustrated in FIG. 32 to FIG. 39, the input/output assembly 30 is mounted in the housing 10. The input/output assembly 30 includes an input/output module 31 and a bracket 32. The input/output module 31 is mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

In the embodiment of the present disclosure, the input/output module 31 includes an infrared imaging module 313, a visible-light imaging module 312 and a laser projection module 311. The laser projection module 311 may be used to project a laser patter to a target object outside the terminal 100. The laser may be infrared laser. The infrared imaging module 313 may be used to receive an infrared light signal outside to produce an infrared image. In some embodiments, the infrared imaging module 313 may receive the laser pattern emitted by the laser projection module 311 and reflected by the target object. The laser projection module 311 and the infrared imaging module 313 are used to obtain depth information of the target object together. The visible-light imaging module 312 may receive a visible light signal outside to produce a color image. The infrared imaging module 313, the visible-light imaging module 312 and the laser projection module 311 may be used to obtain a depth image of a target user together. A connector 33 may be provided to the input/output module 31 and inserted into a specific connector receptacle of the mainboard 20, so as to electrically and mechanically connect the input/output module 31 to the mainboard 20. Pulling the connector 33 out of the connector receptacle may separate the input/output module 31 from the mainboard 20 and break the electrical connection therebetween.

Figure 32:
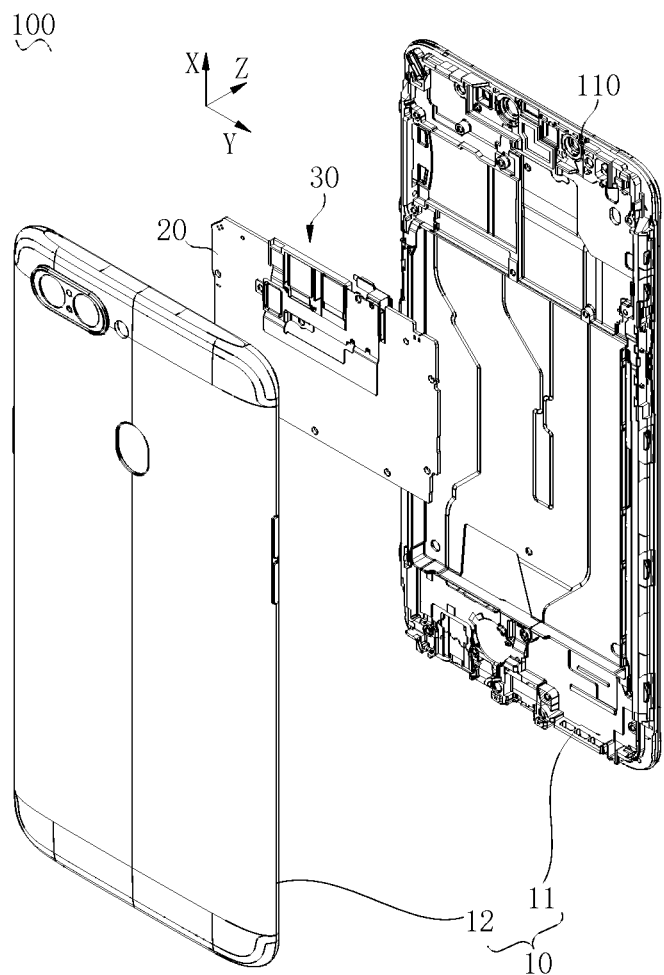
FIG. 32 is an exploded perspective view of a terminal according to some embodiments of the present disclosure.
Figure 33:
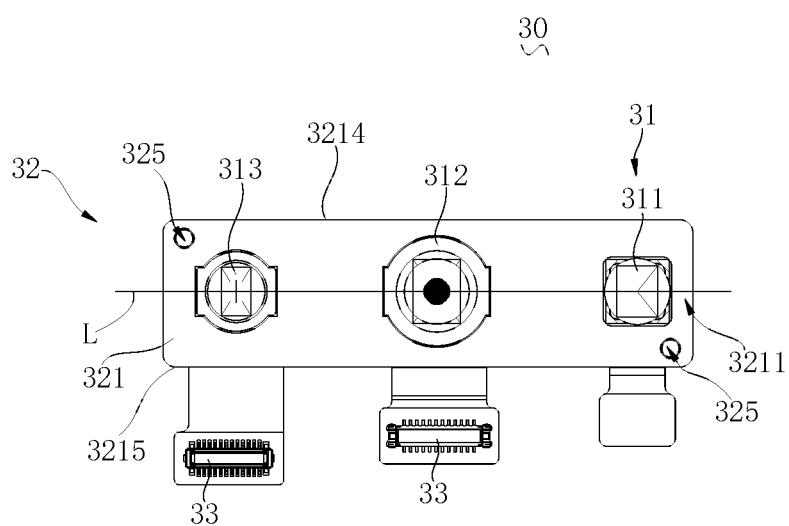
FIG. 33 and FIG. 34 are plan assembling views of an input/output assembly according to some embodiments of the present disclosure.
Figure 34:
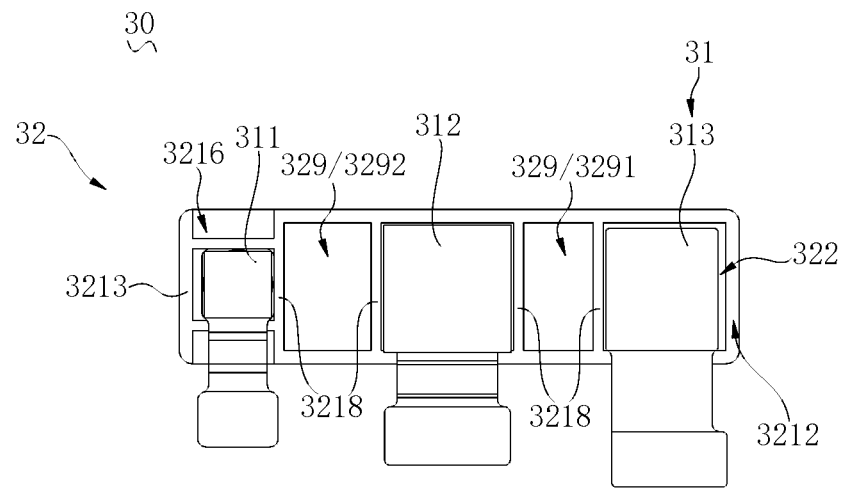

As illustrated in FIG. 32 to FIG. 34, the bracket 32 is integrally formed and configured for an arrangement of the input/output module 31. The bracket 32 includes a body 321.

The body 321 includes a first face 3211, a second face 3212 and a side wall 3213. The first face 3211 faces away from the second face 3212. The side wall 3213 connects the first face 3211 to the second face 3212. The side wall 3213 includes a top side wall 3214 and a bottom side wall 3215 facing away from each other. When the input/output assembly 30 is mounted in the housing 10, the front housing 11 may abut against the first face 3211 and the rear housing 12 may abut against the second face 3212 to clamp the bracket 32, such that the bracket 32 and the input/output module 31 may be prevented from moving in a thickness direction of the terminal 100 (direction Z as illustrated in FIG. 32). Moreover, the bracket 32 is mounted in a position corresponding to a mounting opening of the mainboard 20. The side wall 3213 of the bracket 32 may abut against an inner wall surrounding the mounting opening, so that the bracket 32 is caught in the mounting opening. In this way, simply securing the position of the mainboard 20 may prevent the bracket 32 and the input/output module 31 from moving in a width direction (direction Y as illustrated in FIG. 32) of the terminal 100.

Figure 35:
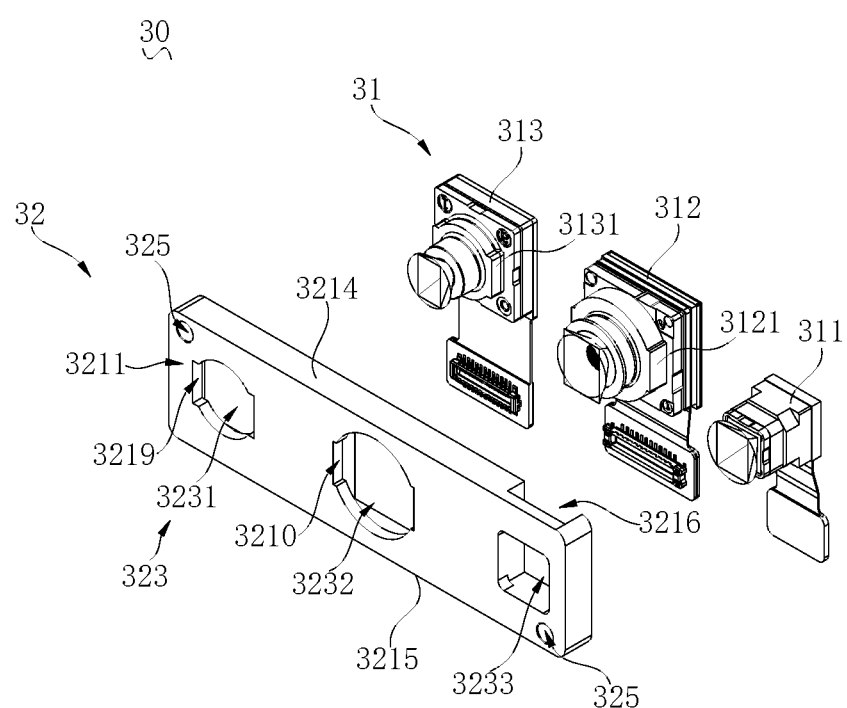
FIG. 35 and FIG. 36 are exploded perspective views of an input/output assembly according to some embodiments of the present disclosure.
Figure 36:
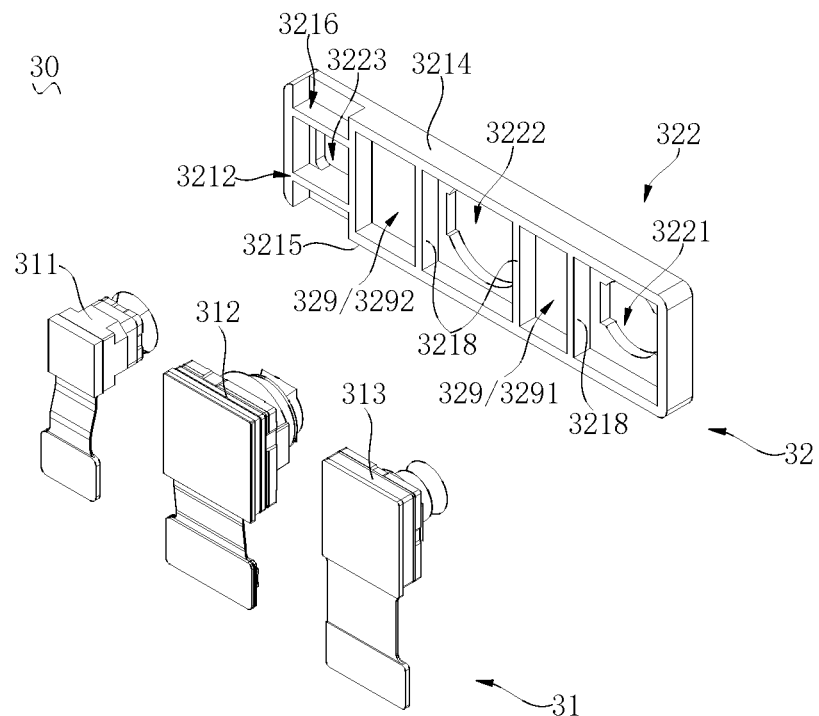

As illustrated in FIG. 35 and FIG. 36, the second face 312 is provided with an accommodating chamber 322. The accommodating chamber 322 is arranged between the top side wall 3214 and the bottom side wall 3215. The first face 3211 is provided with a through hole 323 corresponding to the accommodating chamber 322. The accommodating chamber 322 is configured to accommodate the input/output module 31 therein. A specific shape of the accommodating chamber 322 corresponds to that of the corresponding input/output module 31. The volume of the accommodating chamber 322 may be slightly larger than the input/output module 31, which facilitates dispensing glue into the accommodating chamber 322. Or, the volume of the accommodating chamber 322 may be slightly smaller than the input/output module 31, so that the input/output module 31 may be mounted in the accommodating chamber 322 through an interference fit. The specific number of the accommodating chamber 322 may be equal to that of the input/output module 31. When the input/output module 31 is mounted to the bracket 32, the input/output module 31 is exposed from the through hole 323. Specifically, the accommodating chamber 322 includes a first chamber 3221, a second chamber 3222 and a third chamber 3223 arranged in sequence. In a length direction of the bracket 32, it may be understood that the first chamber 3221, the second chamber 3222 and the third chamber 3223 are arranged in sequence from left to right, or it may be understood that the first chamber 3221, the second chamber 3222 and the third chamber 3223 are arranged in sequence from right to left. The first chamber 3221 is configured for an arrangement of the infrared imaging module 313, the second chamber 3222 is configured for an arrangement of the visible-light imaging module 312, and the third chamber 3223 is configured for an arrangement of the laser projection module 311. In other words, the infrared imaging module 313, the visible-light imaging module 312 and the laser projection module 311 may be mounted in the first chamber 3221, the second chamber 3222 and the third chamber 3223 in sequence, respectively. The plurality of accommodating chambers 322 may be spaced apart from each other. For example, the first chamber 3221, the second chamber 3222 and the third chamber 3223 are spaced apart from each other in sequence by spacing chambers 329 (as illustrated in FIG. 34). Or, any two, three or more accommodating chambers 322 are communicated with each other. For example, the first chamber 3221 is communicated with the second chamber 3222, and the second chamber 3222 is spaced apart from the third chamber 3223.

The through hole 323 includes a first through hole 3231, a second through hole 3232 and a third through hole 3233. The first through hole 3231, the second through hole 3232 and the third through hole 3233 are communicated with the first chamber 3221, the second chamber 3222 and the third chamber 3223, respectively. In other words, the first through hole 3231 is communicated with the first chamber 3221, the second through hole 3232 is communicated with the second chamber 3222, and the third through hole 3233 is communicated with the third chamber 3223. Centers of the first through hole 3231, the second through hole 3232 and the third through hole 3233 are arranged on the same straight line L (as illustrated in FIG. 33). After the infrared imaging module 313, the visible-light imaging module 312 and the laser projection module 311 are mounted in place, the infrared imaging module 313 is exposed from the first through hole 3231, the visible-light imaging module 312 is exposed from the second through hole 3232, and the laser projection module 311 is exposed from the third through hole 3233. Optical axes of the infrared imaging module 313, the visible-light imaging module 312 and the laser projection module 311 are arranged on the same plane, which facilitates cooperative operations of the infrared imaging module 313, the visible-light imaging module 312 and the laser projection module 311. Top surfaces of the infrared imaging module 313, the laser projection module 311 and the visible-light imaging module 312 are flush with each other. Specifically, a light incident surface of the infrared imaging module 313, a light emitting surface of the laser projection module 311 and a light incident surface of the visible-light imaging module 312 may be arranged on the same plane. In the embodiment of the present disclosure, "be exposed from" indicates that the input/output module 31 can be observed from the first face 3211 or the second face 3212. For example, the input/output module 31 may pass through the through hole 323 of the first face 3211 and thus be exposed out of the first face 3211. Or, the input/output module 31 may not pass through the through hole 323, but is visible from the through hole 323.

In the related art, the terminal usually projects a structured light to the target object by using the laser projection module, and then uses an image acquisition device (for example, an infrared camera) to collect laser modulated by the target object so as to obtain a depth image of the target object. Consequently, a plurality of functional modules need to operate with each other so that the terminal can obtain the depth image of the target object. However, when the position of a certain functional module is changed, this functional module cannot operate cooperatively, for example, the accuracy of the obtained depth image is low, for the reason that the relative positions between this functional module and the other functional modules are changed.

In conclusion, in the terminal 100 according to the embodiment of the present disclosure, as the bracket 32 is integrally formed, the infrared imaging module 313, the visible-light imaging module 312 and the laser projection module 311 are mounted to the same bracket 32, so that the relative positions of the infrared imaging module 313, the visible-light imaging module 312 and the laser projection module 311 will not be changed and thus they can operate cooperatively. In addition, a plurality of input/output modules 31 are accommodated in the accommodating chamber 322 of the bracket 32, such that there is no need to fix the plurality of input/output modules 31 by providing a plurality of brackets, thereby saving the mounting space in the terminal 100.

As illustrated in FIG. 34 and FIG. 36, in some embodiments, the second face 3212 is provided with a first spacing chamber 3291. The first spacing chamber 3291 spaces the first chamber 3221 apart from the second chamber 3222. Specifically, the body 321 further includes a plurality of spacing walls 3218. The top side wall 3214, the bottom side wall 3215 and the spacing walls 3218 define the spacing chamber 329. The spacing chamber 329 includes the first spacing chamber 3291. After the infrared imaging module 313 and the visible-light imaging module 312 are mounted to the bracket 32, the first spacing chamber 3291 spaces the infrared imaging module 313 apart from the visible-light imaging module 312.

Further, as illustrated in FIG. 34 and FIG. 36, in some embodiments, the second face 3212 is provided with a second spacing chamber 3292. The second spacing chamber 3292 spaces the second chamber 3222 apart from the third chamber 3223. Specifically, the body 321 further includes a plurality of spacing walls 3218. The top side wall 3214, the bottom side wall 3215 and the spacing walls 3218 define the spacing chamber 329. The spacing chamber 329 includes the second spacing chamber 3292. After the visible-light imaging module 312 and the laser projection module 311 are mounted to the bracket 32, the second spacing chamber 3292 spaces the visible-light imaging module 312 apart from the laser projection module 311.

Figure 37:
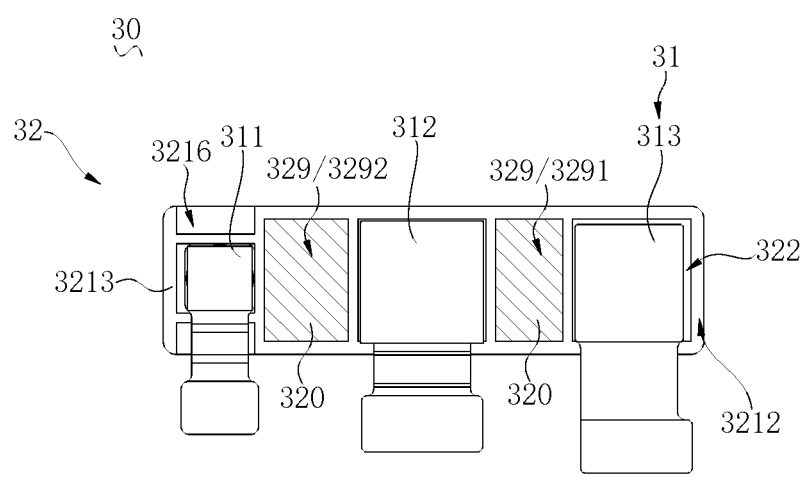
FIG. 37 is a plan assembling view of an input/output assembly according to some embodiments of the present disclosure.

As illustrated in FIG. 34 and FIG. 37, in some embodiments, the first spacing chamber 3291 and the second spacing chamber 3292 are provided with a heat dissipating material 320. Since the heat generated during the operation of the input/output module 31 is relatively concentrated, some optical components of the input/output module 31 may have a temperature drift, which will affect the accuracy of the input/output module 31. In addition, the service life of the input/output module 31 will be reduced, when the input/output module 31 is exposed to a high temperature environment for a long time. Providing the heat dissipating material 320 in the first spacing chamber 3291 and the second spacing chamber 3292 can dissipate heat of a single input/output module 31, and also relieve the mutual influence between two adjacent input/output modules 31 due to the heat generated thereby. In the embodiment, the heat dissipating material 320 may be a thermal conductive silicone grease, a thermal conductive metal (such as silver, copper, gold, etc.) or a ceramic material. When the heat dissipating material 320 is the thermal conductive silicone grease, the heat dissipating material 320 may be laid on the second face 3212 and surfaces of the spacing walls 3218. When the heat dissipating material 320 is the thermal conductive metal, the heat dissipating material 320 may be laid on the second face 3212 and surfaces of the spacing walls 3218 in a form of a single layer or a plurality of layers, for example, a silver layer and a copper layer laid alternately. When the heat dissipating material 320 is the ceramic material, the heat dissipating material 320 may fill the entire spacing chamber 329.

As illustrated in FIG. 35 and FIG. 36, in some embodiments, the bracket 32 is provided with a first positioning groove 3219 in a side wall surrounding the first through hole 3231 and the first positioning groove 3219 is configured to restrict a mounting position of the infrared imaging module 313. Specifically, the infrared imaging module 313 includes a first protruding part 3131 arranged at a periphery of a lens barrel. The position and number of the first positioning groove 3219 correspond to the position and number of the first protruding part 3131. One or more first protruding parts 3131 may be provided. In the embodiment, two first protruding parts 3131 are provided. The two first protruding parts 3131 are arranged at two sides facing away from each other of the periphery of the lens barrel of the infrared imaging module 313, respectively. Two first positioning grooves 3219 are also provided. The two first positioning grooves 3219 are provided in two opposite side walls surrounding the first through hole 3231, respectively. When the infrared imaging module 313 is mounted in the first chamber 3221 and exposed from the first through hole 3231, the first protruding part 3131 is engaged in the first positioning groove 3219 to indicate that the infrared imaging module 313 mounted in place.

As illustrated in FIG. 35 and FIG. 36, in some embodiments, the bracket 32 is provided with a second positioning groove 3210 in a side wall surrounding the second through hole 3232 and the second positioning groove 3210 is configured to restrict a mounting position of the visible-light imaging module 312. Specifically, the visible-light imaging module 312 includes a second protruding part 3121 arranged at a periphery of a lens barrel. The position and number of the second positioning groove 3210 correspond to the position and number of the second protruding part 3121. One or more second protruding parts 3121 may be provided. In the embodiment, two second protruding parts 3121 are provided. The two second protruding parts 3121 are arranged at two sides facing away from each other of the periphery of the lens barrel of the visible-light imaging module 312, respectively. Two second positioning grooves 3210 are also provided. The two second positioning grooves 3210 are provided in two opposite side walls surrounding the second through hole 3232, respectively. When the visible-light imaging module 312 is mounted in the second chamber 3222 and exposed from the second through hole 3232, the second protruding part 3121 is engaged in the second positioning groove 3210 to indicate that the visible-light imaging module 312 is mounted in place.

As illustrated in FIG. 34 and FIG. 36, in some embodiments, the top side wall 3214 has a notch 3216 in a position corresponding to the third chamber 3223. Since the third chamber 3223 is relatively small, the notch 3216 may be provided in the top side wall 3214 at a position corresponding to the third chamber 3223, so that when the laser projection module 311 of a relatively small volume is mounted, it is convenient for a glue to be dispensed into the third chamber 3223. As illustrated in FIG. 32, when the bracket 32 carried with the input/output module 31 is mounted to the housing 10, a protruding structure of the housing 10 extends into the notch 3216 to restrict the mounting position of the bracket 32.

As illustrated in FIG. 33 and FIG. 35, in some embodiments, the first face 3211 is provided with a bracket positioning hole 325, and the bracket positioning hole 325 is configured to restrict a mounting position of the bracket 32. Specifically, one or more bracket positioning holes 325 may be provided. In the embodiment, two bracket positioning holes 325 are provided, and the two bracket positioning holes 325 are arranged in diagonal portions of the body 321. Correspondingly, as illustrated in FIG. 32, the front housing 11 is provided with a front-housing positioning column 110 protruding therefrom. When the first face 3211 abuts against the front housing 11, the front-housing positioning column 110 extends into and is fitted with the bracket positioning hole 325. Therefore, the mounting position of the bracket 32 can be restricted quickly through the fit between the front-housing positioning column 110 and the bracket positioning hole 325, and the bracket 32 can be further prevented from shaking in the housing 10.

Figure 38:
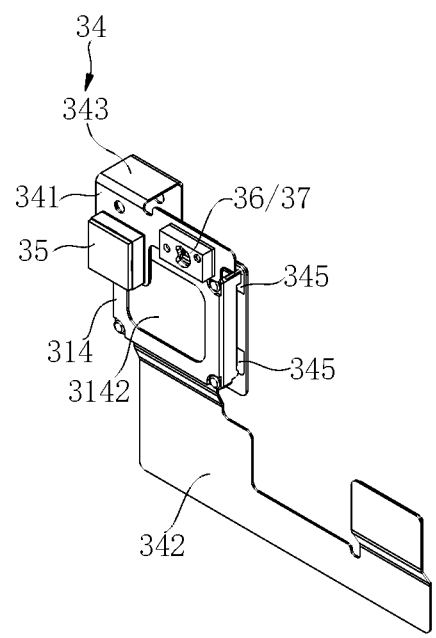
FIG. 38 is a perspective assembling view of a flexible circuit board, a receiver, an infrared fill light, a proximity sensor and a light sensor of a terminal according to an embodiment of the present disclosure.

As illustrated in FIG. 32 and FIG. 38, in some embodiments, the input/output assembly 30 further includes a receiver 314, an infrared fill light 35, a proximity sensor 36 and a light sensor 37. The terminal 100 further includes a flexible circuit board 34 mounted to the housing 10. The receiver 314, the infrared fill light 35, the proximity sensor 36 and the light sensor 37 are mounted to the flexible circuit board 34. Specifically, the receiver 314 emits a sound wave to the outside under the action of a driving signal to realize functions such as making a call. The infrared fill light 35 is used for emitting infrared light to the outside, the proximity sensor 36 is used for detecting a distance from the target object to the terminal 100, and the light sensor 37 is used for detecting the intensity of ambient light. The flexible circuit board 34 is fixed in the housing 10 under the clamping action of the front housing 11 and the rear housing 12. An end of the flexible circuit board 34 may be connected to the mainboard 20. The receiver 314, the infrared fill light 35, the proximity sensor 36 and the light sensor 37 are electrically connected to the mainboard 20 through the same flexible circuit board 34, so that the whole structure of the input/output assembly 30 is simple and compact.

As illustrated in FIG. 38, in some embodiments, the flexible circuit board 34 includes a first segment 341, a second segment 342 and a connecting segment 343. The connecting segment 343 connects the first segment 341 to the second segment 342. The first segment 341 is arranged parallel to the second segment 342. The infrared fill light 35, the proximity sensor 36 and the light sensor 37 are disposed to the first segment 341, and the receiver 314 is disposed to the second segment 342. The second segment 342 may be provided with a contact 345. The receiver 314 includes a sound outlet 3142 and an elastic connection piece (not illustrated) arranged on two sides facing away from each other of the receiver 314. The elastic connection piece protrudes along a direction running away from the sound outlet 3142 of the receiver 314. The elastic connection piece abuts against the contact 345 to electrically connect the receiver 314 to the flexible circuit board 34. In some embodiments, a plurality of sets of contacts 345 may be provided to the flexible circuit board 34. The elastic connection piece can electrically connect the receiver 314 to the mainboard 20 when the elastic connection piece abuts against any set of contacts 345.

As illustrated in FIG. 36 and FIG. 38, in some embodiments, the receiver 314, the infrared fill light 35, the proximity sensor 36 and the light sensor 37 are arranged on a side of the first chamber 3221 facing away from the second chamber 3222. It may be understood that the flexible circuit board 34 carried with the receiver 314, the infrared fill light 35, the proximity sensor 36 as well as the light sensor 37, the infrared imaging module 313, the visible-light module 312 and the laser projection module 311 are arranged in sequence along the length direction of the bracket 32. Or, the receiver 314, the infrared fill light 35, the proximity sensor 36 and the light sensor 37 are arranged on a side of the third chamber 3223 facing away from the second chamber 3222. In this case, the infrared imaging module 313, the visible-light module 312, the laser projection module 311 and the flexible circuit board 34 carried with the receiver 314, the infrared fill light 35, the proximity sensor 36 as well as the light sensor 37 are arranged in sequence along the length direction of the bracket 32.

Figure 39:
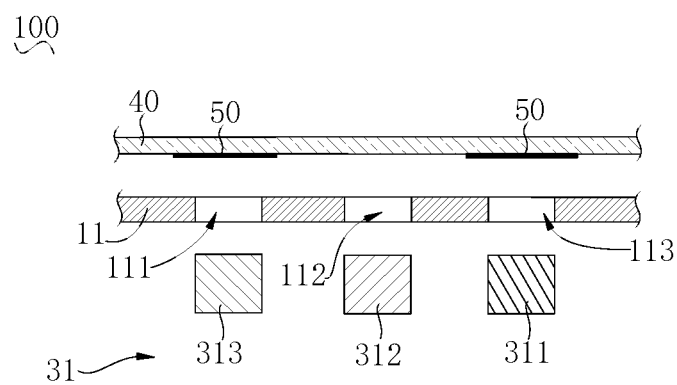
FIG. 39 is a partial schematic view of a terminal according to an embodiment of the present disclosure.

As illustrated in FIG. 32 and FIG. 39, in some embodiments, the terminal 100 further includes a cover plate 40. The cover plate 40 and the input/output module 31 are arranged to two sides facing away from each other of the front housing 11, respectively. The front housing 11 is provided with a first via hole 111, a second via hole 112 and a third via hole 113. The first via hole 111 corresponds to the infrared imaging module 313, the second via hole 112 corresponds to the visible-light imaging module 312, and the third via hole 113 corresponds to the laser projection module 311. The cover plate 40 is provided with an infrared transmission ink 50 at positions corresponding to the first via hole 111 and the third via hole 113, respectively.

Specifically, the cover plate 40 may be light transparent. The material of the cover plate 40 may be light-transparent glass, resin, plastic or the like. The cover plate 40 covers the first via hole 111, the second via hole 112 and the third via hole 113. The light outside passes through the cover plate 40 and then enters the infrared imaging module 313 through the first via hole 111. The light outside passes through the cover plate 40 and then enters the visible-light imaging module 312 through the second via hole 112. The laser emitted by the laser projection module 311 passes through the cover plate 40 after passing through the third via hole 113. In the embodiment, the cover plate 40 is provided with the infrared transmission ink 50 at positions corresponding to the first via hole 111 and the third via hole 113, respectively. The infrared transmission ink 50 has a high transmissivity for infrared light, for example, a transmissivity of 85% or more, and a high attenuation ratio for visible light, for example, an attenuation ratio of 70% or more, so that it is difficult for the user in normal use to observe the area of the terminal 100 covered by the infrared transmission ink 50 in eyes. Therefore, the user cannot see an internal structure of the terminal 100 through the first via hole 111 and the third via hole 113 (i.e., it is difficult to see the infrared imaging module 313 and the laser projection module 311), thereby providing an aesthetic appearance to the terminal 100.

In the sixth embodiment of the present disclosure, as illustrated in FIG. 40 to FIG. 45, the terminal 100 includes a housing 10, a mainboard 20 and an input/output assembly 30. The terminal 100 may be a mobile phone, a tablet computer, a laptop, a game console, a head mounted display, an entrance system, an automatic teller machine and so on. In embodiments of the present disclosure, a mobile phone is taken as an example to illustrate the terminal 100. It may be understood that the terminal 100 may have other specific forms and is not limited herein.

Figure 40:
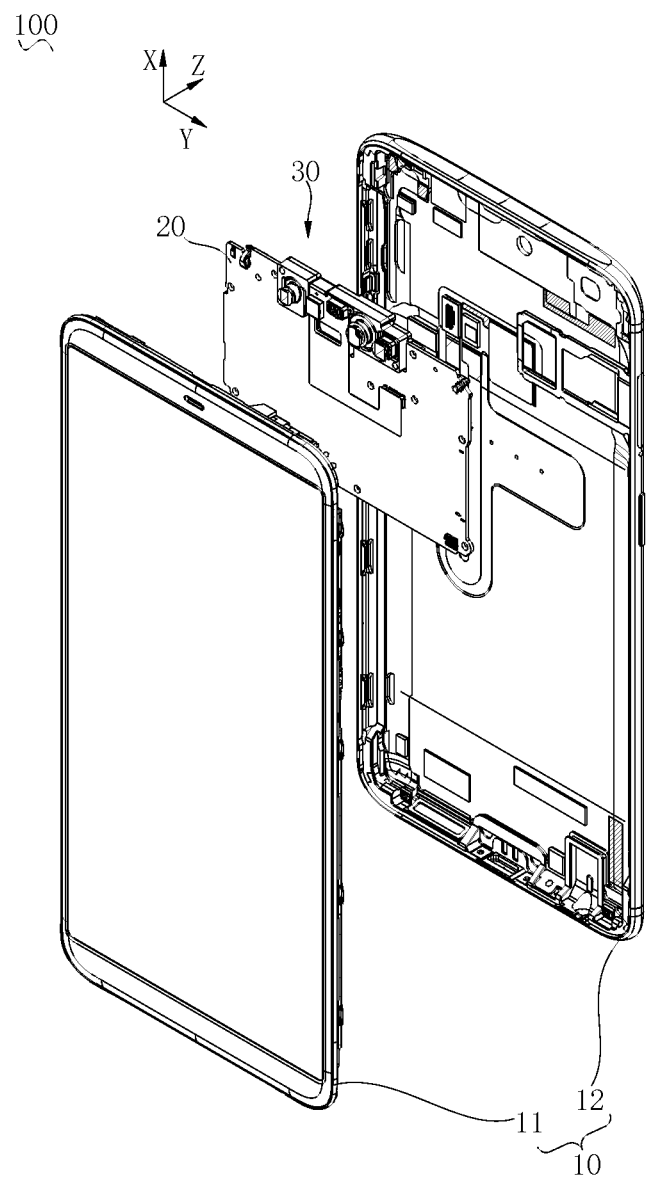
FIG. 40 is an exploded perspective view of a terminal according to some embodiments of the present disclosure.

As illustrated in FIG. 40, the housing 10 may serve as a carrier to which the mainboard 20 and the input/output assembly 30 are mounted. The housing 10 may provide protections against dust, water and drops for the mainboard 20 and the input/output assembly 30. Components like a display screen and a battery may also be mounted to the housing 10. The housing 10 includes a front housing 11 and a rear housing 12. The front housing 11 and the rear housing 12 are joined together, and the mainboard 20 and the input/output assembly 30 are accommodated between the front housing 11 and the rear housing 12. The front housing 11 and the rear housing 12 may be made of stainless steel, aluminum alloy and plastics.

Figure 41:
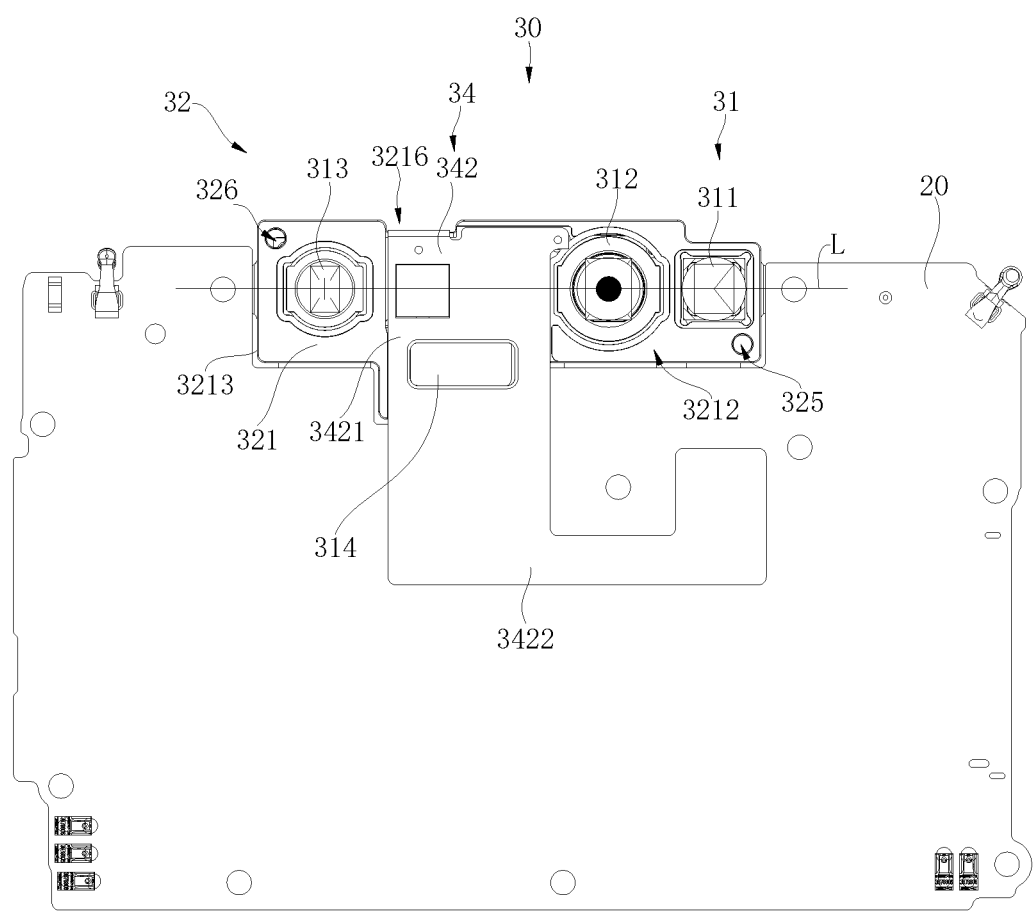
FIG. 41 and FIG. 42 are plan assembling views of an input/output assembly according to some embodiments of the present disclosure.
Figure 42:
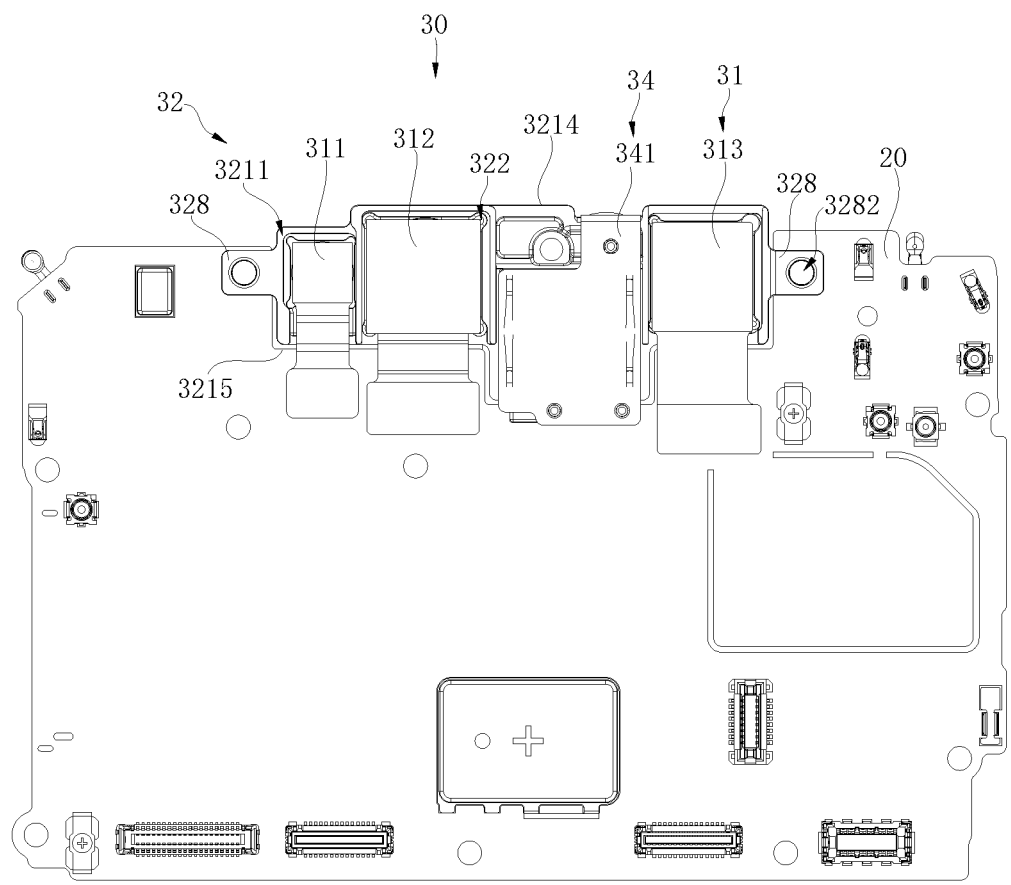

As illustrated in FIG. 40 to FIG. 42, the mainboard 20 is fixed in the housing 10. Specifically, the mainboard 20 may be fixed to the front housing 11 or the rear housing 12 through screwing or engagement. The mainboard 20 may be connected to a flexible circuit board 34 and each input/output module 31 of the input/output assembly 30. The mainboard 20 may further be connected to a processing chip, a control chip or the like of the terminal 100. A circuit arranged on the mainboard 20 may be used for transmitting electrical signals. The mainboard 20 has a mounting opening 21 (as illustrated in FIG. 43), and the mounting opening 21 is configured to be passed through by the input/output assembly 30, so that space occupied by the mainboard 20 and the input/output assembly 30 when mounted in the housing 10 is reduced.

As illustrated in FIG. 40 to FIG. 42, the input/output assembly 30 is mounted in the housing 10. The input/output assembly 30 includes an input/output module 31, a bracket 32 and a flexible circuit board 34. The input/output module 31 and the flexible circuit board 34 are mounted to the bracket 32.

The input/output module 31 may send a signal to or receive a signal from outside, or have the function of sending a signal to and also receiving a signal from the outside. The signal may be a light signal, a sound signal, a touch signal or the like. It may be understood that the specific type of the input/output module 31 and the number of each input/output module 31 may vary according to different functional requirements of the terminal 100.

Figure 43:
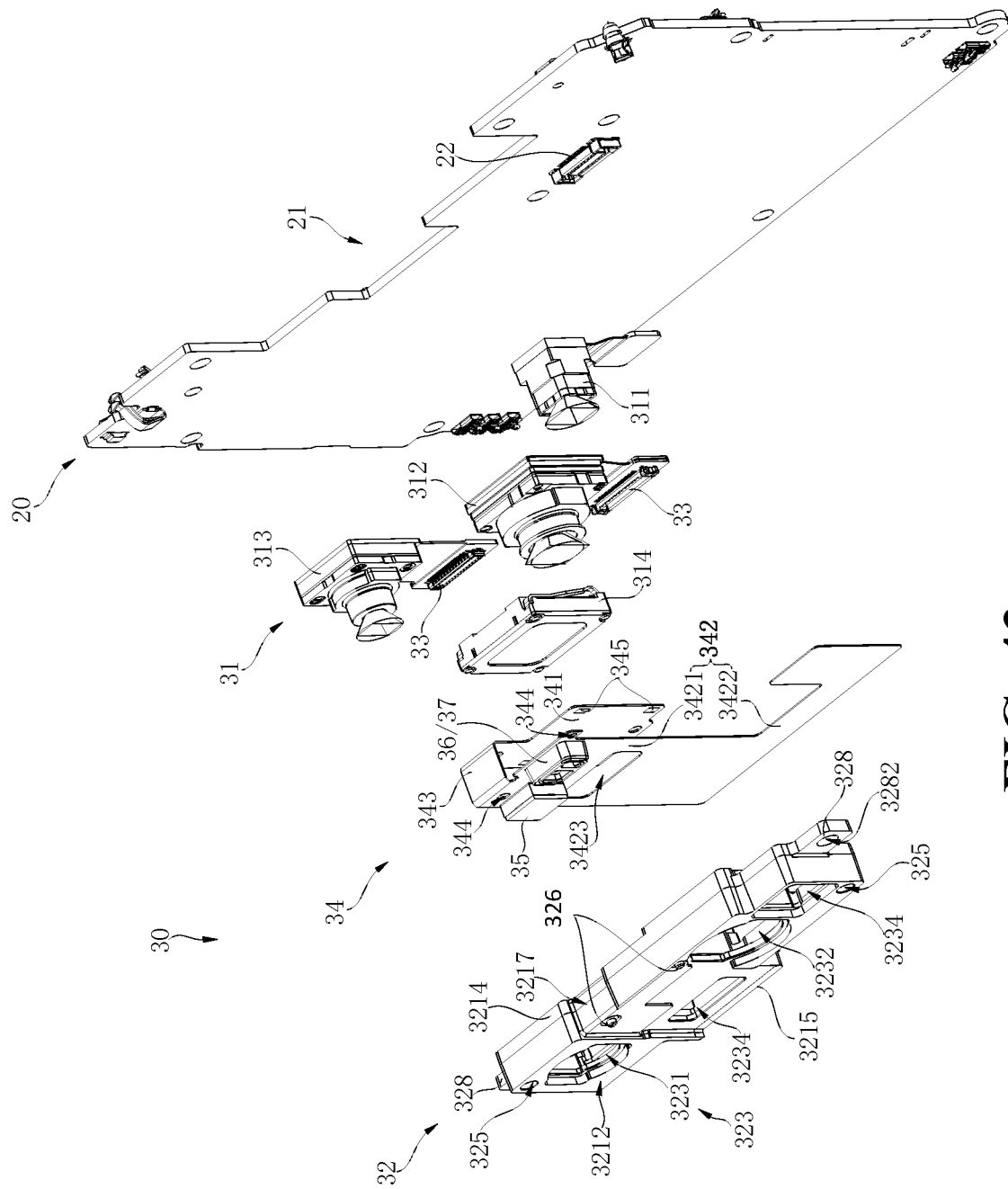
FIG. 43 and FIG. 44 are exploded perspective views of an input/output assembly according to some embodiments of the present disclosure.
Figure 44:
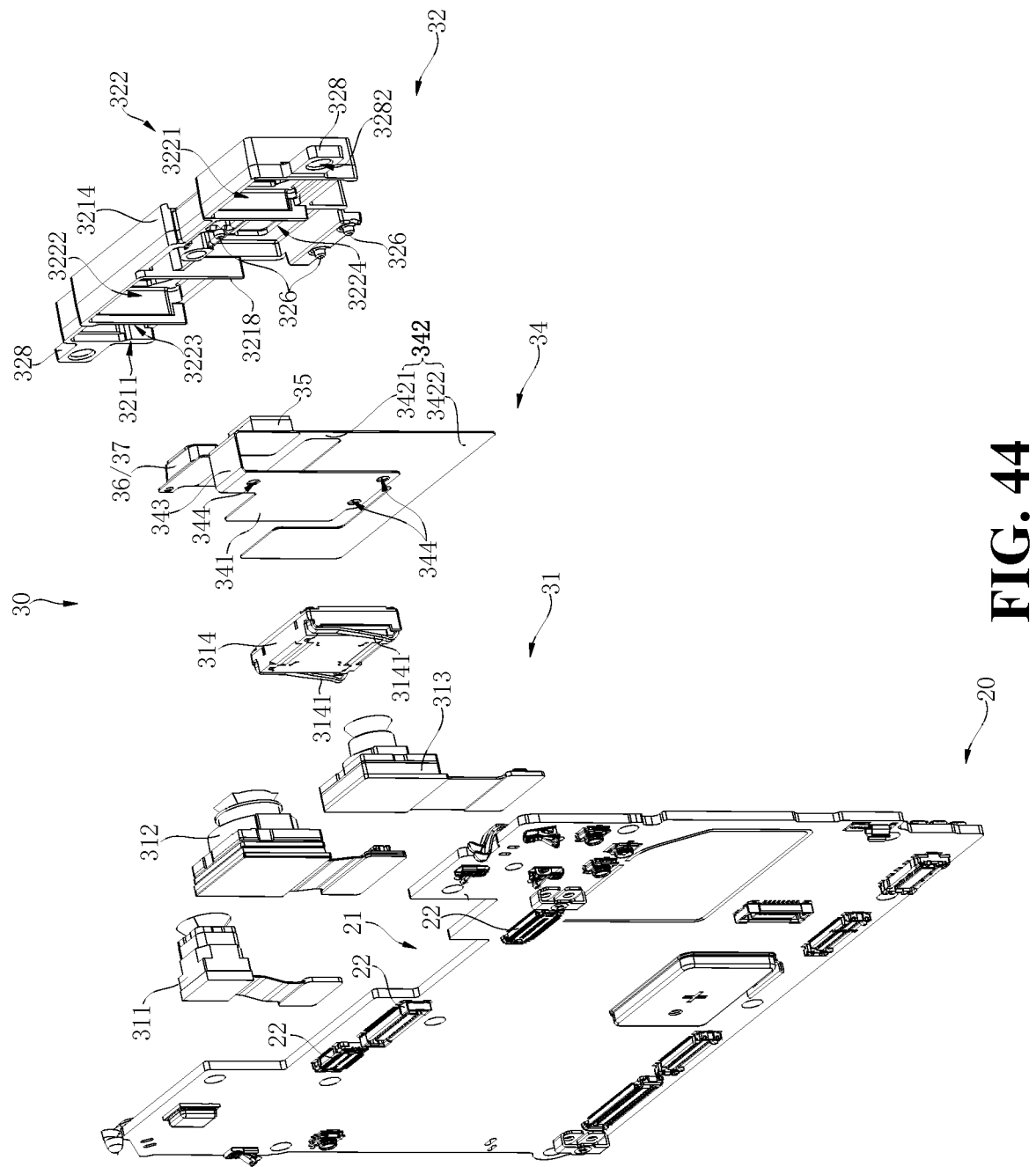

As illustrated in FIG. 43 and FIG. 44, in the embodiment of the present disclosure, the input/output module 31 includes an infrared imaging module 313, a visible-light imaging module 312, a laser projection module 311 and a receiver 314. The laser projection module 311 may be used to project a laser patter to a target object outside the terminal 100. The laser may be infrared laser. The infrared imaging module 313 may be used to receive an infrared light signal outside to produce an infrared image. In some embodiments, the infrared imaging module 313 may receive the laser pattern emitted by the laser projection module 311 and reflected by the target object. The laser projection module 311 and the infrared imaging module 313 are used to obtain depth information of the target object together. The visible-light imaging module 312 may receive a visible light signal outside to produce a color image. The infrared imaging module 313, the visible-light imaging module 312 and the laser projection module 311 may be used to obtain a depth image of the target user together. A connector 33 may be provided to the input/output module 31 and inserted into a specific connector receptacle 22 (as illustrated in FIGS. 43 and 44) of the mainboard 20, so as to electrically and mechanically connect the input/output module 31 to the mainboard 20. Pulling the connector 33 out of the connector receptacle 22 may separate the input/output module 31 from the mainboard 20 and break the electrical connection therebetween. The receiver 314 emits a sound wave to the outside under the action of a driving signal so as to realize functions such as making a call.

As illustrated in FIG. 40 to FIG. 42, the bracket 32 is integrally formed. Each input/output module 31 is fixed to the bracket 32. The bracket 32 includes a body 321.

The body 321 includes a first face 3211, a second face 3212 and a side wall 3213. The first face 3211 faces away from the second face 3212. The side wall 3213 connects the first face 3211 to the second face 3212. The side wall 3213 includes a top side wall 3214 and a bottom side wall 3215 facing away from each other. When the input/output assembly 30 is mounted in the housing 10, the front housing 11 may abut against the second face 3212 and the rear housing 12 may abut against the first face 3211 to clamp the bracket 32, such that the input/output assembly 30 may be prevented from moving in a thickness direction of the terminal 100 (direction Z as illustrated in FIG. 40). Moreover, the bracket 32 is mounted in a position corresponding to the mounting opening 21 of the mainboard 20. The side wall 3213 of the bracket 32 may abut against an inner wall surrounding the mounting opening 21, so that the bracket 32 is caught in the mounting opening 21. In this way, simply securing the position of the mainboard 20 may prevent the input/output assembly 30 from moving in a width direction (direction Y as illustrated in FIG. 40) of the terminal 100.

As illustrated in FIG. 43 and FIG. 44, the first face 3211 is provided with an accommodating chamber 322. The second face 3212 is provided with a through hole 323 communicated with the accommodating chamber 322. The accommodating chamber 322 is arranged between the top side wall 3214 and the bottom side wall 3215. The accommodating chamber 322 is configured to accommodate the input/output module 31 therein. A specific shape of the accommodating chamber 322 corresponds to that of the corresponding input/output module 31. The volume of the accommodating chamber 322 may be slightly larger than that of the input/output module 31, which facilitates dispensing glue into the accommodating chamber 322. Or, the volume of the accommodating chamber 322 may be slightly smaller than the input/output module 31, so that the input/output module 31 may be mounted in the accommodating chamber 322 through an interference fit. The specific number of the accommodating chamber 322 may be equal to that of the input/output module 31. When the input/output module 31 is mounted to the bracket 32, the input/output module 31 is exposed from the through hole 323. In the embodiment of the present disclosure, "be exposed from" indicates that the input/output module 31 can be observed from the first face 3211 or the second face 3212. For example, the input/output module 31 may pass through the through hole 323 of the second face 3212 and thus be exposed out of the second face 3212. Or, the input/output module 31 may not pass through the through hole 323, but is visible from the through hole 323.

The accommodating chamber 322 includes a first chamber 3221, a second chamber 3222, a third chamber 3223 and a fourth chamber 3224. The fourth chamber 3224 is arranged between the first chamber 3221 and the second chamber 3222. The first chamber 3221 is configured for an arrangement of the infrared imaging module 313, the second chamber 3222 is configured for an arrangement of the visible-light imaging module 312, the third chamber 3223 is configured for an arrangement of the laser projection module 311, and the fourth chamber 3224 is configured for an arrangement of the receiver 314. In other words, the infrared imaging module 313, the receiver 314, the visible-light imaging module 312 and the laser projection module 311 are mounted in the first chamber 3221, the fourth chamber 3224, the second chamber 3222 and the third chamber 3223 in sequence. In some embodiments, the first chamber 3221, the fourth chamber 3224, the second chamber 3222 and the third chamber 3223 are arranged in sequence. In a length direction of the bracket 32, it may be understood that the first chamber 3221, the fourth chamber 3224, the second chamber 3222 and the third chamber 3223 are arranged in sequence from left to right. Or, it may be understood that the first chamber 3221, the fourth chamber 3224, the second chamber 3222 and the third chamber 3223 are arranged in sequence from right to left. The side wall 3213 includes a spacing wall 3218 (as illustrated in FIG. 44). The plurality of accommodating chambers 322 may be spaced apart from each other. For example, the first chamber 3221, the fourth chamber 3224, the second chamber 3222 and the third chamber 3223 may be spaced apart from each other in sequence by the spacing wall 3218. Or, any two or three accommodating chambers 322 are communicated with each other. For example, the first chamber 3221 is communicated with the fourth chamber 3224, and the second chamber 3222 is spaced apart from the third chamber 3223.

The through hole 323 includes a first through hole 3231, a second through hole 3232, a third through hole 3233 and a sound output through hole 3234. The first through hole 3231, the second through hole 3232, the third through hole 3233 and the sound output through hole 3234 are communicated with the first chamber 3221, the second chamber 3222, the third chamber 3223 and the fourth chamber 3224, respectively. In other words, the first through hole 3231 is communicated with the first chamber 3221, the second through hole 3232 is communicated with the second chamber 3222, the third through hole 3233 is communicated with the third chamber 3223, and the sound output through hole 3234 is communicated with the fourth chamber 3224. In addition, the sound output through hole 3234 faces a sound outlet of the receiver 314. An aperture of the sound output through hole 3234 may be smaller than that of the sound outlet of the receiver 314. In this way, the receiver 314 may not pass through the sound output through hole 3234, and a sound wave emitted by the receiver 314 may pass through the sound output through hole 3234 and enter the outside. Centers of the first through hole 3231, the second through hole 3232 and the third through hole 3233 are arranged on a same straight line L (as illustrated in FIG. 41). The sound output through hole 3234 is arranged between the straight line L and the bottom side wall 3215. A center of the fourth chamber 3224 is arranged between the straight line L and the bottom side surface 3215. After the infrared imaging module 313, the visible-light imaging module 312 and the laser projection module 311 are mounted in place, the infrared imaging module 313 extends through the first through hole 3231, the visible-light imaging module 312 extends through the second through hole 3232, and the laser projection module 311 extends through the third through hole 3233. Optical axes of the infrared imaging module 313, the visible-light imaging module 312 and the laser projection module 311 are arranged on the same plane, which facilitates cooperative operations of the infrared imaging module 313, the visible-light imaging module 312 and the laser projection module 311. Top surfaces of the infrared imaging module 313, the visible-light imaging module 312 and the laser projection module 311 extending out of the through hole 323 are also flush with each other. Specifically, a light incident surface of the infrared imaging module 313, a light incident surface of the visible-light imaging module 312 and a light emitting surface of the laser projection module 311 may be arranged on the same plane.

As illustrated in FIG. 43 and FIG. 44, the flexible circuit board 34 is mounted to the bracket 32. The flexible circuit board 34 may be a printed circuit board, a flexible circuit board or a rigid-flex board. The flexible circuit board 34 includes a first segment 341, a second segment 342 and a connecting segment 343 connecting the first segment 341 to the second segment 342.

The first segment 341 is joined to the first face 3211 and electrically connected to the input/output module 31. The first segment 341 may be bonded to the first face 3211 by gluing. In some embodiments, the first segment 341 may be tightly pressed to the first face 3211 by the rear housing 12. The receiver 314 is electrically connected to the first segment 341. The shape of the first segment 341 corresponds to that of the receiver 314. Specifically, the first segment 341 may be provided with a contact 345 (as illustrated in FIG. 43). The receiver 314 includes an elastic connection piece 3141 protruding along a direction from the second face 3212 to the first face 3211 (as illustrated in FIG. 44). The elastic connection piece 3141 abuts against the contact 345 on the first segment 341 to electrically connect the receiver 314 to the flexible circuit board 34. In some embodiments, a plurality of sets of contacts 345 may be provided to the first segment 341. The elastic connection piece 3141 can electrically connect the receiver 314 to the mainboard 20 through abutting against any set of contact 345.

The second segment 342 includes a joining part 3421 and a connecting part 3422. The joining part 3421 is joined to the second face 3212, and the connecting part 3422 is spaced apart from the second face 3212 and configured to be electrically connected to an external device. The joining part 3421 may be bonded to the second face 3212 by gluing. In some embodiments, the joining part 3421 may be tightly pressed to the second face 3212 by the front housing 11. The joining part 3421 is provided with a sound outgoing hole 3423 corresponding to the sound output through hole 3234 (as illustrated in FIG. 43). In this case, the receiver 314 may not pass through the sound output through hole 3234, and the sound wave emitted by the receiver 314 may pass through the sound output through hole 3234 and the sound outgoing hole 3423 and then enter the outside.

The connecting part 3422 extends in a direction running away from the body 321 to be electrically connected to the external device. In the embodiment illustrated in FIG. 40, the external device is the mainboard 20. The mainboard 20 is provided with the connector receptacle 22 on a surface thereof. The connecting part 3422 extends towards the connector 33 and is electrically and mechanically connected to the connector receptacle 22.

The connecting segment 343 is pressed to the top side wall 3214. Specifically, the top side wall 3214 has a notch 3216, and the connecting segment 343 passes through the notch 3216. The first segment 341 and the second segment 342 are arranged on two sides facing away from each other of the bracket 32, respectively. Certainly, the flexible circuit board 34 may be electrically connected to other input/output modules 31. For instance, the flexible circuit board 34 is electrically connected to any one or more of the infrared imaging module 313, the visible-light imaging module 312 and the laser projection module 311, and electrically connects the input/output module 31 to the external device.

In the mobile phone, the bracket is usually adopted to fix components (for example, an infrared camera, a laser projector, a receiver, etc.). However, the bracket is spaced apart from the mainboard, and thus it is not convenient for the components mounted to the bracket to be connected to the mainboard.

In summary, in the input/output assembly 30 and the terminal 100 according to embodiments of the present disclosure, the first segment 341 and the second segment 342 of the flexible circuit board 34 are electrically connected to the input/output module 31, the first segment 341 and the joining part 3421 of the second segment 342 are mounted to the bracket 32, and the connecting part 3422 of the second segment 342 is electrically connected to the mainboard 20, such that the input/output module 31 is connected to the mainboard 20.

As illustrated in FIG. 43 and FIG. 44, in some embodiments, the input/output assembly 30 further includes an infrared fill light 35, a proximity sensor 36 and a light sensor 37. The infrared fill light 35 is used to emit infrared light to the outside, the proximity sensor 36 is used to detect a distance from the target object to the terminal 100, and the light sensor 37 is used to detect the intensity of ambient light. The proximity sensor 36 and the light sensor 37 may be integrated into one module. The infrared fill light 35, the proximity sensor 36 and the light sensor 37 are connected to the second segment 342. Specifically, the infrared fill light 35, the proximity sensor 36 and the light sensor 37 are connected to the joining part 3421 and arranged between the connecting segment 343 and the sound outgoing hole 3423, thereby fixing the infrared fill light 35, the proximity sensor 36 and the light sensor 37 to the bracket in a better manner.

As illustrated in FIG. 43 and FIG. 44, in some embodiments, the bracket 32 is provided with a bracket positioning column 326 protruding from the first face 3211 and/or the second face 3212, the flexible circuit board 34 is provided with a flexible-board positioning hole 344, and the bracket positioning column 326 extends into the flexible-board positioning hole 344. The position of the bracket positioning column 326 corresponds to that of the fourth chamber 3224. The bracket positioning column 326 is fitted in the flexible-board positioning hole 344 to restrict the mounting position of the flexible circuit board 34 to the bracket 32. Specifically, the bracket positioning column 326 may be arranged on either the first face 3211 or the second face 3212, or may be arranged on both the first face 3211 and the second face 3212. The number and position of the flexible-board positioning hole 344 correspond to the number and position of the bracket positioning column 326. For example, the flexible-board positioning hole 344 may be provided in either the first segment 341 or the second segment 342, or may be provided in both the first segment 341 and the second segment 342.

More specifically, the position of the bracket positioning column 326 arranged on the first face 3211 corresponds to the position of the fourth chamber 3224. The bracket positioning column 326 may be configured to position the first segment 341 mounted to the bracket 32 so as to prevent the first segment 341 from shaking. Specifically, the bracket positioning column 326 runs through the flexible-board positioning hole 344 of the first segment 341 and fixes the first segment 341.

The bracket positioning column 326 arranged on the second face 3212 is arranged between the top side wall 3214 and the bottom side wall 3215. Consequently, the bracket positioning column 326 may be configured to position components, for example, the joining part 3421, the infrared fill light 35, the proximity sensor 36 or the light sensor 37, mounted to the bracket 32, so as to prevent the components from shaking. The bracket positioning column 326 runs through the flexible-board positioning hole 344 of the joining part 3421 and fixes the second segment 342. Consequently, the infrared fill light 35, the proximity sensor 36 and the light sensor 37 arranged on the second segment 342 are also fixed. The center of the fourth chamber 3224 and the bracket positioning column 326 may be arranged on both sides of the straight line L, respectively.

As illustrated in FIG. 42 to FIG. 44, in some embodiments, the bracket 32 further includes a fixing protrusion 328 protruding outwards from the side wall 3213. The fixing protrusion 328 is configured to fix the bracket 32. One or more fixing protrusions 328 may be provided. When a plurality of fixing protrusions 328 are provided, the plurality of fixing protrusions 328 may protrude from two facing away from each other of the side walls 3213. Specifically, the fixing protrusion 328 may be directly fixed to the housing 10 by a fastener, or the bracket 32 and the mainboard 20 may be together fixed to the housing 10 by the fastener. In embodiments illustrated in FIG. 40 and FIG. 42, the fixing protrusion 328 is provided with a fixing hole 3282, and the mainboard 20 and the front housing 11 each are provided with a mounting hole at a position corresponding to the fixing hole 3282, so that the bracket 32 and the mainboard 20 may be fixed to the front housing 11 by the fastener (for example, a screw) passing through the fixing hole 3282 and the mounting hole. Fixing the bracket 32 through the fixing protrusion 328 may further improve the stability of the bracket 32 mounted in the housing 10.

As illustrated in FIG. 41 and FIG. 43, in some embodiments, the second face 3212 is provided with a bracket positioning hole 325, and the bracket positioning hole 325 is configured to restrict the mounting position of the bracket 32. Specifically, one or more bracket positioning holes 325 may be provided. In the embodiment, two bracket positioning holes 325 are provided, and the two bracket positioning holes 325 are arranged in diagonal portions of the body 321. Correspondingly, the front housing 11 may be provided with a front-housing positioning column (not illustrated) protruding from the front housing 11. When the second face 3212 abuts against the front housing 11, the front-housing positioning column extends into and is fitted with the bracket positioning holes 325. Therefore, the mounting position of the bracket 32 can be restricted quickly through the fit between the front-housing positioning column and the bracket positioning hole 325, and the bracket 32 can be further prevented from shaking in the housing 10.

Figure 45:
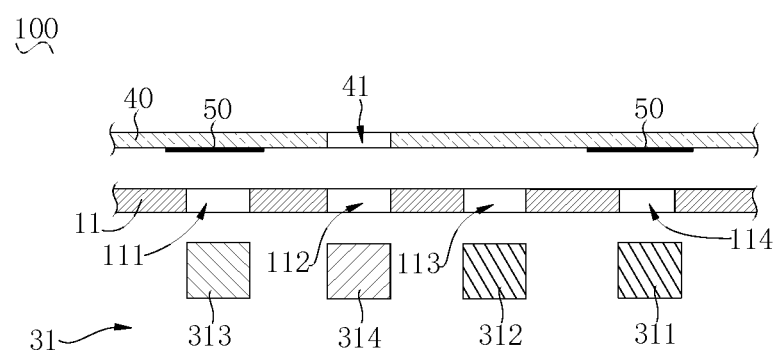
FIG. 45 is a partial schematic view of a terminal according to an embodiment of the present disclosure.

As illustrated in FIG. 40 and FIG. 45, in some embodiments, the terminal 100 further includes a cover plate 40. The cover plate 40 and the input/output module 31 are arranged to two sides facing away from each other of the front housing 11, respectively. The front housing 11 is provided with a first via hole 111, a second via hole 112, a third via hole 113 and a fourth via hole 114. The first via hole 111 corresponds to the infrared imaging module 313, the second via hole 112 corresponds to the receiver 314, the third via hole 113 corresponds to the visible-light imaging module 312, and the fourth via hole 114 corresponds to the laser projection module 311. The cover plate 40 is provided with an infrared transmission ink 50 at positions corresponding to the first via hole 111 and the fourth via hole 114, respectively. The cover plate 40 is provided with a sound output hole 41 corresponding to the second via hole 112.

Specifically, the cover plate 40 may be light transparent. The material of the cover plate 40 may be light-transparent glass, resin, plastic or the like. The cover plate 40 covers the first via hole 111, the second via hole 112, the third via hole 113 and the fourth via hole 114. The light outside passes through the cover plate 40 and then enters the infrared imaging module 313 through the first via hole 111. The sound wave emitted by the receiver 314 passes through the second via hole 112 and then through the sound output hole 41. The light outside passes through the cover plate 40 and then enters the visible-light imaging module 312 through the third via hole 113. The laser emitted by the laser projection module 311 passes through the cover plate 40 after passing through the fourth via hole 114. In the embodiment, the cover plate 40 is provided with the infrared transmission ink 50 at positions corresponding to the first via hole 111 and the fourth via hole 114, respectively. The infrared transmission ink 50 has a high transmissivity for infrared light, for example, a transmissivity of 85% or more, and a high attenuation ratio for visible light, for example, an attenuation ratio of 70% or more, so that it is difficult for the user in normal use to observe the area of the terminal 100 covered by the infrared transmission ink 50 in eyes. Therefore, the user cannot see the internal structure of the terminal 100 through the first via hole 111 and the fourth via hole 114 (i.e., it is difficult to see the infrared imaging module 313 and the laser projection module 311), thereby providing an aesthetic appearance to the terminal 100.

Reference throughout this specification to "some embodiments", "an embodiment", "an exemplary embodiment", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples.

In addition, terms "first" and "second" are merely used to describe an objective, and cannot be construed as indicating or implying relative importance or implicitly indicating a quantity of indicated technical features. Therefore, features that are limited by using "first" and "second" can expressly indicate or implicitly include at least one feature. In the descriptions of the present disclosure, unless otherwise noted, "more" means at least two, for example, two or three.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from the scope of the present disclosure. The scope of the present disclosure is limited by the attached claims and its equivalents.

What is claimed is:

1. A bracket, comprising a body, and the body comprising:
a first face provided with a plurality of through holes; and
a second face facing away from the first face and provided with a plurality of accommodating chambers corresponding to the plurality of through holes, wherein the plurality of accommodating chambers is configured to accommodate an input/output module and expose the input/output module from the second face, and the plurality of through holes is configured to expose the input/output module from the first face,
wherein the plurality of accommodating chambers comprises a first chamber, a second chamber, a third chamber, and a fourth chamber, and
wherein the through hole comprises a first through hole, a second through hole, a third through hole, and a fourth through hole, the first through hole is communicated with the first chamber, the second through hole is communicated with the second chamber, the third through hole is communicated with the third chamber, and the fourth through hole is communicated with the fourth chamber.

2. The bracket according to claim 1, wherein the first chamber, the second chamber and the third chamber are arranged in sequence, and
wherein the fourth chamber is arranged between the first chamber and the second chamber; or the fourth chamber is arranged between the second chamber and the third chamber.

3. The bracket according to claim 2, wherein the body comprises a side wall, the side wall connects the first face to the second face, the side wall comprises a top side wall and a bottom side wall facing away from each other, centers of the first through hole, the second through hole and the third through hole are arranged on a same straight line, and the fourth through hole is arranged between the straight line and the bottom side wall.

4. The bracket according to claim 2, wherein the body comprises a side wall, the side wall connects the first face to the second face, the side wall comprises a top side wall and a bottom side wall facing away from each other, the top side wall has a notch, the first face has a recess at a position corresponding to the fourth chamber, and the recess is communicated with the notch.

5. The bracket according to claim 1, wherein, the first chamber, the second chamber, the third chamber and the fourth chamber are arranged in one of following manners:
the first chamber, the second chamber, the third chamber and the fourth chamber are being arranged in sequence; or
the fourth chamber, the first chamber, the second chamber and the third chamber are being arranged in sequence.

6. The bracket according to claim 5, wherein the first chamber and the second chamber are arranged in one of following manners:
the second chamber being spaced apart from the first chamber; or
the second chamber being communicated with the first chamber.

7. The bracket according to claim 5, wherein the body comprises a side wall, the side wall connects the first face to the second face, the side wall comprises a top side wall and a bottom side wall facing away from each other, centers of the first through hole, the third through hole and the fourth through hole are arranged on a same straight line, and the second through hole is arranged between the straight line and the bottom side wall.

8. The bracket according to claim 5, wherein the body comprises a side wall, the side wall connects the first face to the second face, the side wall comprises a top side wall and a bottom side wall facing away from each other, the top side wall has a notch, the first face has a recess at a position corresponding to the second chamber, and the recess is communicated with the notch.

9. The bracket according to claim 1, wherein the body comprises a side wall, the side wall connects the first face to the second face, the side wall comprises a top side wall and a bottom side wall facing away from each other, the first chamber, the second chamber, the third chamber and the fourth chamber are arranged in sequence, centers of the first chamber, the second chamber and the fourth chamber are arranged on a same straight line, and a center of the third chamber is arranged between the straight line and the bottom side wall.

10. An input/output assembly, comprising:
a bracket comprising:
a first face provided with a plurality of through holes; and
a second face facing away from the first face, and provided with a plurality of accommodating chambers corresponding to the plurality of through holes;
an input/output module mounted in the plurality of accommodating chambers, exposed from the second face through the plurality of accommodating chambers, and further exposed from the first face through the plurality of through holes;
a flexible circuit board mounted to the bracket; and
a receiver, an infrared fill light, a proximity sensor, and a light sensor mounted to the flexible circuit board,
wherein the flexible circuit board comprises a first segment, a second segment and a connecting segment, the connecting segment connects the first segment to the second segment, the first segment is arranged parallel to the second segment, the infrared fill light, the proximity sensor and the light sensor are connected to the first segment, and the receiver is connected to the second segment.

11. The input/output assembly according to claim 10, wherein the receiver is accommodated in the plurality of accommodating chambers, the receiver comprises an elastic connection piece protruding along a direction from the first face to the second face, and the elastic connection piece abuts against the flexible circuit board to electrically connect the receiver to the flexible circuit board.

12. The input/output assembly according to claim 11, wherein the first segment is pressed to the first face, the second segment pressed to the second face, and the elastic connection piece abuts against the second segment.

13. The input/output assembly according to claim 12, wherein the second segment comprises a joining part and a connecting part connected to the joining part, the joining part is joined to the second face, and the connecting part is spaced apart from the second face and configured to be electrically connected to an external device.

14. The input/output assembly according to claim 12, wherein the first segment comprises a joining part and a connecting part connected to the joining part, the joining part is joined to the first face, the connecting part is spaced apart from the first face and configured to be electrically connected to an external device, and the joining part has a sound outgoing hole corresponding to a sound outlet of the receiver.

15. A terminal, comprising:
a housing;
a mainboard fixed in the housing and having a mounting opening; and
an input/output assembly mounted in the mounting opening, the input/output assembly comprising:
an input/output module electrically connected to the mainboard; and
a bracket extending through the mounting opening, and comprising:
a first face provided with a through hole; and
a second face facing away from the first face, and provided with an accommodating chamber corresponding to the through hole, the input/output module being fixedly mounted in the accommodating chamber, the accommodating chamber being configured to expose the input/output module from the second face, and the through hole being configured to expose the input/output module from the first face,
wherein the accommodating chamber comprises a first chamber, a second chamber and a third chamber arranged in sequence,
wherein the through hole comprises a first through hole, a second through hole and a third through hole, and the first through hole, the second through hole and the third through hole are communicated with the first chamber, the second chamber and the third chamber, respectively, and
wherein centers of the first through hole, the second through hole and the third through hole are arranged on a same straight line.

16. The terminal according to claim 15, wherein the second face comprises:
a first spacing chamber spacing the first chamber apart from the second chamber; and
a second spacing chamber spacing the second chamber apart from the third chamber.

17. The terminal according to claim 15, wherein the bracket comprises a side wall, the side wall connects the first face to the second face and comprises a top side wall and a bottom side wall facing away from each other, and the top side wall has a notch in a position corresponding to the third chamber.

* * * * *